US012658873B2

(12) United States Patent
Nakazawa et al.

(10) Patent No.: US 12,658,873 B2
(45) Date of Patent: Jun. 16, 2026

(54) ELECTRONIC COMPONENT

(71) Applicant: TDK Corporation, Tokyo (JP)

(72) Inventors: Michiyuki Nakazawa, Tokyo (JP); Takeshi Oohashi, Tokyo (JP); Daiki Kusunoki, Tokyo (JP); Yukio Mitake, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/721,502

(22) PCT Filed: May 18, 2023

(86) PCT No.: PCT/JP2023/018643
§ 371 (c)(1),
(2) Date: Jun. 18, 2024

(87) PCT Pub. No.: WO2024/018744
PCT Pub. Date: Jan. 25, 2024

(65) Prior Publication Data
US 2025/0141420 A1    May 1, 2025

(30) Foreign Application Priority Data
Jul. 21, 2022    (JP) ................................. 2022-116233

(51) Int. Cl.
*H03H 7/01* (2006.01)
*H03H 7/09* (2006.01)
*H03H 1/00* (2006.01)

(52) U.S. Cl.
CPC ........... *H03H 7/0115* (2013.01); *H03H 7/09* (2013.01); *H03H 7/1791* (2013.01); *H03H 2001/0085* (2013.01)

(58) Field of Classification Search
CPC ............. H03H 2001/0085; H03H 7/09; H03H 7/0115; H03H 7/1791
USPC ......................................... 333/175, 177, 185
See application file for complete search history.

(56) References Cited

U.S. PATENT DOCUMENTS

2020/0119709 A1    4/2020    Shiokawa
2023/0170870 A1    6/2023    Nobe

FOREIGN PATENT DOCUMENTS

JP       H08-034339 A    2/1996
WO    2019/003722 A1    1/2019
WO    2022/065201 A1    3/2022

OTHER PUBLICATIONS

Aug. 8, 2023 Search Report issued in International Patent Application No. PCT/JP2023/018643.
Dec. 18, 2024 International Preliminary Report on Patentability issued in International Patent Application No. PCT/JP2023/018643.

*Primary Examiner* — Rakesh B Patel
(74) *Attorney, Agent, or Firm* — Oliff PLC

(57) ABSTRACT

An electronic component includes a first resonance circuit configured to include a first inductor and a first capacitor; and a second resonance circuit configured to include a second inductor and a second capacitor that are magnetically coupled to the first inductor, in which the first resonance circuit includes a third inductor electrically connected in series with the first inductor, and the third inductor is disposed to be magnetically coupled to the second inductor.

14 Claims, 48 Drawing Sheets

ELECTRONIC COMPONENT

TECHNICAL FIELD

The present disclosure relates to an electronic component.

This application claims priority based on Japanese Patent Application No. 2022-116233 filed on Jul. 21, 2022, the entire contents of which are incorporated herein by reference.

BACKGROUND ART

As an electronic component, there is known an electronic component including a first resonator configured to include a first inductor and a first capacitor, and a second resonator configured to include a second inductor and a second capacitor, in which the first inductor and the second inductor are magnetically coupled (see, for example, Patent Literature 1).

CITATION LIST

Patent Literature

Patent Literature 1: Japanese Unexamined Patent Publication No. H8-34339

SUMMARY OF INVENTION

Technical Problem

In the present disclosure, an electronic component capable of improving frequency characteristics will be described.

Solution to Problem

An electronic component according to an aspect of the present disclosure includes a first resonance circuit configured to include a first inductor and a first capacitor; and a second resonance circuit configured to include a second inductor and a second capacitor that are magnetically coupled to the first inductor, in which the first resonance circuit includes a third inductor electrically connected in series with the first inductor, and the third inductor is disposed to be magnetically coupled to the second inductor.

Advantageous Effects of Invention

According to each aspect and each embodiment of the present disclosure, an electronic component with improved frequency characteristics is provided.

DESCRIPTION OF EMBODIMENTS

Figure 1:
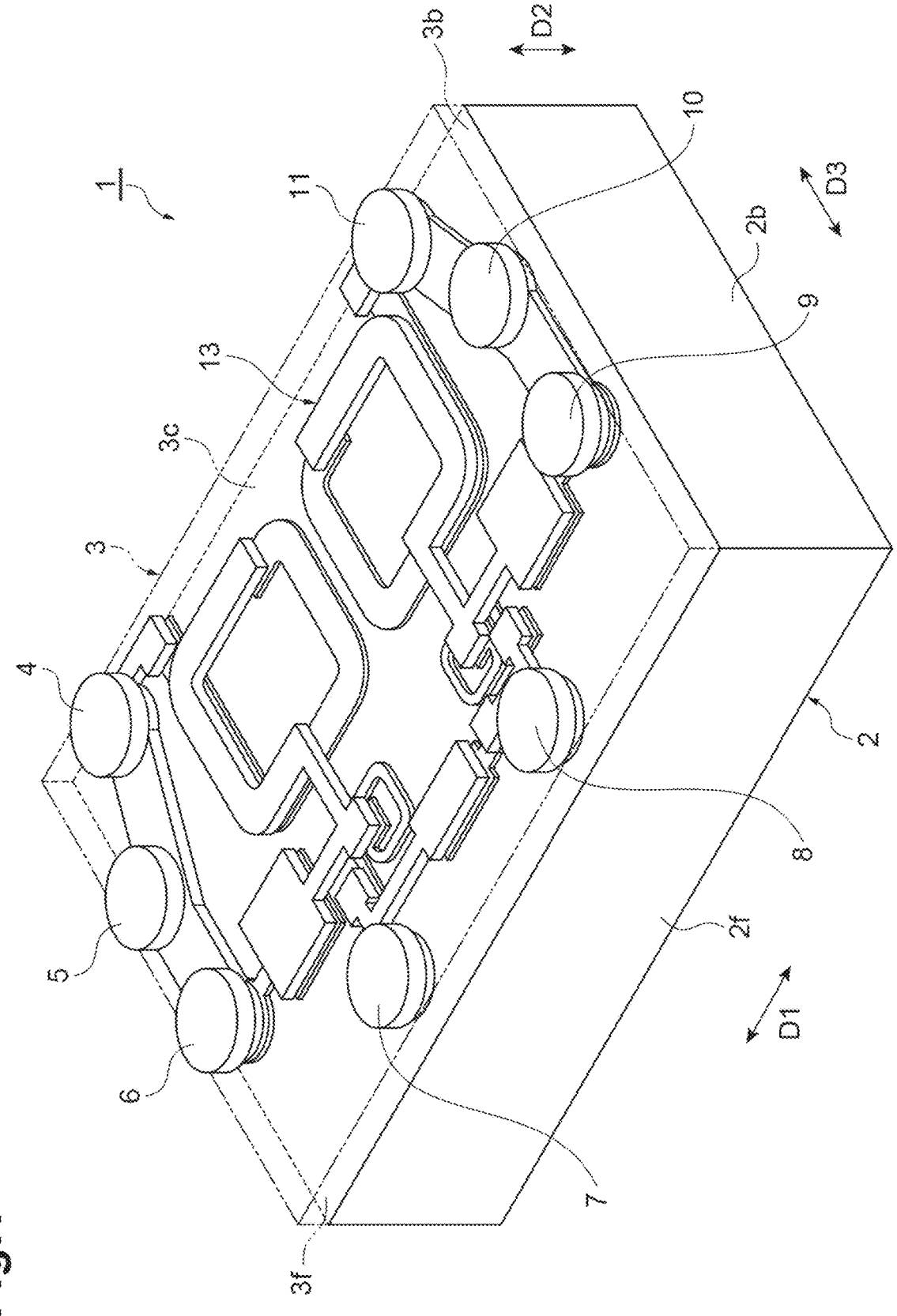
FIG. 1 is a perspective view of an electronic component according to a first embodiment.

[1] Summary of Embodiment (1) An electronic component according to an aspect of the present disclosure includes a first resonance circuit configured to include a first inductor and a first capacitor; and a second resonance circuit configured to include a second inductor and a second capacitor that are magnetically coupled to the first inductor, in which the first resonance circuit includes a third inductor electrically connected in series with the first inductor, and the third inductor is disposed to be magnetically coupled to the second inductor.

In an electronic component according to an aspect of the present disclosure, the first resonance circuit includes a third inductor electrically connected in series with the first inductor. The third inductor is disposed to be magnetically coupled to the second inductor. As described above, in the electronic component, the third inductor is disposed so that the third inductor and the second inductor of the first resonance circuit are magnetically coupled to each other, thereby frequency characteristics can be adjusted. Specifically, such an electronic component can increase an attenuation amount (improve the attenuation amount) in a high frequency band, for example. Therefore, such an electronic component can improve the frequency characteristics.

(2) The electronic component according to (1), in which the second resonance circuit includes a fourth inductor electrically connected in series with the second inductor, and the fourth inductor is disposed to be magnetically coupled to the first inductor and the third inductor. In this configuration, the fourth inductor of the second resonance circuit is magnetically coupled to the first inductor and the third inductor, thereby frequency characteristics can be further adjusted. Specifically, such an electronic component can increase the attenuation amount in the high frequency band, for example. Therefore, such an electronic component can further improve the frequency characteristics.

(3) The electronic component according to (1) or (2), in which a first inductor pattern constituting the first inductor and a second inductor pattern constituting the second inductor are arranged side by side, and a distance between the first inductor pattern and the second inductor pattern is shorter than a radius of each of the first inductor pattern and the second inductor pattern. In this configuration, the magnetic coupling between the first inductor and the second inductor can be strengthened.

(4) The electronic component according to (1), in which a first inductor pattern constituting the first inductor and a second inductor pattern constituting the second inductor are arranged side by side, a third inductor pattern constituting the third inductor and a fourth inductor pattern constituting the fourth inductor are arranged side by side, and a distance between the first inductor pattern and the second inductor pattern is shorter than a distance between the first inductor pattern and the third inductor pattern and a distance between the second inductor pattern and the fourth inductor pattern. In this configuration, the degree of coupling can be adjusted while increasing the magnetic coupling between the first inductor and the second inductor.

(5) The electronic component according to (4), in which a distance between the third inductor pattern and the fourth inductor pattern is shorter than a radius of each of the third inductor pattern and the fourth inductor pattern. In this configuration, the magnetic coupling between the third inductor and the fourth inductor can be strengthened.

(6) The electronic component according to (1), in which a first inductor pattern constituting the first inductor and a second inductor pattern constituting the second inductor are arranged side by side, and a distance between the first inductor pattern and the second inductor pattern is shorter than a radius of a third inductor pattern constituting the third inductor. In this configuration, the magnetic coupling between the first inductor and the second inductor can be strengthened.

(7) The electronic component according to (6), in which the second resonance circuit includes a fourth inductor electrically connected in series with the second inductor, the fourth inductor is disposed to be magnetically coupled to the first inductor and the third inductor, the third inductor pattern and a fourth inductor pattern constituting the four inductors are arranged side by side, and a distance between the first inductor pattern and the second inductor pattern is equal to a distance between the third inductor pattern and the fourth inductor pattern. In this configuration, the magnetic coupling between the first inductor and the second inductor, and between the third inductor and the fourth inductor can be strengthened.

(8) The electronic component according to (6) or (7), in which a distance between the first inductor pattern and the second inductor pattern is equal to a distance between the first inductor pattern and the third inductor pattern. In this configuration, the magnetic coupling among the first inductor, the second inductor, the third inductor, and the fourth inductor can be strengthened.

(9) The electronic component according to (2), in which a radius of a third inductor pattern constituting the third inductor is different from a radius of a fourth inductor pattern constituting the fourth inductor. In this configuration, the degree of magnetic coupling can be adjusted by making the radius of the inductor pattern different.

(10) The electronic component according to (1), in which a first inductor pattern constituting the first inductor and a third inductor pattern constituting the third inductor are articulated and integrally formed. In this configuration, the first inductor pattern and the third inductor pattern are integrated. Therefore, in the electronic component, regions of the first inductor pattern and the third inductor pattern can be increased as compared with the case where the first inductor pattern and the third inductor pattern are provided separately. Therefore, in such an electronic component, a Q factor of the inductor can be improved. If the Q factor of the inductor is improved, the Q factor of the resonator including the inductor is also improved, so that the frequency characteristics of the resonance circuit can be improved.

(11) The electronic component according to (10), in which a first capacitor pattern constituting the first capacitor is connected to a portion where the first inductor pattern and the third inductor pattern are articulated. In this configuration, the frequency characteristics can be adjusted by adjusting the connection position of the first capacitor. Specifically, such an electronic component can adjust the attenuation amount in the high frequency band, for example. Therefore, such an electronic component can improve the frequency characteristics.

(12) The electronic component according to (11), in which the second resonance circuit includes a fourth inductor electrically connected in series with the second inductor, and the fourth inductor is disposed to be magnetically coupled to the first inductor and the third inductor. In this configuration, the fourth inductor of the second resonance circuit is magnetically coupled to the first inductor and the third inductor, thereby frequency characteristics can be further adjusted. Specifically, such an electronic component can increase the attenuation amount in the high frequency band, for example. Therefore, such an electronic component can further improve the frequency characteristics.

(13) The electronic component according to (12), in which a second inductor pattern constituting the second inductor and a fourth inductor pattern constituting the fourth inductor are articulated and integrally formed. In this configuration, the second inductor pattern and the fourth inductor pattern are integrated. Therefore, in the electronic component, regions of the second inductor pattern and the fourth inductor pattern can be increased as compared with the case where the second inductor pattern and the fourth inductor pattern are provided separately. Therefore, in the electronic component, the Q factor of the inductor can be improved. If the Q factor of the inductor is improved, the Q factor of the resonator including the inductor is also improved, so that frequency characteristics of the resonance circuit can be improved.

(14) The electronic component according to (13), in which a second capacitor pattern constituting the second capacitor is connected to a portion where the second inductor pattern and the fourth inductor pattern are articulated. In this configuration, the frequency characteristics can be adjusted by adjusting the connection position of the second capacitor. Specifically, such an electronic component can adjust the attenuation amount in the high frequency band, for example. Therefore, such an electronic component can improve the frequency characteristics.

[2] Exemplification of Embodiment

Hereinafter, an embodiment of the present disclosure will be described in detail with reference to the drawings. Note that in the description of the drawings, the same elements are denoted by the same reference signs, and redundant description is omitted.

First Embodiment

Figure 2:
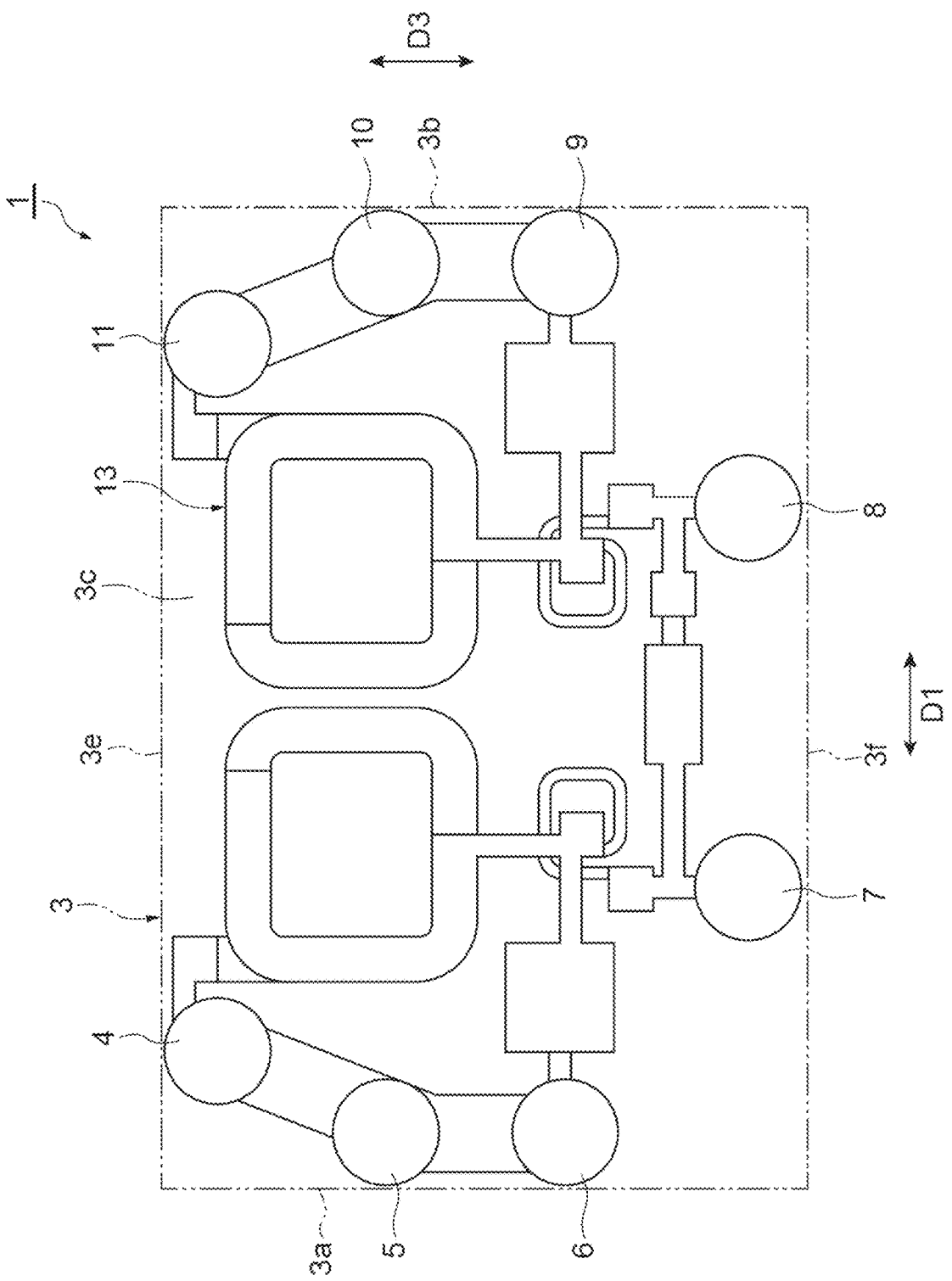
FIG. 2 is a view of the electronic component illustrated in FIG. 1 as viewed from an insulator side.
Figure 3:
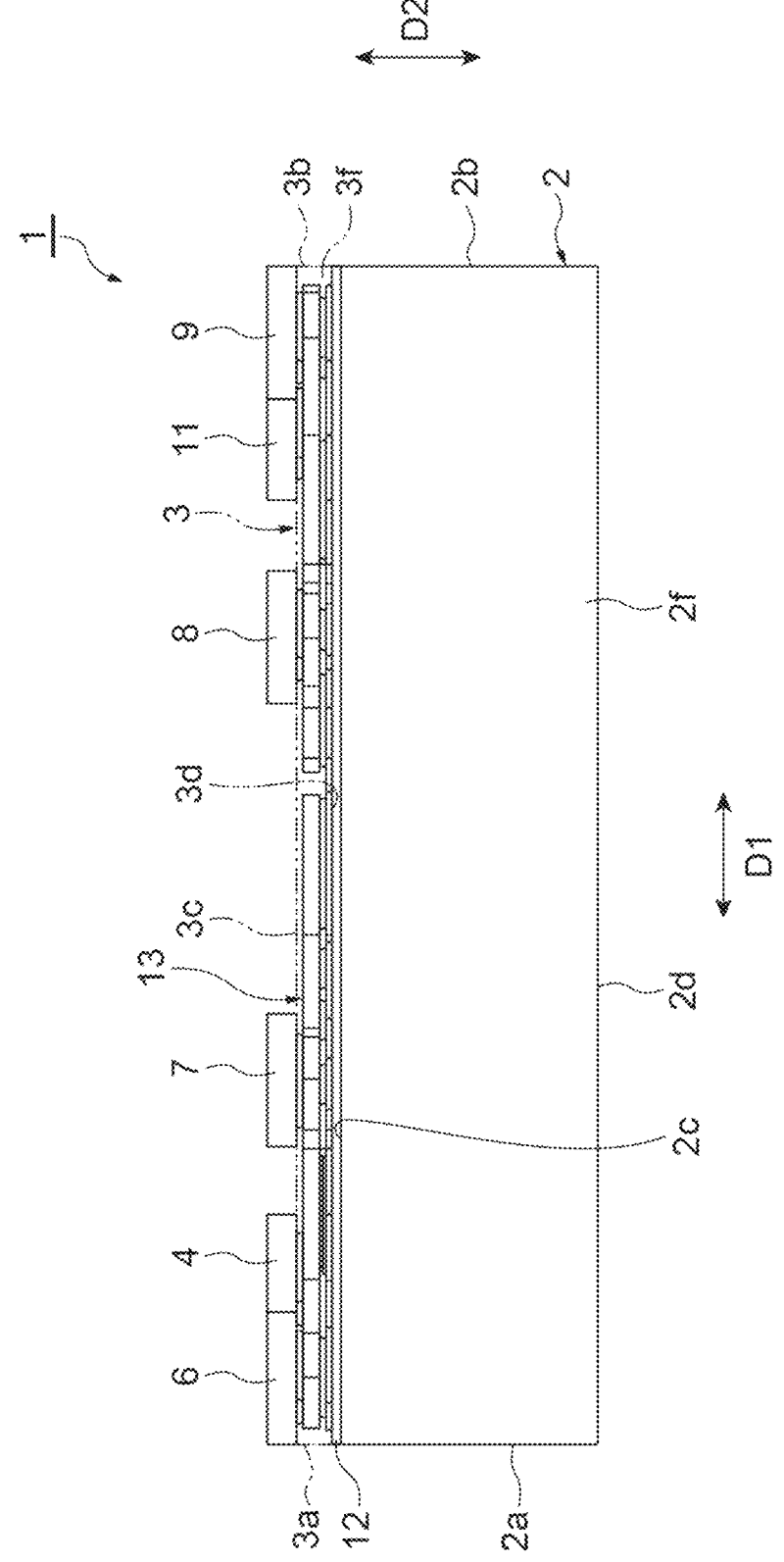
FIG. 3 is a side view of the electronic component illustrated in FIG. 1.
Figure 4:
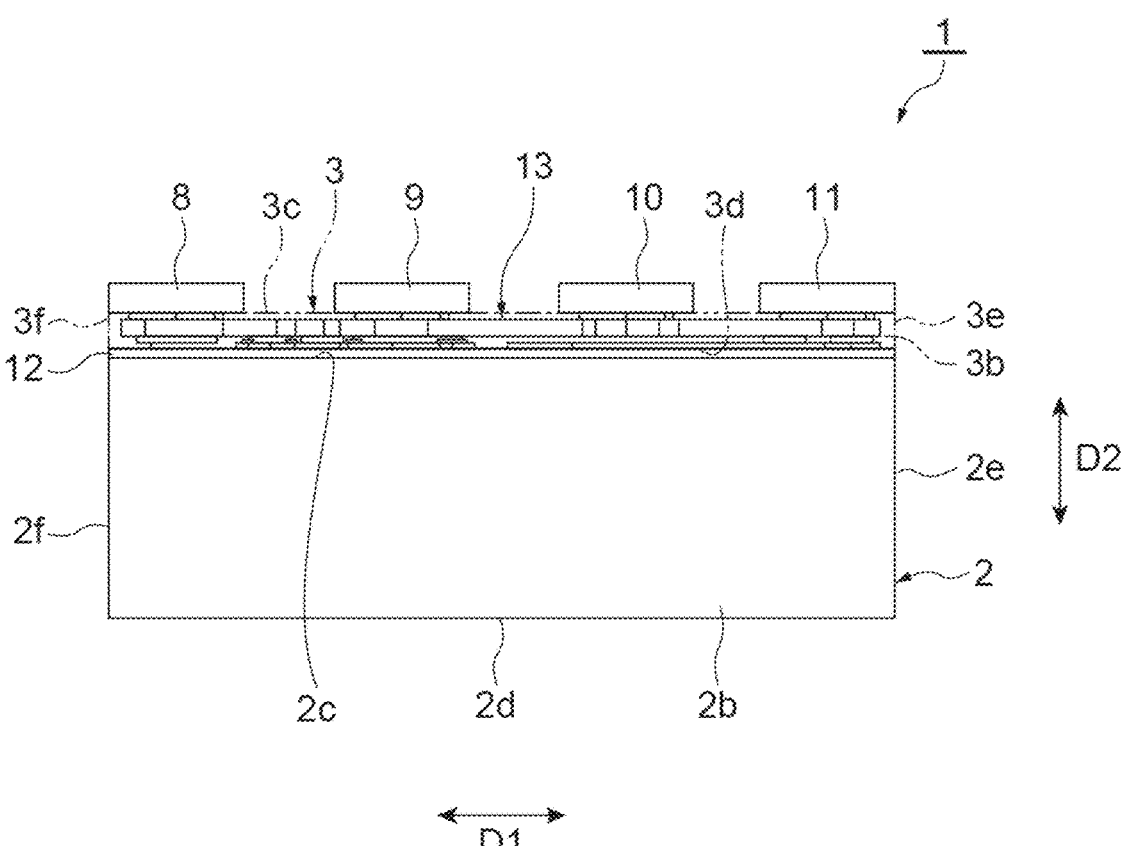
FIG. 4 is an end view of the electronic component illustrated in FIG. 1.

FIG. 1 is a perspective view of an electronic component according to a first embodiment. FIG. 2 is a view of the electronic component illustrated in FIG. 1 as viewed from an insulator side. FIG. 3 is a side view of the electronic component illustrated in FIG. 1. FIG. 4 is an end view of the electronic component illustrated in FIG. 1.

An electronic component 1 illustrated in FIG. 1 is an LC filter. The electronic component 1 is a so-called thin film LC filter. The LC filter may be a band-pass filter. As illustrated in FIGS. 1 and 2, an electronic component 1 includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

The substrate 2 has, for example, a rectangular parallelepiped shape. The rectangular parallelepiped shape may include a rectangular parallelepiped shape in which corner portions and ridge line portions are chamfered, or a rectangular parallelepiped shape in which corner portions and ridge line portions are rounded. As illustrated in FIGS. 1, 3, and 4, the substrate 2 has, as outer surfaces thereof, a pair of end surfaces 2a and 2b facing each other, a pair of main surfaces 2c and 2d facing each other, and a pair of side surfaces 2e and 2f facing each other.

A facing direction in which the pair of end surfaces 2a and 2b faces each other is a first direction D1. A facing direction in which the pair of main surfaces 2c and 2d faces each other is a second direction D2. A facing direction in which the pair of side surfaces 2e and 2f faces each other is a third direction D3. In the present embodiment, the first direction D1 is a longitudinal direction of the substrate 2. The second direction D2 is a longitudinal direction of the substrate 2, and is orthogonal to the first direction D1. The third direction D3 is a width direction of the substrate 2, and is orthogonal to the first direction D1 and the second direction D2. Viewing from the second direction D2 corresponds to a plan view.

The pair of end surfaces 2a and 2b extends in the second direction D2 to connect the pair of main surfaces 2c and 2d. The pair of end surfaces 2a and 2b also extends in the third direction D3. The pair of side surfaces 2e and 2f extends in the second direction D2 to connect the pair of main surfaces 2c and 2d. The pair of side surfaces 2e and 2f also extends in the first direction D1.

The substrate 2 can be formed of a material that is chemically and thermally stable, generates less stress, and can maintain surface smoothness. The material is not particularly limited, but silicon single crystal, alumina, sapphire, aluminum nitride, MgO single crystal, $SrTiO_3$ single crystal, surface silicon oxide, glass, quartz, ferrite, and the like can be used.

The insulator 3 has, for example, a rectangular parallelepiped shape. As illustrated in FIGS. 1 to 4, the insulator 3 has, as outer surfaces thereof, a pair of end surfaces 3a and 3b facing each other, a pair of main surfaces 3c and 3d facing each other, and a pair of side surfaces 3e and 3f facing each other. The pair of end surfaces 3a and 3b faces each other in the first direction D1. The pair of main surfaces 3c and 3d faces each other in the second direction D2. The pair of side surfaces 3e and 3f faces each other in the third direction D3.

The pair of end surfaces 3a and 3b extends in the second direction D2 to connect the pair of main surfaces 3c and 3d. The pair of end surfaces 3a and 3b also extends in the third direction D3. The pair of side surfaces 3e and 3f extends in the second direction D2 to connect the pair of main surfaces 3c and 3d. The pair of side surfaces 3e and 3f also extends in the first direction D1. The dimension of the insulator 3 in the first direction D1 is equal to the dimension of the substrate 2 in the first direction D1. The dimension of the insulator 3 in the third direction D3 is equal to the dimension of the substrate 2 in the third direction D3.

It should be noted that "equal" in the present embodiment may mean not only "equal" but also a value including a slight difference, a manufacturing error, or the like in a preset range. For example, when a plurality of values is included within a range of ±5% of an average value of the plurality of values, the plurality of values is defined to be equal.

The insulator 3 is formed by stacking a plurality of insulator layers. The insulator layers may be made of an organic insulating material such as polyimide. The insulator layers are stacked in the second direction D2. That is, the second direction D2 is a stacking direction. In the actual insulator 3, the plurality of insulator layers is integrated to such an extent that boundaries between the layers cannot be visually recognized.

The substrate 2 and the insulator 3 are integrally provided. The substrate 2 and the insulator 3 are disposed such that the main surface 2c and the main surface 3d face each other. A planarization layer 12 is disposed between the substrate 2 and the insulator 3. The planarization layer 12 is disposed between the main surface 2c of the substrate 2 and the main surface 3d of the insulator 3. As the planarization layer 12, alumina, silicon oxide, or the like can be used.

As illustrated in FIGS. 1 and 2, the first terminal electrode 4, the second terminal electrode 5, the third terminal electrode 6, and the fourth terminal electrode 7, and the fifth terminal electrode 8, the sixth terminal electrode 9, the seventh terminal electrode 10, and the eighth terminal electrode 11 are disposed on the main surface 3c of the insulator 3. The first terminal electrode 4, the second terminal electrode 5, the third terminal electrode 6, the sixth terminal electrode 9, the seventh terminal electrode 10, and the eighth terminal electrode 11 may be ground terminals. The fourth terminal electrode 7 may be an input terminal of a signal. The fifth terminal electrode 8 may be an output terminal of a signal.

The first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11 have a circular shape in plan view. The circular shape may include a perfect circular shape and an elliptical shape.

The first terminal electrode 4, the second terminal electrode 5, and the third terminal electrode 6 are disposed at positions close to the end surface 3a. The fourth terminal electrode 7 and the fifth terminal electrode 8 are disposed at positions close to the side surface 3f. The sixth terminal electrode 9, the seventh terminal electrode 10, and the eighth terminal electrode 11 are disposed at positions close to the end surface 3b. The fourth terminal electrode 7 and the fifth terminal electrode 8 are disposed at predetermined intervals in the first direction D1. The positions of the first terminal electrode 4, the second terminal electrode 5, the third terminal electrode 6, and the fourth terminal electrode 7, and the fifth terminal electrode 8, the sixth terminal electrode 9, the seventh terminal electrode 10, and the eighth terminal electrode 11 may be appropriately set in accordance with the arrangement of a conductor pattern described later.

The first terminal electrode 4, the second terminal electrode 5, the third terminal electrode 6, and the fourth terminal electrode 7, and the fifth terminal electrode 8, the sixth terminal electrode 9, the seventh terminal electrode 10, and the eighth terminal electrode 11 may be formed of, for example, gold, nickel, copper, silver, or the like.

Figure 5:
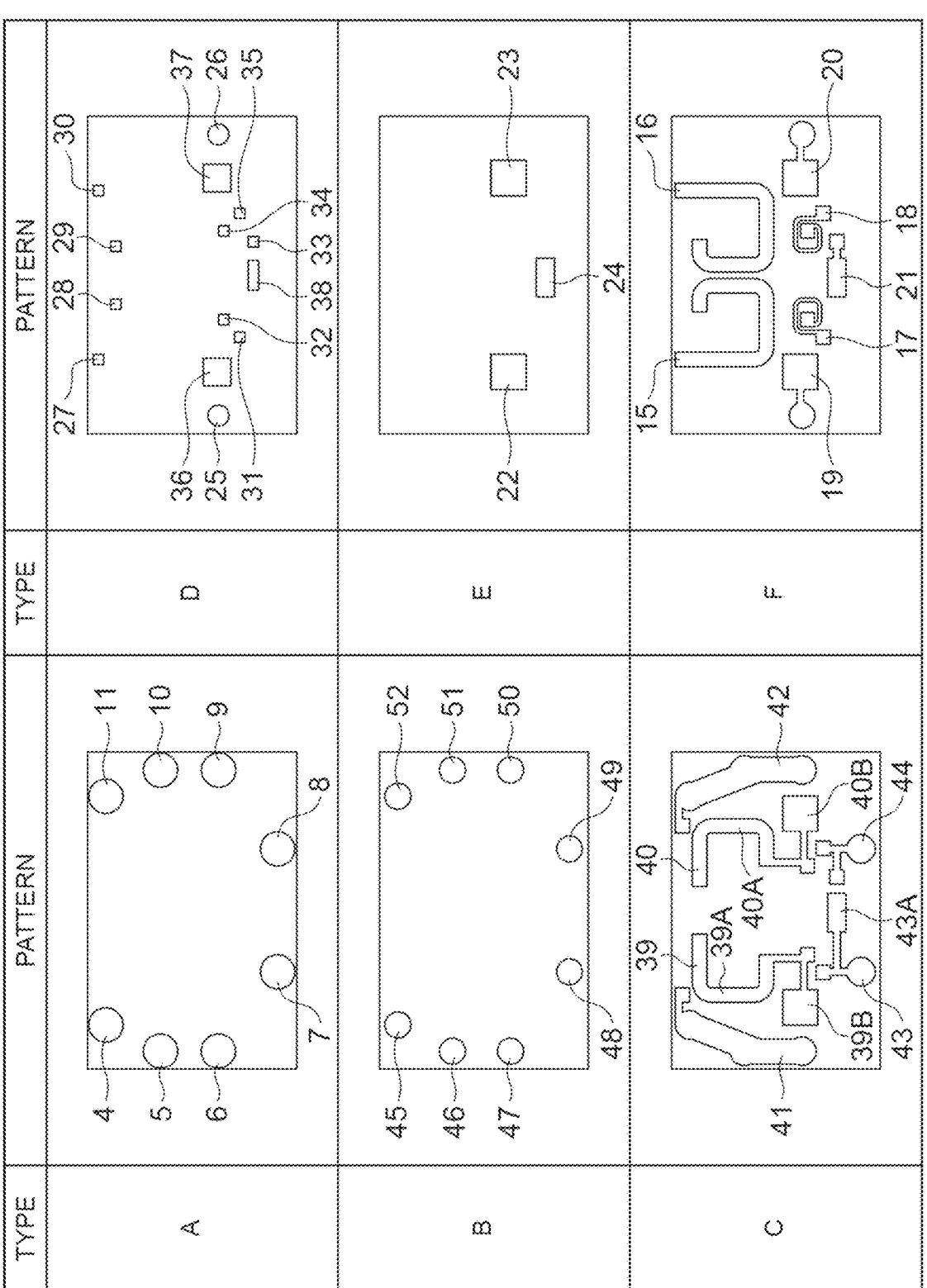
FIG. 5 is a view illustrating a conductor pattern constituting an LC filter unit included in the electronic component illustrated in FIG. 1.

In the electronic component 1, an LC filter unit 13 is disposed in the insulator 3. FIG. 5 is a view illustrating a conductor pattern (connection conductor) constituting the LC filter unit 13 included in the electronic component 1 illustrated in FIG. 1. In the electronic component 1, the conductor patterns are disposed in the order shown in a layer F, a layer E, a layer D, a layer C, a layer B, and a layer A in FIG. 5 from the substrate 2 side (the side of the main surface 3d of the insulator 3). The conductor pattern may include an inductor pattern, a capacitor pattern, and a via pattern. The conductor pattern can be formed of, for example, copper.

As illustrated in the layer F of FIG. 5, the LC filter unit 13 includes an inductor pattern (first inductor pattern) 15, an inductor pattern (second inductor pattern) 16, an inductor pattern (third inductor pattern) 17, an inductor pattern (fourth inductor pattern) 18, a capacitor pattern 19, and a capacitor pattern 20. The inductor pattern 15, the inductor pattern 16, the inductor pattern 17, the inductor pattern 18, the capacitor pattern 19, and the capacitor pattern 20 are disposed on the planarization layer 12 (FIGS. 3 and 4).

As illustrated in the layer E in FIG. 5, the LC filter unit 13 includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 5, the LC filter unit 13 includes a via pattern 25, a via pattern 26, a via pattern 27, a via pattern 28, a via pattern 29, a via pattern 30, a via pattern 31, a via pattern 32, a via pattern 33, a via pattern 34, a via pattern 35, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 31, the via pattern 32, the via pattern 33, the via pattern 34, the via pattern 35, the via pattern 36, the via pattern 37, and the via pattern 38 has, for example, a rectangular shape.

As illustrated in the layer C of FIG. 5, the LC filter unit 13 includes a conductor pattern 39, a conductor pattern 40, a conductor pattern 41, a conductor pattern 42, a conductor pattern 43, and a conductor pattern 44.

The conductor pattern 39 includes an inductor pattern 39A and a capacitor pattern 39B. The conductor pattern 40 includes an inductor pattern 40A and a capacitor pattern 40B. The conductor pattern 43 includes a capacitor pattern 43A.

As illustrated in the layer B of FIG. 5, the LC filter unit 13 includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 5, the electronic component 1 includes the first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11.

As illustrated in the layer D of FIG. 5, the via pattern 25 connects the capacitor pattern 19 and the conductor pattern 41. The via pattern 26 connects the capacitor pattern 20 and the conductor pattern 42. The via pattern 27 connects the inductor pattern 15 and the conductor pattern 41. The via pattern 28 connects the inductor pattern 15 and the inductor pattern 39A. The via pattern 29 connects the inductor pattern 16 and the inductor pattern 40A. The via pattern 30 connects the inductor pattern 16 and the conductor pattern 42.

The via pattern 31 connects the inductor pattern 17 and the conductor pattern 43. The via pattern 32 connects the inductor pattern 17 and the conductor pattern 39. The via pattern 33 connects the capacitor pattern 21 and the conductor pattern 44. The via pattern 34 connects the inductor pattern 18 and the conductor pattern 40. The via pattern 35 connects the inductor pattern 18 and the conductor pattern 44.

The via pattern 36 connects the capacitor pattern 22 and the capacitor pattern 39B. The via pattern 37 connects the capacitor pattern 23 and the capacitor pattern 40B. The via pattern 38 connects the capacitor pattern 24 and the capacitor pattern 43A.

As illustrated in the layer B of FIG. 5, the via pattern 45 connects the conductor pattern 41 and the first terminal electrode 4. The via pattern 46 connects the conductor pattern 41 and the second terminal electrode 5. The via pattern 47 connects the conductor pattern 41 and the third terminal electrode 6. The via pattern 48 connects the conductor pattern 43 and the fourth terminal electrode 7. The via pattern 49 connects the conductor pattern 44 and the fifth terminal electrode 8. The via pattern 50 connects the conductor pattern 42 and the sixth terminal electrode 9. The via pattern 51 connects the conductor pattern 42 and the seventh terminal electrode 10. The via pattern 52 connects the conductor pattern 42 and the eighth terminal electrode 11.

A dielectric layer (not illustrated) is disposed between the capacitor pattern 19 and the capacitor pattern 22. A dielectric layer (not illustrated) is disposed between the capacitor pattern 20 and the capacitor pattern 23. A dielectric layer (not illustrated) is disposed between the capacitor pattern 21 and the capacitor pattern 24. The dielectric layer may be formed of, for example, an inorganic insulating material made of a paraelectric material such as silicon nitride or silicon oxide, a ferroelectric material, or the like.

Figure 6:
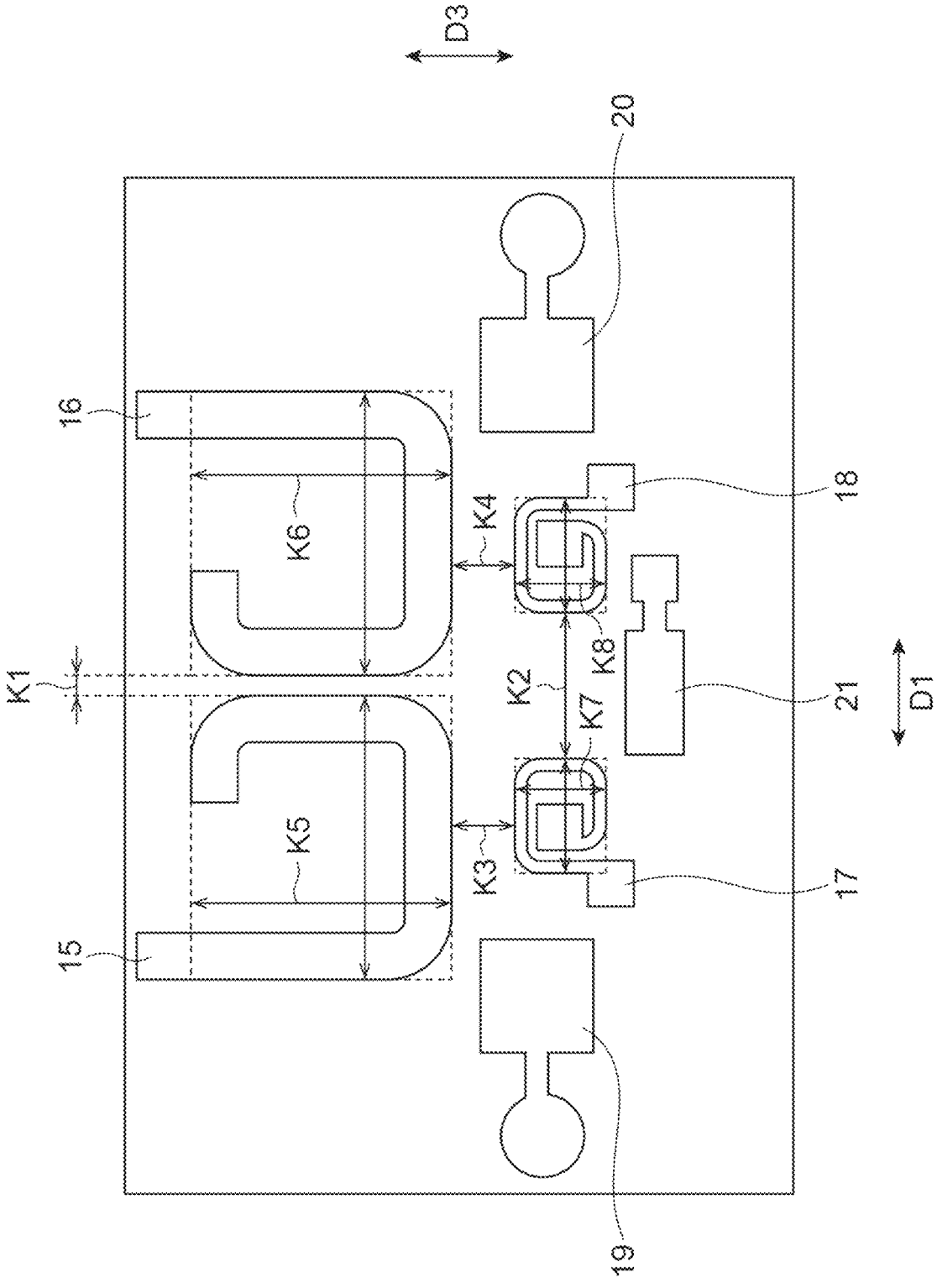
FIG. 6 is a views illustrating a conductor pattern.

As illustrated in FIG. 6, the inductor pattern 15 and the inductor pattern 16 are arranged side by side in the first direction D1 in plan view. Being arranged side by side means that the inductor pattern 15 and the inductor pattern 16 only need to have a portion where at least a part of the inductor pattern 15 and the inductor pattern 16 overlap when viewed from the first direction D1. In the present embodiment, the shapes of the inductor pattern 15 and the inductor pattern 16 have line symmetry with a line along the third direction D3 as an axis.

The inductor pattern 17 and the inductor pattern 18 are arranged side by side in the first direction D1 in plan view. In the present embodiment, the shapes of the inductor pattern 17 and the inductor pattern 18 have line symmetry with a line along the third direction D3 as an axis. The inductor pattern 15 and the inductor pattern 17 are arranged side by side in the third direction D3 in plan view. The inductor pattern 16 and the inductor pattern 18 are arranged side by side in the third direction D3 in plan view.

In the present embodiment, a distance K1 between the inductor pattern 15 and the inductor pattern 16 in the first direction D1 is shorter than a distance K2 between the inductor pattern 17 and the inductor pattern 18 in the first direction D1 (distance K1<distance K2). That is, an interval between the inductor pattern 15 and the inductor pattern 16 in the first direction D1 is shorter than an interval between the inductor pattern 17 and the inductor pattern 18 in the first direction D1. As the distance K1, for example, the shortest distance (minimum distance) between the inductor pattern 15 and the inductor pattern 16 can be used. As the distance K2, for example, the shortest distance between the inductor pattern 17 and the inductor pattern 18 can be used.

A distance K3 between the inductor pattern 15 and the inductor pattern 17 in the third direction D3 is longer than the distance K1 (K3>K1). In other words, the distance K1 is shorter than the distance K3. As the distance K3, for example, the shortest distance between the inductor pattern 15 and the inductor pattern 17 can be used. A distance K4 between the inductor pattern 16 and the inductor pattern 18 in the third direction D3 is longer than the distance K1 (K4>K1). In other words, the distance K1 is shorter than the distance K4. As the distance K4, the shortest distance between the inductor pattern 16 and the inductor pattern 18 can be used. The distance K2 is longer than the distance K3 and the distance K4 (K2>K3, K4). In other words, the distance K3 and the distance K4 are shorter than the distance K2.

The distance K1 is shorter than the radii of the inductor pattern 15 and the inductor pattern 16. In the present embodiment, the radius of the inductor pattern 15 can be defined by a length (K5/2) that is half the length K5 of the short side of a rectangular virtual line (indicated by a broken line in FIG. 6) that includes (envelops) the region of the inductor pattern 15 (a portion forming a coil in the inductor pattern 15, as a specific example of the present embodiment). The length K5 of the short side can correspond to the size of the region of the inductor pattern 15 (a coil size, as a specific example of the present embodiment). Similarly, the radius of the inductor pattern 16 can be defined by a length (K6/2) that is half the length K6 of the short side of the rectangular virtual line including the region of the inductor pattern 16. The length K6 of the short side can correspond to the size of the region of the inductor pattern 16 (a coil size, as a specific example of the present embodiment). For example, the inductor pattern 15 and the inductor pattern 16 may be formed such that radii thereof are equal (or substantially equal) to each other.

The distance K2 is shorter than the radii of the inductor pattern 17 and the inductor pattern 18. In the present embodiment, the radius of the inductor pattern 17 can be defined by a length (K7/2) that is half the length K7 of the short side of the rectangular virtual line including the region of the inductor pattern 17. Similarly, the radius of the inductor pattern 18 can be defined by a length (K8/2) that is half the length K8 of the short side of the rectangular virtual line including the region of the inductor pattern 18. For example, the inductor pattern 17 and the inductor pattern 18 may be formed such that radii thereof are equal (or substantially equal) to each other.

The radius of the inductor pattern 15 may be equal to or larger than the radii of the inductor pattern 17 and the inductor pattern 18. The radius of the inductor pattern 16 may be equal to or larger than the radii of the inductor pattern 17 and the inductor pattern 18.

As described above, when the outer shape of the inductor pattern is substantially rectangular, the radius of the inductor pattern can be defined by half the length of the short side of a rectangular virtual line including the rectangular inductor pattern. The radius of the inductor pattern can be defined by a length that is half the length of the diameter of the circular inductor pattern when the outer shape of the inductor pattern is circular (perfect circular shape). When the outer shape of the inductor pattern is elliptical, the radius of the inductor pattern can be defined by half the length of the short side of a rectangular virtual line including the elliptical inductor pattern. When the outer shape of the inductor pattern is a deformed shape, the radius of the inductor pattern can be defined by half the length of the short side of a rectangular virtual line including the deformed inductor pattern.

The inductor pattern 15 and the inductor pattern 16 are disposed to be magnetically coupled. The inductor pattern 17 and the inductor pattern 18 are disposed to be magnetically coupled. The inductor pattern 17 is disposed to be magnetically coupled to the inductor pattern 16. The inductor pattern 18 is disposed to be magnetically coupled to the inductor pattern 15.

Figure 7:
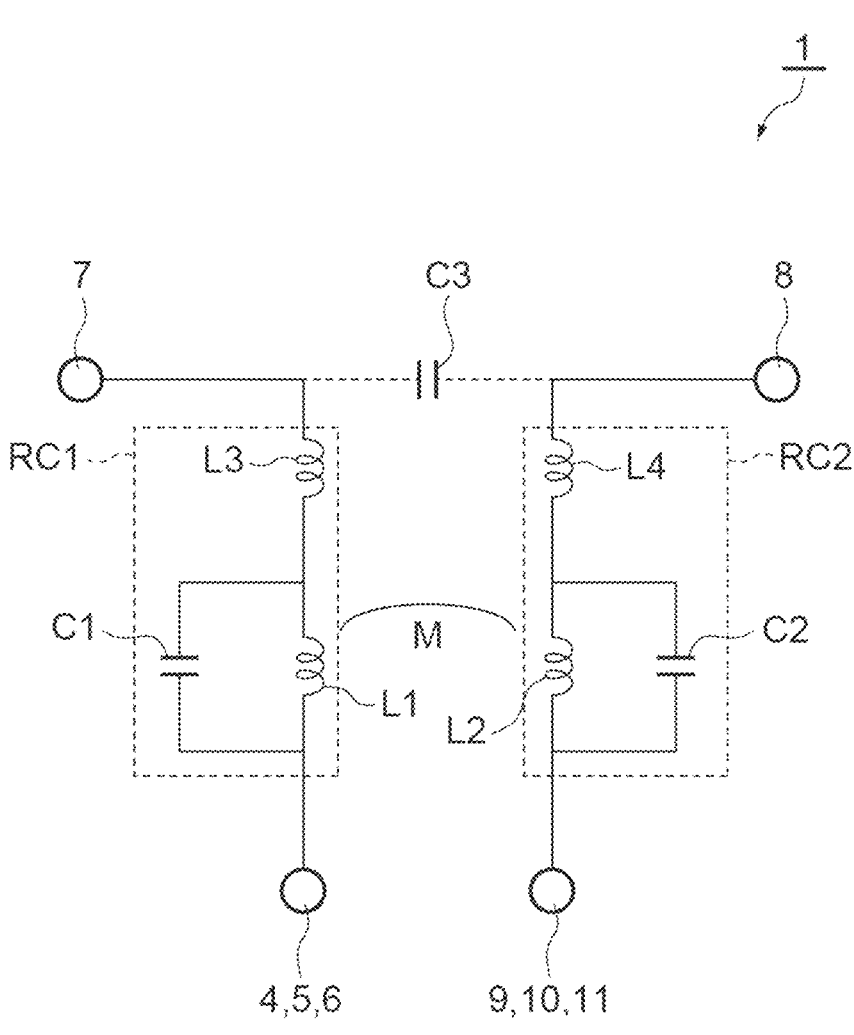
FIG. 7 is an equivalent circuit diagram of the electronic component illustrated in FIG. 1.

FIG. 7 is an equivalent circuit diagram of the electronic component 1 illustrated in FIG. 1. As illustrated in FIG. 7, the electronic component 1 includes a first inductor L1, a second inductor L2, a third inductor L3, a fourth inductor L4, a first capacitor C1, a second capacitor C2, and a third capacitor C3. The electronic component 1 constitutes a two-stage resonant band-pass filter circuit.

The first inductor L1 includes an inductor pattern 15 and an inductor pattern 39A. The second inductor L2 includes an inductor pattern 16 and an inductor pattern 40A. The third inductor L3 includes an inductor pattern 17. The fourth inductor L4 includes an inductor pattern 18.

The first capacitor C1 includes a capacitor pattern 19, a capacitor pattern 22, and a capacitor pattern 39B. The second capacitor C2 includes a capacitor pattern 20, a capacitor pattern 23, and a capacitor pattern 40B. The third capacitor C3 includes a capacitor pattern 21, a capacitor pattern 24, and a capacitor pattern 43A.

The first inductor L1, the third inductor L3, and the first capacitor C1 constitute a first LC resonator (first resonance circuit) RC1. The resonator can also be referred to as a resonance circuit. The first inductor L1 and the third inductor L3 are electrically connected in series. The second inductor L2, the fourth inductor L4, and the second capacitor C2 constitute a second LC resonator (second resonance circuit) RC2. The second inductor L2 and the fourth inductor L4 are electrically connected in series. The first inductor L1, the second inductor L2, and the fourth inductor L4 are magnetically coupled. The second inductor L2, the first inductor L1, and the third inductor L3 are magnetically coupled.

As described above, in the electronic component 1 according to the present embodiment, the first LC resonator RC1 includes the third inductor L3 electrically connected in series with the first inductor L1. The third inductor L3 is disposed to be magnetically coupled to the second inductor L2. As described above, in the electronic component 1, the third inductor L3 is disposed so that the third inductor L3 and the second inductor L2 of the first LC resonator RC1 are magnetically coupled to each other, thereby the attenuation amount in the high frequency band can be increased (improved). Therefore, in the electronic component 1, frequency characteristics can be improved. For example, superior characteristics in a high frequency band can be obtained.

In the electronic component 1 according to the present embodiment, the second LC resonator RC2 includes the fourth inductor L4 electrically connected in series with the second inductor L2. The fourth inductor L4 is disposed to be magnetically coupled to the first inductor L1 and the third inductor L3. In this configuration, the fourth inductor L4 of the second LC resonator RC2, the first inductor L1, and the third inductor L3 are magnetically coupled, thereby the attenuation amount in the high frequency band can be increased. Therefore, in the electronic component 1, frequency characteristics can be improved. For example, superior characteristics in a high frequency band can be obtained.

In the electronic component 1 according to the present embodiment, the distance K1 between the inductor pattern

15 and the inductor pattern 16 in the first direction D1 is shorter than the radii of the inductor pattern 15 and the inductor pattern 16. As described above, in the electronic component 1, by making the distance K1 shorter than the radii of the inductor pattern 15 and the inductor pattern 16 (half the coil size, as a specific example of the present embodiment), the magnetic coupling between the first inductor L1 configured to include the inductor pattern 15 and the second inductor L2 configured to include the inductor pattern 16 can be strengthened. Therefore, in the electronic component 1, it is possible to adjust frequency characteristics such as obtaining attenuation in a high frequency band.

Second Embodiment

Figure 8:
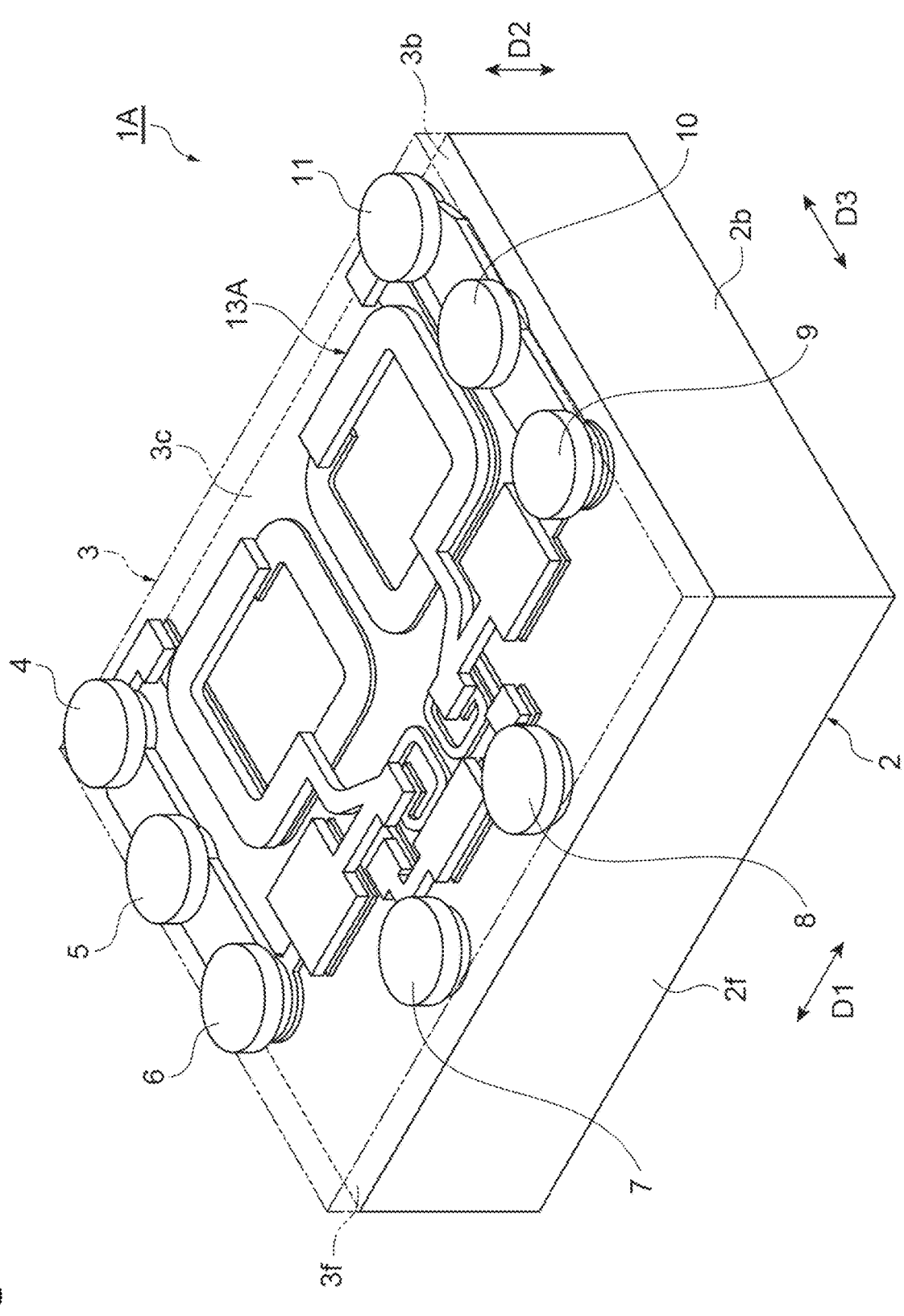
FIG. 8 is a perspective view of an electronic component according to a second embodiment.
Figure 9:
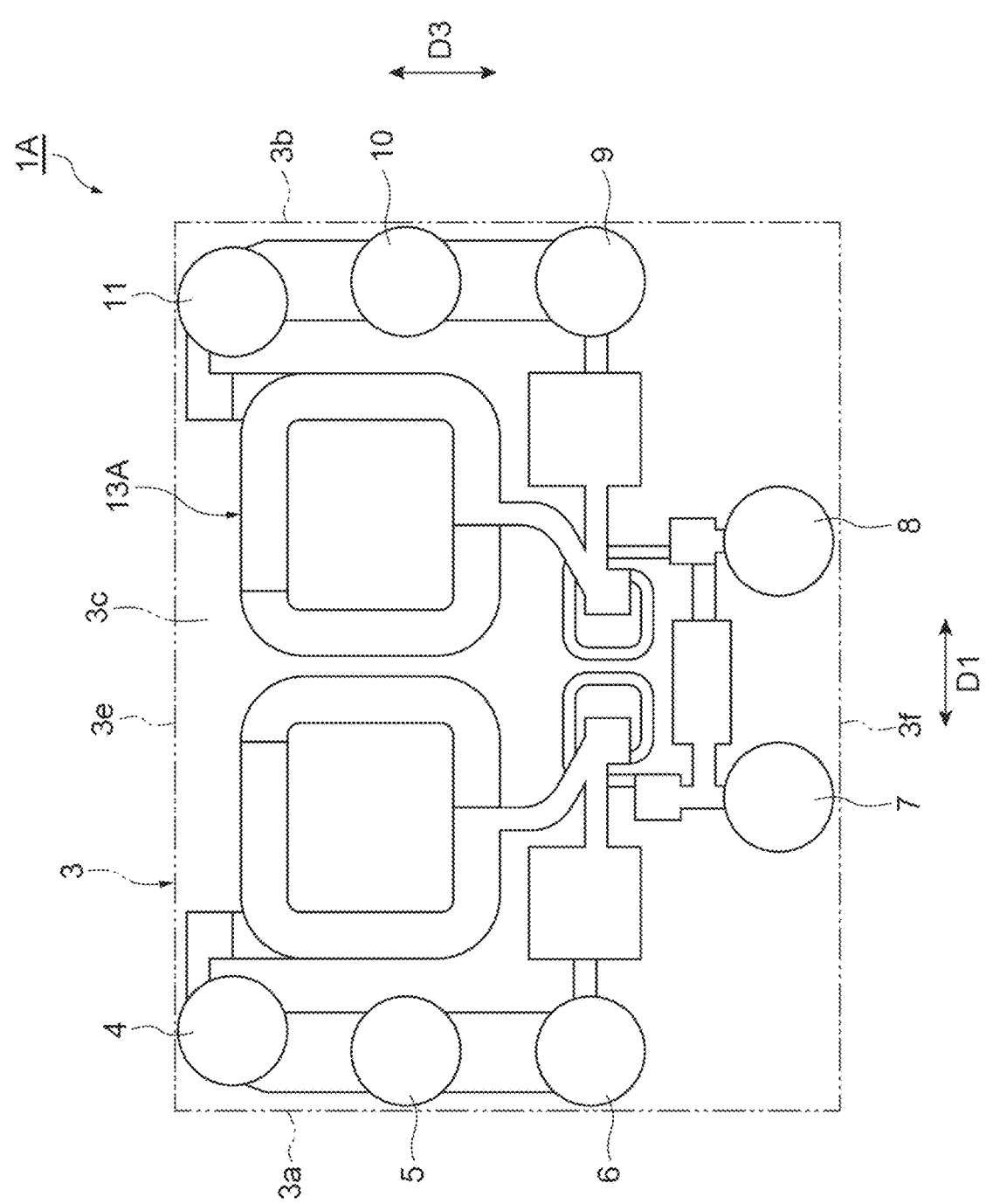
FIG. 9 is a view of the electronic component illustrated in FIG. 8 as viewed from an insulator side.
Figure 10:
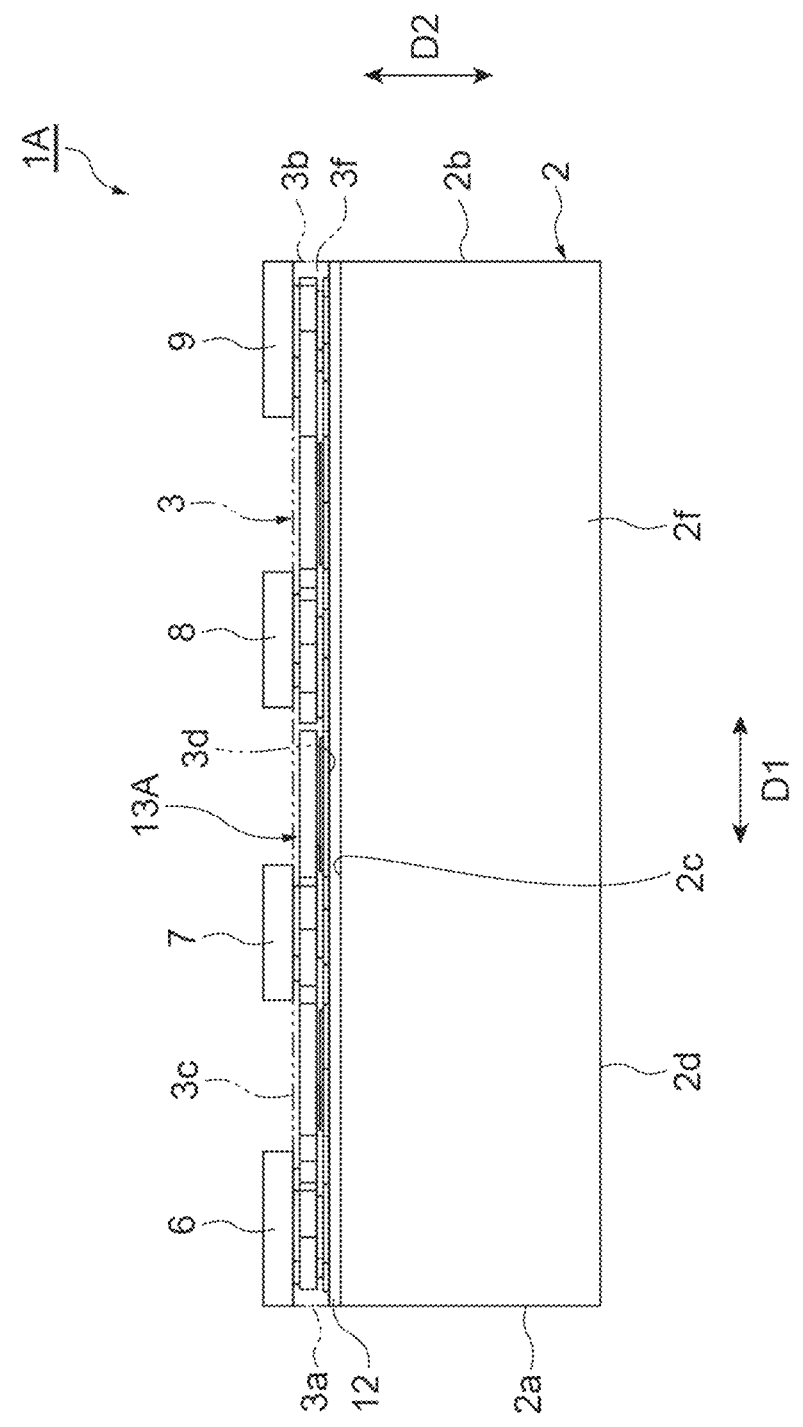
FIG. 10 is a side view of the electronic component illustrated in FIG. 8.
Figure 11:
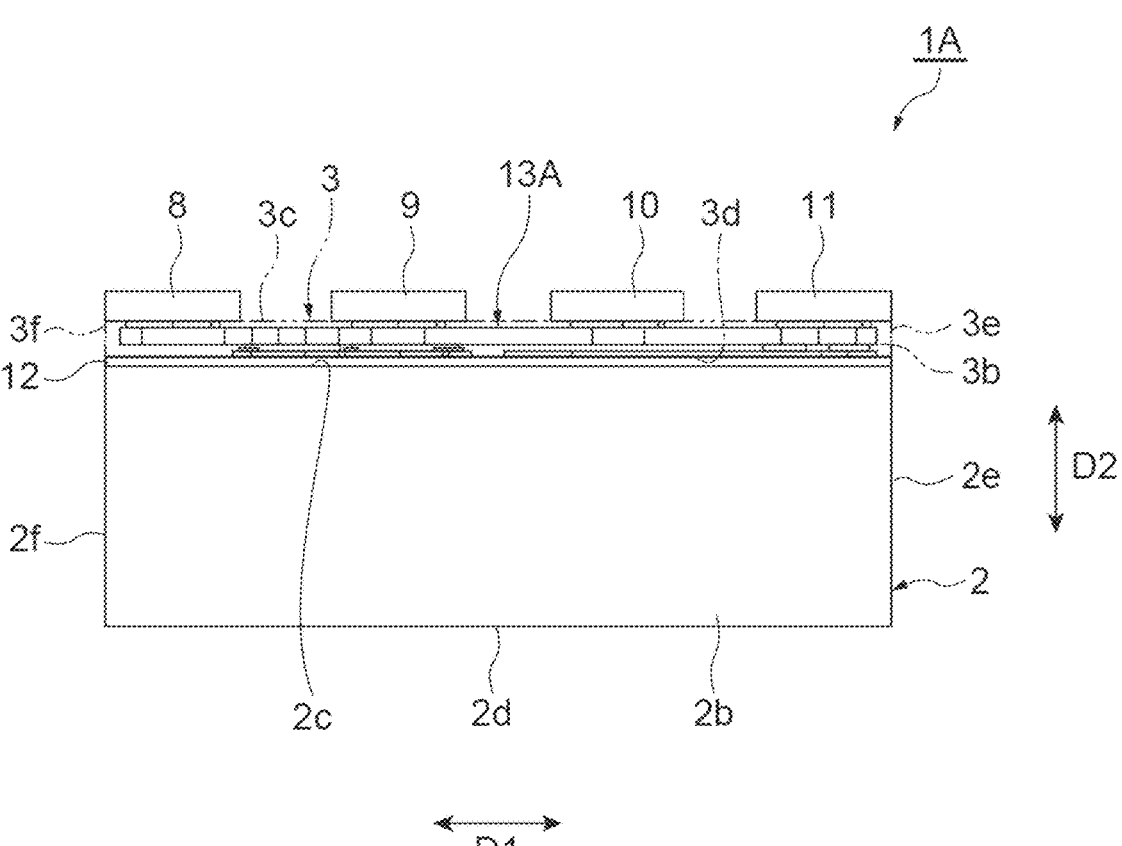
FIG. 11 is an end view of the electronic component illustrated in FIG. 8.

Next, a second embodiment will be described. FIG. 8 is a perspective view of an electronic component according to the second embodiment. FIG. 9 is a view of the electronic component illustrated in FIG. 8 as viewed from an insulator side. FIG. 10 is a side view of the electronic component illustrated in FIG. 8. FIG. 11 is an end view of the electronic component illustrated in FIG. 8.

As illustrated in FIGS. 8 to 11, an electronic component 1A includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

Figure 12:
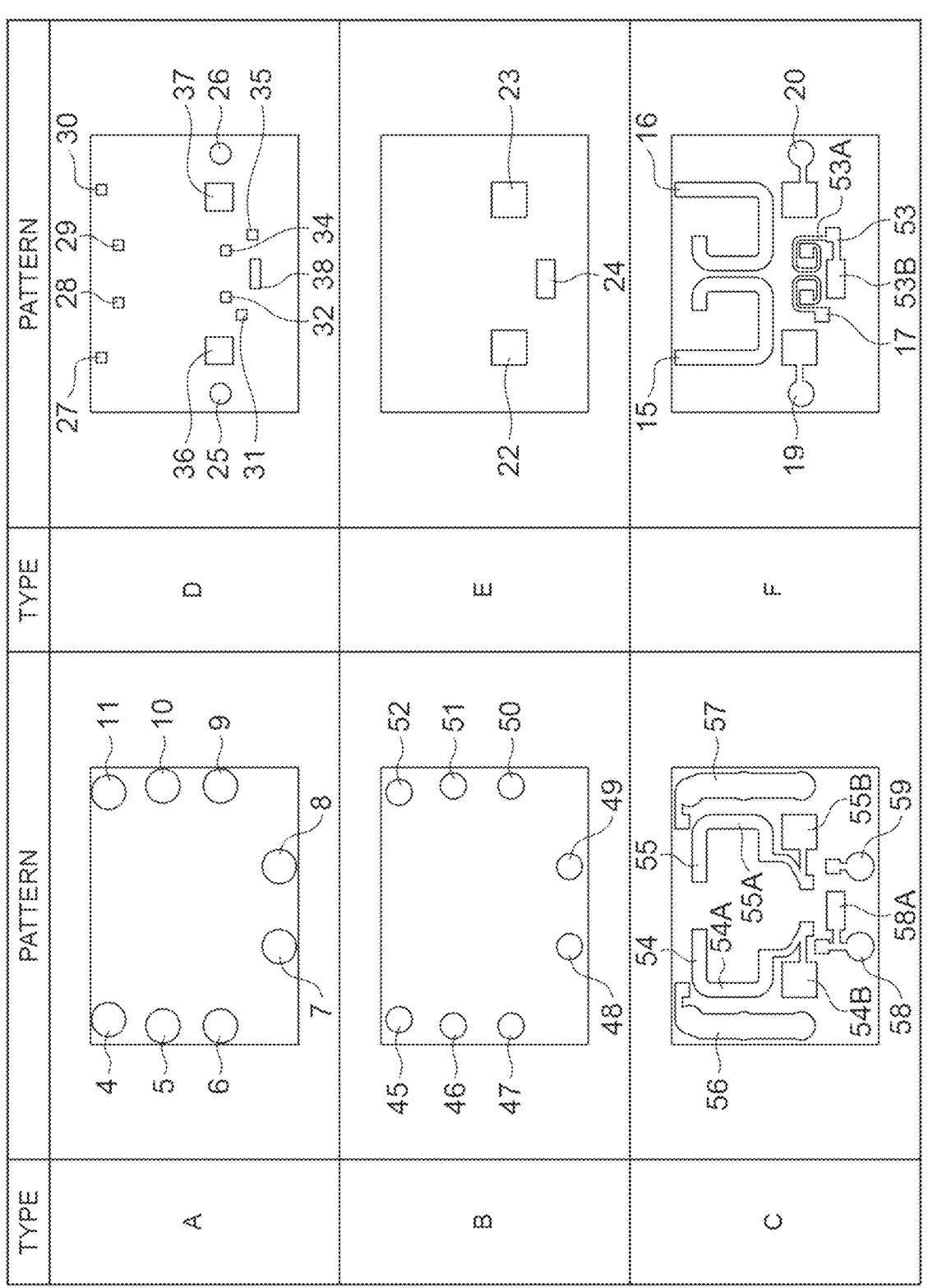
FIG. 12 is a view illustrating a conductor pattern constituting an LC filter unit included in the electronic component illustrated in FIG. 8.

In the electronic component 1A, an LC filter unit 13A is disposed in the insulator 3. FIG. 12 is a view illustrating a conductor pattern constituting the LC filter unit 13A included in the electronic component 1A illustrated in FIG. 8. In the electronic component 1A, the conductor patterns are disposed in the order shown in a layer F, a layer E, a layer D, a layer C, a layer B, and a layer A in FIG. 12 from the substrate 2 side (the side of the main surface 3d of the insulator 3). The conductor pattern may include an inductor pattern, a capacitor pattern, and a via pattern. The conductor pattern can be formed of, for example, copper.

As illustrated in the layer F of FIG. 12, the LC filter unit 13A includes an inductor pattern 15, an inductor pattern 16, an inductor pattern 17, a capacitor pattern 19, a capacitor pattern 20, and a conductor pattern 53. The inductor pattern 15, the inductor pattern 16, the inductor pattern 17, the capacitor pattern 19, the capacitor pattern 20, and the conductor pattern 53 are disposed on a planarization layer 12 (FIGS. 10 and 11). The conductor pattern 53 includes an inductor pattern (fourth inductor pattern) 50A and a capacitor pattern 53B.

As illustrated in the layer E in FIG. 12, the LC filter unit 13A includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 12, the LC filter unit 13A includes a via pattern 25, a via pattern 26, a via pattern 27, a via pattern 28, a via pattern 29, a via pattern 30, a via pattern 31, a via pattern 32, a via pattern 34, a via pattern 35, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 31, the via pattern 32, the via pattern 34, the via pattern 35, the via pattern 36, the via pattern 37, and the via pattern 38 has, for example, a rectangular shape.

As illustrated in the layer C of FIG. 12, the LC filter unit 13A includes a conductor pattern 54, a conductor pattern 55, a conductor pattern 56, a conductor pattern 57, a conductor pattern 58, and a conductor pattern 59.

The conductor pattern 54 includes an inductor pattern 54A and a capacitor pattern 54B. The conductor pattern 55 includes an inductor pattern 55A and a capacitor pattern 55B. The conductor pattern 58 includes a capacitor pattern 58A.

As illustrated in the layer B of FIG. 12, the LC filter unit 13A includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 12, the electronic component 1A includes the first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11.

As illustrated in the layer D of FIG. 12, the via pattern 25 connects the capacitor pattern 19 and the conductor pattern 56. The via pattern 26 connects the capacitor pattern 20 and the conductor pattern 57. The via pattern 27 connects the inductor pattern 15 and the conductor pattern 56. The via pattern 28 connects the inductor pattern 15 and the inductor pattern 54A. The via pattern 29 connects the inductor pattern 16 and the inductor pattern 55A. The via pattern 30 connects the inductor pattern 16 and the conductor pattern 57.

The via pattern 31 connects the inductor pattern 17 and the conductor pattern 58. The via pattern 32 connects the inductor pattern 17 and the conductor pattern 54. The via pattern 34 connects the inductor pattern 53A and the conductor pattern 55. The via pattern 35 connects the conductor pattern 53 and the conductor pattern 59.

The via pattern 36 connects the capacitor pattern 22 and the capacitor pattern 54B. The via pattern 37 connects the capacitor pattern 23 and the capacitor pattern 55B. The via pattern 38 connects the capacitor pattern 24 and the capacitor pattern 58A.

As illustrated in the layer B of FIG. 12, the via pattern 45 connects the conductor pattern 56 and the first terminal electrode 4. The via pattern 46 connects the conductor pattern 56 and the second terminal electrode 5. The via pattern 47 connects the conductor pattern 56 and the third terminal electrode 6. The via pattern 48 connects the conductor pattern 58 and the fourth terminal electrode 7. The via pattern 49 connects the conductor pattern 59 and the fifth terminal electrode 8. The via pattern 50 connects the conductor pattern 57 and the sixth terminal electrode 9. The via pattern 51 connects the conductor pattern 57 and the seventh terminal electrode 10. The via pattern 52 connects the conductor pattern 57 and the eighth terminal electrode 11.

A dielectric layer (not illustrated) is disposed between the capacitor pattern 19 and the capacitor pattern 22. A dielectric layer (not illustrated) is disposed between the capacitor pattern 20 and the capacitor pattern 23. A dielectric layer (not illustrated) is disposed between the capacitor pattern 53B and the capacitor pattern 24. The dielectric layer may be formed of, for example, an inorganic insulating material made of a paraelectric material such as silicon nitride or silicon oxide, a ferroelectric material, or the like.

Figure 13:
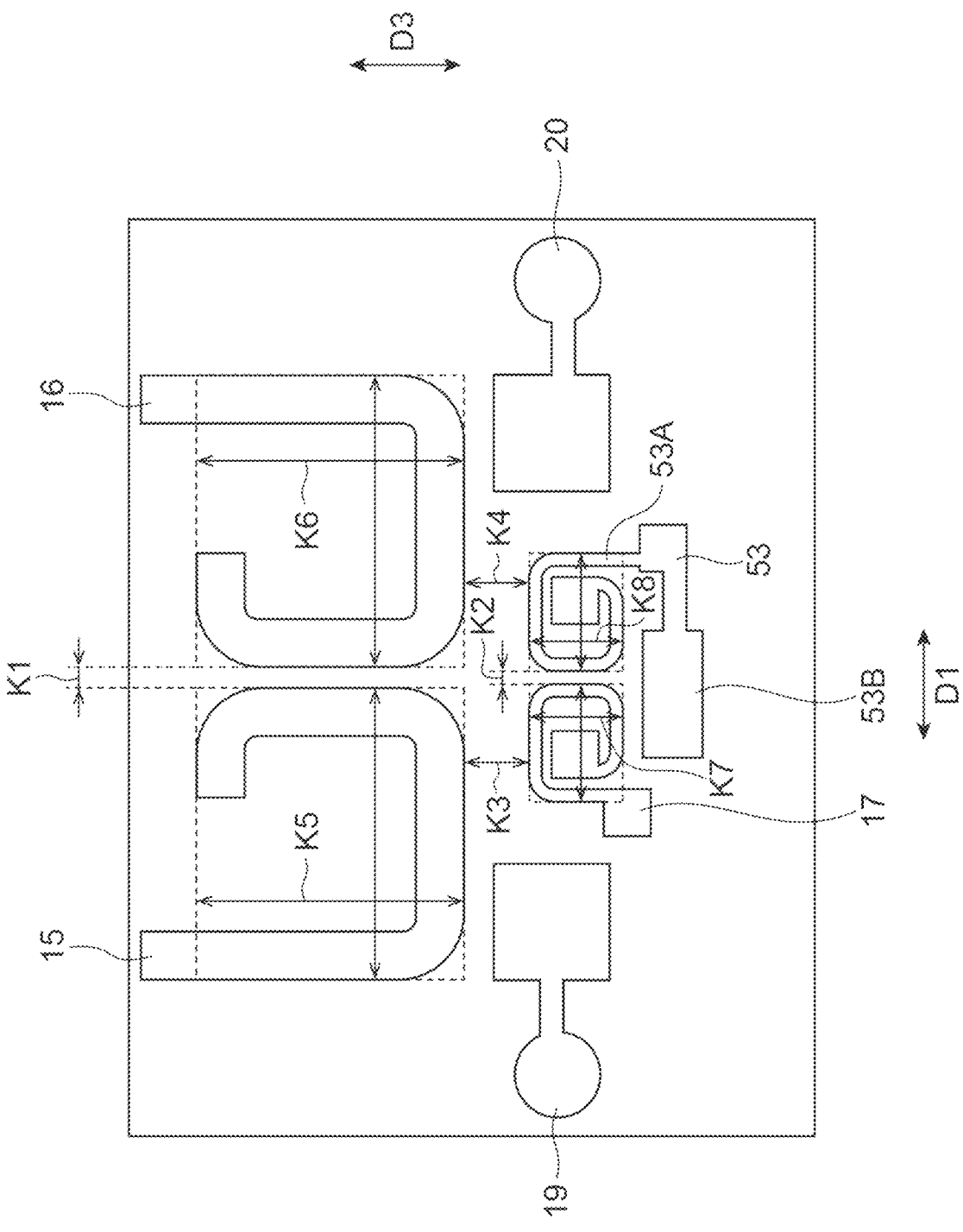
FIG. 13 is a views illustrating a conductor pattern.

As illustrated in FIG. 13, the inductor pattern 15 and the inductor pattern 16 are arranged side by side in the first direction D1 in plan view. In the present embodiment, the shapes of the inductor pattern 15 and the inductor pattern 16 have line symmetry with a line along the third direction D3 as an axis. The inductor pattern 17 and the inductor pattern 53A are arranged side by side in the first direction D1 in plan view. The inductor pattern 15 and the inductor pattern 17 are arranged side by side in the third direction D3 in plan view. The inductor pattern 16 and the inductor pattern 18 are arranged side by side in the third direction D3 in plan view.

In the present embodiment, a distance K1 between the inductor pattern 15 and the inductor pattern 16 in the first direction D1 is longer than a distance K2 between the inductor pattern 17 and the inductor pattern 53A in the first direction D1 (distance K1>distance K2). In other words, the distance K2 is shorter than the distance K1.

A distance K3 between the inductor pattern 15 and the inductor pattern 17 in the third direction D3 is longer than the distance K1 (K3>K1). In other words, the distance K1 is shorter than the distance K3. A distance K4 between the inductor pattern 16 and the inductor pattern 53A in the third direction D3 is longer than the distance K1 (K4>K1). In other words, the distance K1 is shorter than the distance K4. The distance K2 is shorter than the distance K3 and the distance K4 (K2<K3, K4). In other words, the distance K3 and the distance K4 are longer than the distance K2.

The distance K1 is shorter than the radii of the inductor pattern 15 and the inductor pattern 16. In the present embodiment, the radius of the inductor pattern 15 can be defined by a length (K5/2) that is half the length K5 of the short side of a rectangular virtual line (indicated by a broken line in FIG. 13) that includes (envelops) the region of the inductor pattern 15 (a portion forming a coil in the inductor pattern 15, as a specific example of the present embodiment). Similarly, the radius of the inductor pattern 16 can be defined by a length (K6/2) that is half the length K6 of the short side of the rectangular virtual line including the region of the inductor pattern 16. For example, the inductor pattern 15 and the inductor pattern 16 may be formed such that radii thereof are equal (or substantially equal) to each other.

The distance K2 is shorter than the radii of the inductor pattern 17 and the inductor pattern 53A. In the present embodiment, the radius of the inductor pattern 17 can be defined by a length (K7/2) that is half the length K7 of the short side of the rectangular virtual line including the region of the inductor pattern 17. Similarly, the radius of the inductor pattern 53A can be defined by a length (K8/2) that is half the length K8 of the short side of the rectangular virtual line including the region of the inductor pattern 53A. For example, the inductor pattern 17 and the inductor pattern 53A may be formed such that radii thereof are equal (or substantially equal) to each other.

The radius of the inductor pattern 15 may be equal to or larger than the radii of the inductor pattern 17 and the inductor pattern 53A. The radius of the inductor pattern 16 may be equal to or larger than the radii of the inductor pattern 17 and the inductor pattern 53A.

The inductor pattern 15 and the inductor pattern 16 are disposed to be magnetically coupled. The inductor pattern 17 and the inductor pattern 53A are disposed to be magnetically coupled. The inductor pattern 17 is disposed to be magnetically coupled to the inductor pattern 16. The inductor pattern 53A is disposed to be magnetically coupled to the inductor pattern 15.

Figure 14:
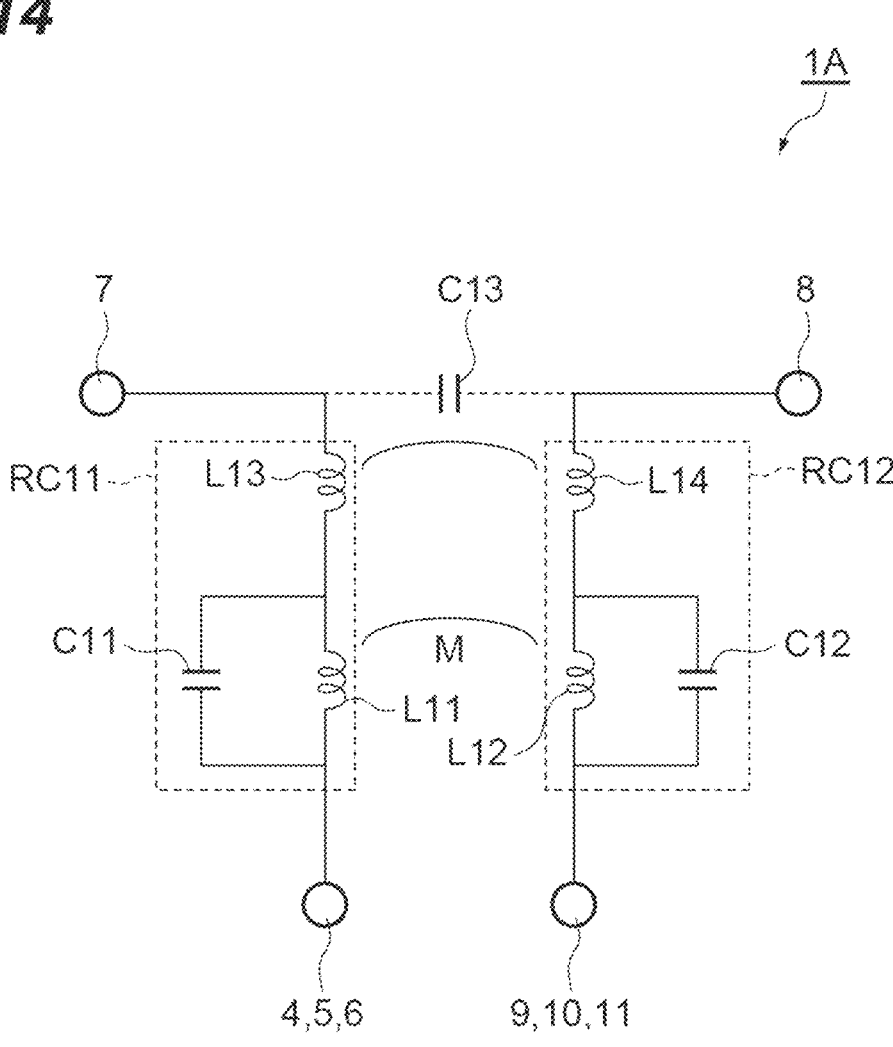
FIG. 14 is an equivalent circuit diagram of the electronic component shown in FIG. 8.

FIG. 14 is an equivalent circuit diagram of the electronic component 1A illustrated in FIG. 8. As illustrated in FIG. 14, the electronic component 1A includes a first inductor L11, a second inductor L12, a third inductor L13, a fourth inductor L14, a first capacitor C11, a second capacitor C12, and a third capacitor C13. The electronic component 1A constitutes a two-stage resonant band-pass filter circuit.

The first inductor L11 includes an inductor pattern 15 and an inductor pattern 54A. The second inductor L12 includes an inductor pattern 16 and an inductor pattern 55A. The third inductor L13 includes an inductor pattern 17. The fourth inductor L14 includes an inductor pattern 53A.

The first capacitor C11 includes a capacitor pattern 19, a capacitor pattern 22, and a capacitor pattern 54B. The second capacitor C12 includes a capacitor pattern 20, a capacitor pattern 23, and a capacitor pattern 55B. The third capacitor C13 includes a capacitor pattern 53B, a capacitor pattern 24, and a capacitor pattern 58A.

The first inductor L11, the third inductor L13, and the first capacitor C11 constitute a first LC resonator (first resonance circuit) RC11. The first inductor L11 and the third inductor L13 are electrically connected in series. The second inductor L12, the fourth inductor L14, and the second capacitor C12 constitute a second LC resonator (second resonance circuit) RC12. The second inductor L12 and the fourth inductor L14 are electrically connected in series. The first inductor L11, the second inductor L12, and the fourth inductor L14 are magnetically coupled. The second inductor L12, the first inductor L11, and the third inductor L13 are magnetically coupled.

As described above, in the electronic component 1A according to the present embodiment, the first LC resonator RC11 includes the third inductor L13 electrically connected in series with the first inductor L11. The second LC resonator RC12 includes the fourth inductor L14 electrically connected in series with the second inductor L12. The third inductor L13 is disposed to be magnetically coupled to the second inductor L12. The fourth inductor L14 is disposed to be magnetically coupled to the first inductor L11. As a result, in the electronic component 1A, the attenuation amount in the high frequency band can be increased. Therefore, in the electronic component 1A, frequency characteristics can be improved. For example, superior characteristics in a high frequency band can be obtained.

In the electronic component 1A according to the present embodiment, a distance K2 between the inductor pattern 17 and the inductor pattern 53A in the first direction D1 is shorter than a distance K3 between the inductor pattern 15 and the inductor pattern 17 in the third direction D3 and a distance K4 between the inductor pattern 16 and the inductor pattern 53A in the third direction D3. In this configuration, it is possible to enhance magnetic coupling between the third inductor L13 configured to include the inductor pattern 17 and the fourth inductor L14 configured to include the inductor pattern 53A. Therefore, in the electronic component 1A, it is possible to adjust frequency characteristics such as obtaining attenuation in a high frequency band.

In the electronic component 1A according to the present embodiment, the distance K2 between the inductor pattern 17 and the inductor pattern 53A in the first direction D1 is shorter than the radii of the inductor pattern 17 and the inductor pattern 53A. As described above, in the electronic component 1A, by making the distance K2 shorter than the radii of the inductor pattern 17 and the inductor pattern 53A (half the coil size, as a specific example of the present embodiment), the magnetic coupling between the third inductor L13 configured to include the inductor pattern 17 and the fourth inductor L14 configured to include the inductor pattern 53A can be strengthened. Therefore, in the electronic component 1A, it is possible to adjust frequency characteristics such as obtaining attenuation in a high frequency band.

Third Embodiment

Figure 15:
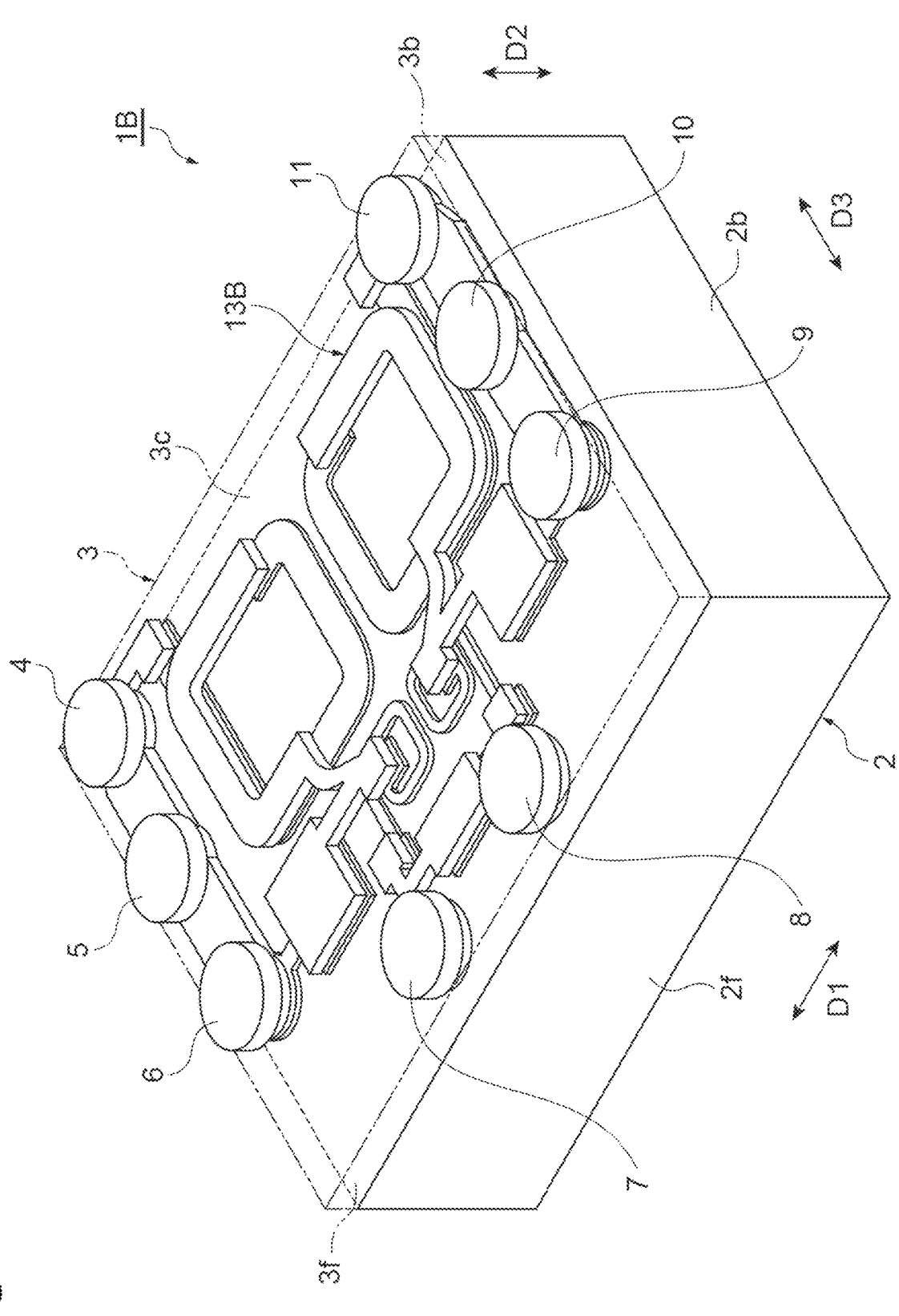
FIG. 15 is a perspective view of an electronic component according to a third embodiment.
Figure 16:
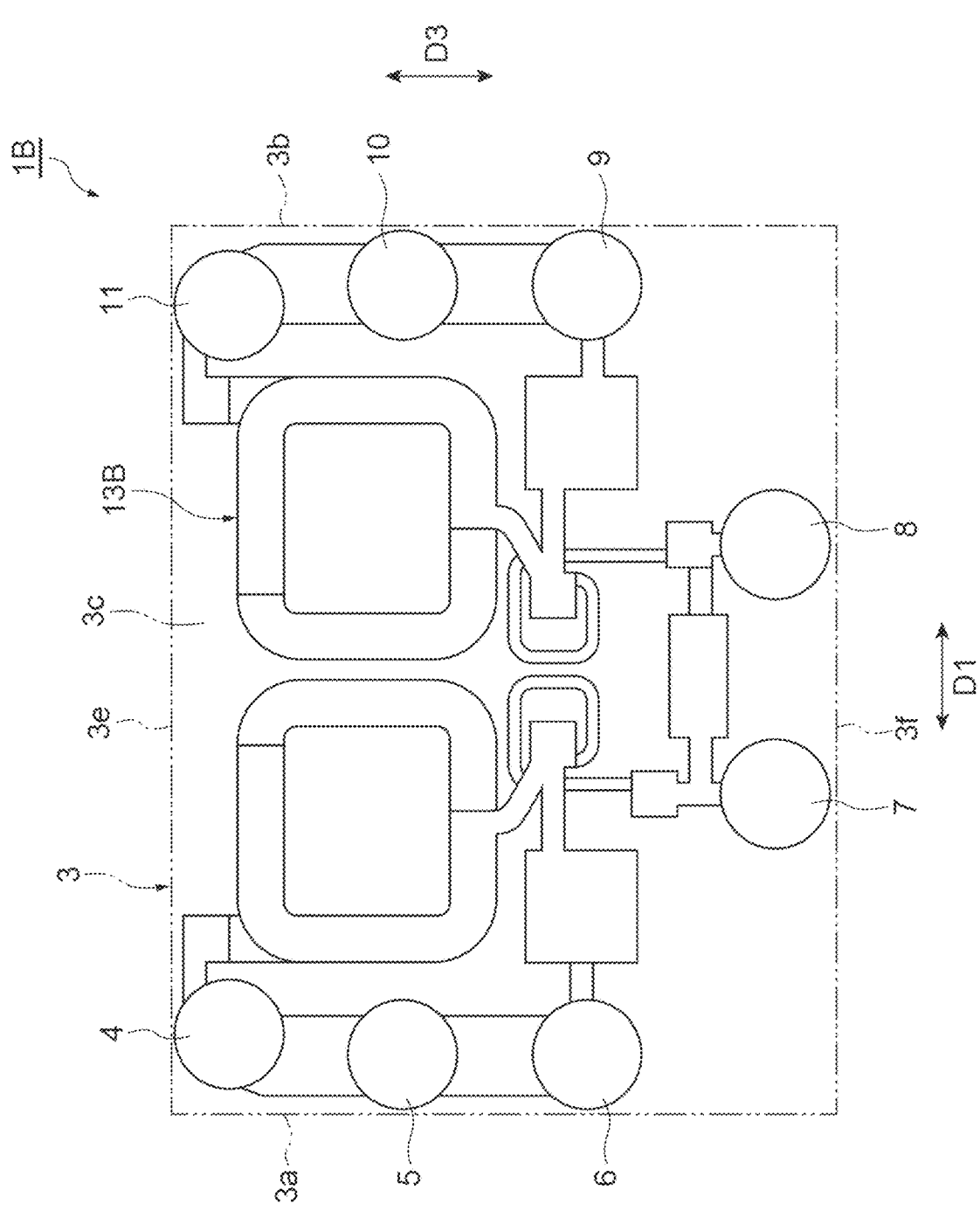
FIG. 16 is a view of the electronic component illustrated in FIG. 15 as viewed from an insulator side.
Figure 17:
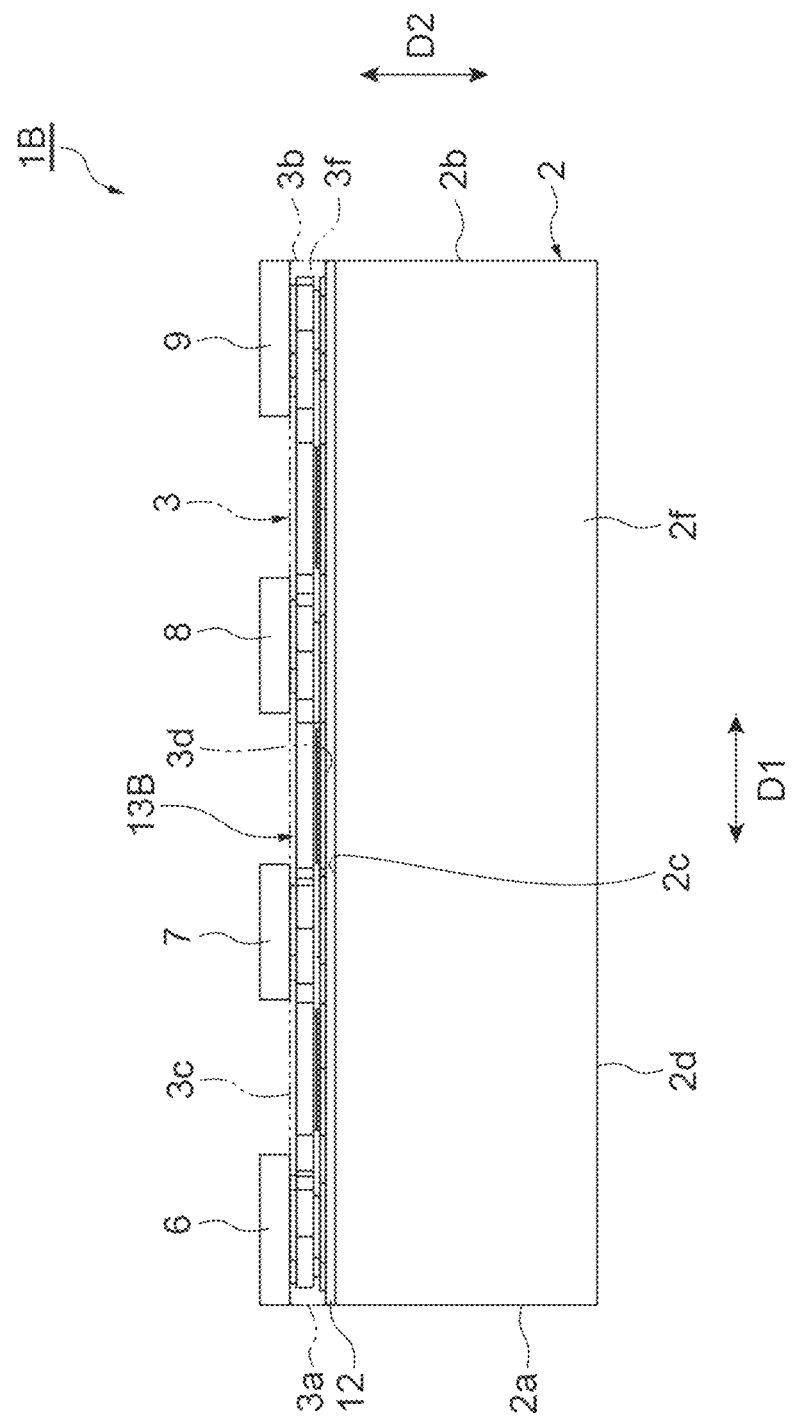
FIG. 17 is a side view of the electronic component illustrated in FIG. 15.
Figure 18:
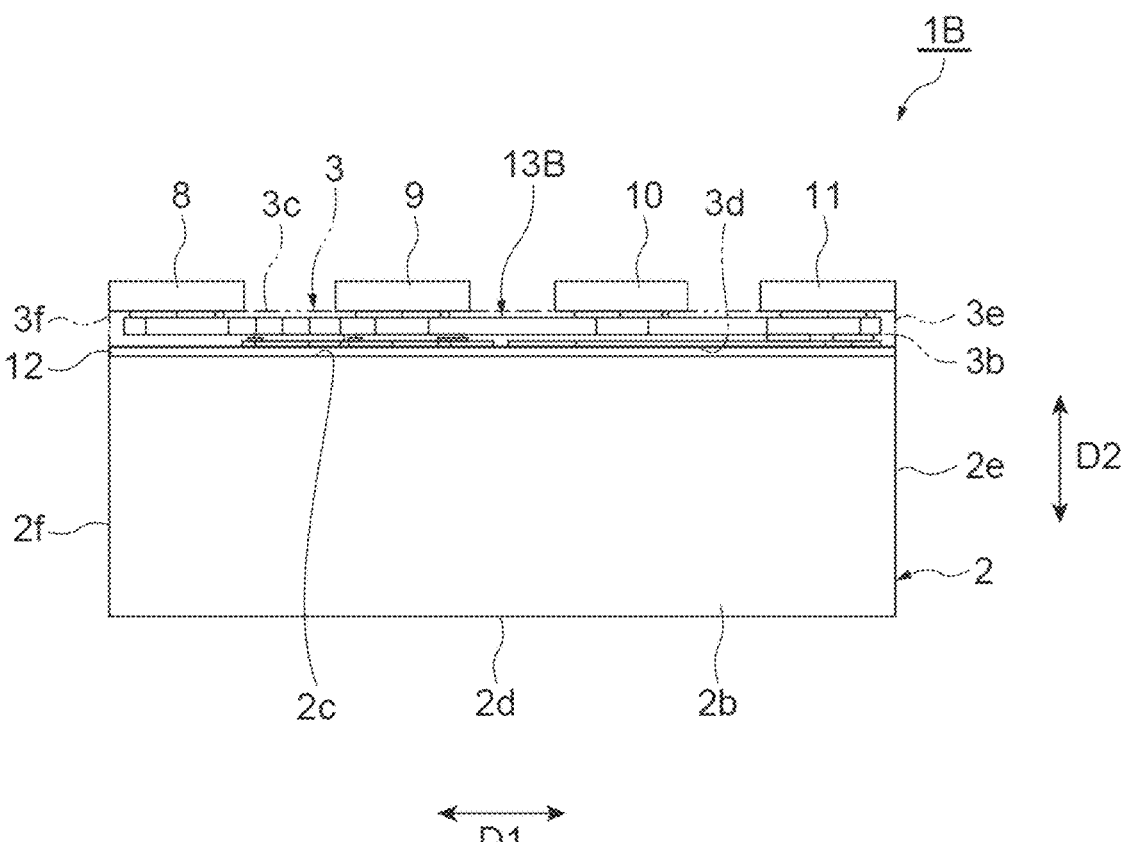
FIG. 18 is an end view of the electronic component illustrated in FIG. 15.

Next, a third embodiment will be described. FIG. 15 is a perspective view of an electronic component according to the third embodiment. FIG. 16 is a view of the electronic component illustrated in FIG. 15 as viewed from an insulator side. FIG. 17 is a side view of the electronic component illustrated in FIG. 15. FIG. 18 is an end view of the electronic component illustrated in FIG. 15.

As illustrated in FIGS. 15 to 18, an electronic component 1B includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

Figure 19:
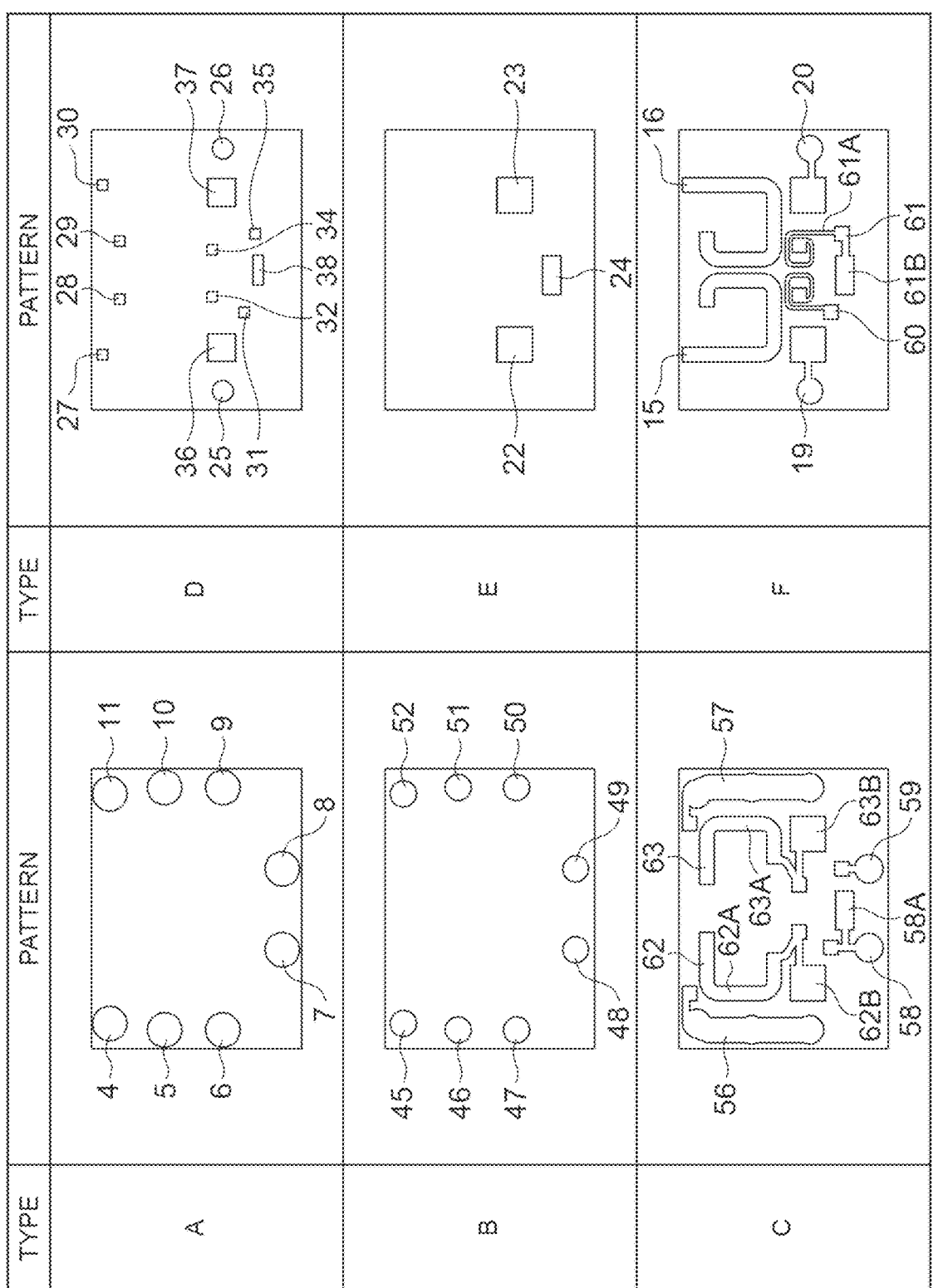
FIG. 19 is a view illustrating a conductor pattern constituting an LC filter unit included in the electronic component illustrated in FIG. 15.

In the electronic component 1B, an LC filter unit 13B is disposed in the insulator 3. FIG. 19 is a view illustrating a conductor pattern constituting the LC filter unit 13B included in the electronic component 1B illustrated in FIG. 15. In the electronic component 1B, the conductor patterns are disposed in the order shown in a layer F, a layer E, a layer D, a layer C, a layer B, and a layer A in FIG. 19 from the substrate 2 side (the side of the main surface 3d of the insulator 3). The conductor pattern may include an inductor pattern, a capacitor pattern, and a via pattern. The conductor pattern can be formed of, for example, copper.

As illustrated in the layer F in FIG. 19, the LC filter unit 13B includes an inductor pattern 15, an inductor pattern 16, a capacitor pattern 19, a capacitor pattern 20, an inductor pattern (third inductor pattern) 60, and a conductor pattern 61. The inductor pattern 15, the inductor pattern 16, the capacitor pattern 19, the capacitor pattern 20, the inductor pattern 60, and the conductor pattern 61 are disposed on a planarization layer 12 (FIGS. 17 and 18). The conductor pattern 61 includes an inductor pattern (fourth inductor pattern) 59A and a capacitor pattern 61B.

As illustrated in the layer E in FIG. 19, the LC filter unit 13B includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 19, the LC filter unit 13B includes a via pattern 25, a via pattern 26, a via pattern 27, a via pattern 28, a via pattern 29, a via pattern 30, a via pattern 31, a via pattern 32, a via pattern 34, a via pattern 35, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 31, the via pattern 32, the via pattern 34, the via pattern 35, the via pattern 36, the via pattern 37, and the via pattern 38 has, for example, a rectangular shape.

As illustrated in the layer C of FIG. 19, the LC filter unit 13B includes a conductor pattern 56, a conductor pattern 57, a conductor pattern 58, a conductor pattern 59, a conductor pattern 62, and a conductor pattern 63.

The conductor pattern 58 includes a capacitor pattern 58A. The conductor pattern 62 includes an inductor pattern 62A and a capacitor pattern 62B. The conductor pattern 63 includes an inductor pattern 63A and a capacitor pattern 63B.

As illustrated in the layer B of FIG. 19, the LC filter unit 13B includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 19, the electronic component 1B includes the first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11.

As illustrated in the layer D of FIG. 19, the via pattern 25 connects the capacitor pattern 19 and the conductor pattern 56. The via pattern 26 connects the capacitor pattern 20 and the conductor pattern 57. The via pattern 27 connects the inductor pattern 15 and the conductor pattern 56. The via pattern 28 connects the inductor pattern 15 and the inductor pattern 62A. The via pattern 29 connects the inductor pattern 16 and the inductor pattern 63A. The via pattern 30 connects the inductor pattern 16 and the conductor pattern 57.

The via pattern 31 connects the inductor pattern 60 and the conductor pattern 58. The via pattern 32 connects the inductor pattern 60 and the conductor pattern 62. The via pattern 34 connects the inductor pattern 61A and the conductor pattern 63. The via pattern 35 connects the conductor pattern 61 and the conductor pattern 59.

The via pattern 36 connects the capacitor pattern 22 and the capacitor pattern 62B. The via pattern 37 connects the capacitor pattern 23 and the capacitor pattern 63B. The via pattern 38 connects the capacitor pattern 24 and the capacitor pattern 58A.

As illustrated in the layer B of FIG. 19, the via pattern 45 connects the conductor pattern 56 and the first terminal electrode 4. The via pattern 46 connects the conductor pattern 56 and the second terminal electrode 5. The via pattern 47 connects the conductor pattern 56 and the third terminal electrode 6. The via pattern 48 connects the conductor pattern 58 and the fourth terminal electrode 7. The via pattern 49 connects the conductor pattern 59 and the fifth terminal electrode 8. The via pattern 50 connects the conductor pattern 57 and the sixth terminal electrode 9. The via pattern 51 connects the conductor pattern 57 and the seventh terminal electrode 10. The via pattern 52 connects the conductor pattern 57 and the eighth terminal electrode 11.

A dielectric layer (not illustrated) is disposed between the capacitor pattern 19 and the capacitor pattern 22. A dielectric layer (not illustrated) is disposed between the capacitor pattern 20 and the capacitor pattern 23. A dielectric layer (not illustrated) is disposed between the capacitor pattern 53B and the capacitor pattern 24. The dielectric layer may be formed of, for example, an inorganic insulating material made of a paraelectric material such as silicon nitride or silicon oxide, a ferroelectric material, or the like.

Figure 20:
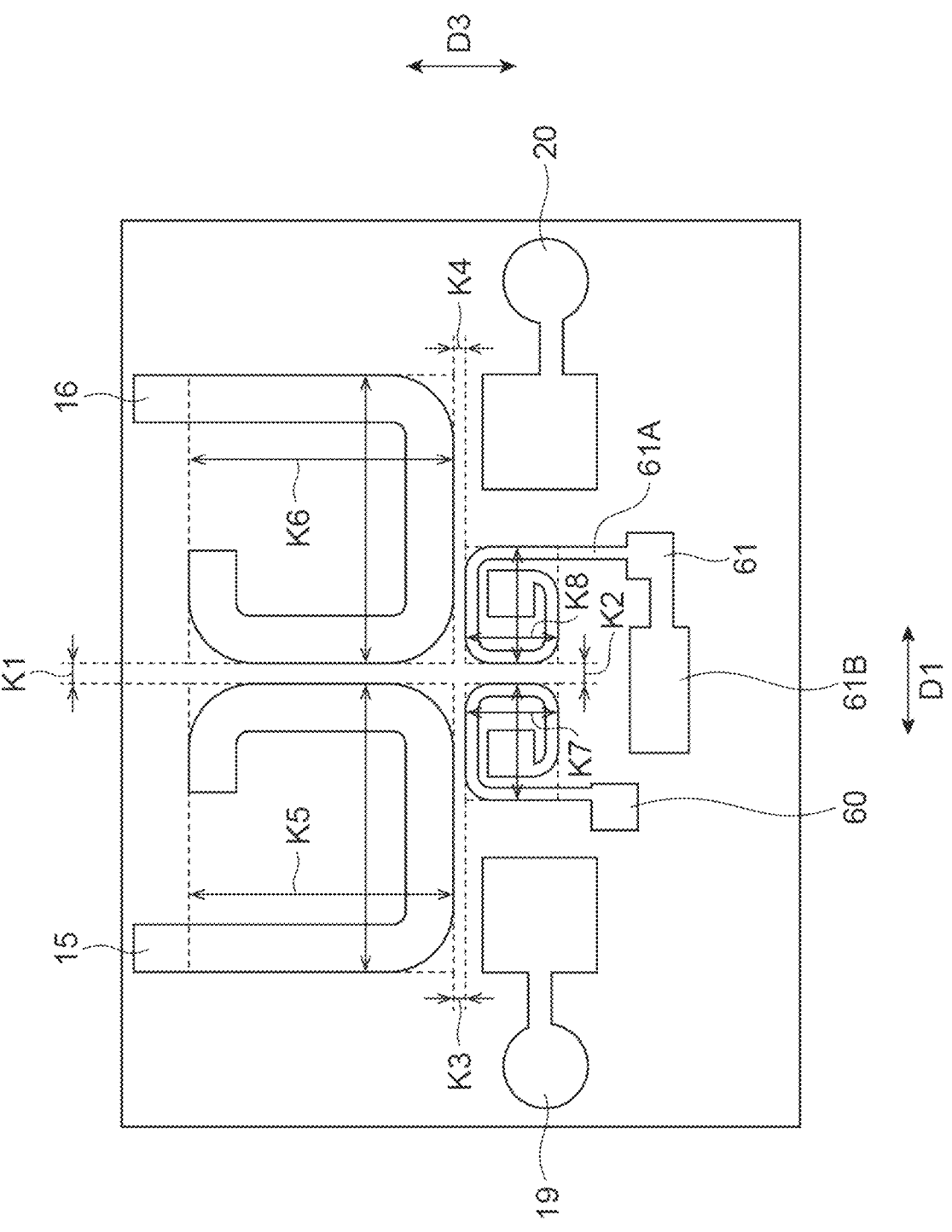
FIG. 20 is a views illustrating a conductor pattern.

As illustrated in FIG. 20, the inductor pattern 15 and the inductor pattern 16 are arranged side by side in the first direction D1 in plan view. In the present embodiment, the shapes of the inductor pattern 15 and the inductor pattern 16 have line symmetry with a line along the third direction D3 as an axis. The inductor pattern 60 and the inductor pattern 61A are arranged side by side in the first direction D1 in plan view. The inductor pattern 15 and the inductor pattern 60 are arranged side by side in the third direction D3 in plan view. The inductor pattern 16 and the inductor pattern 61A are arranged side by side in the third direction D3 in plan view.

In the present embodiment, a distance K1 between the inductor pattern 15 and the inductor pattern 16 in the first direction D1 is equal to a distance K2 between the inductor pattern 17 and the inductor pattern 53A in the first direction D1 (distance K1=distance K2).

A distance K3 between the inductor pattern 15 and the inductor pattern 60 in the third direction D3 is equal to the distance K1 (K3=K1). A distance K4 between the inductor pattern 16 and the inductor pattern 61A in the third direction D3 is equal to the distance K1 (K4=K1). The distance K2 is equal to the distance K3 and the distance K4 (K2=K3, K4).

The distance K1, the distance K2, the distance K3, and the distance K4 are shorter than the radii of the inductor pattern 15 and the inductor pattern 16. In the present embodiment, the radius of the inductor pattern 15 can be defined by a length (K5/2) that is half the length K5 of the short side of a rectangular virtual line (indicated by a broken line in FIG. 20) that includes (envelops) the region of the inductor pattern 15 (a portion forming a coil in the inductor pattern 15, as a specific example of the present embodiment). Similarly, the radius of the inductor pattern 16 can be defined by a length (K6/2) that is half the length K6 of the short side of the rectangular virtual line including the region of the inductor pattern 16. For example, the inductor pattern 15 and the inductor pattern 16 may be formed such that radii thereof are equal (or substantially equal) to each other.

The distance K1, the distance K2, the distance K3, and the distance K4 are shorter than the radii of the inductor pattern 60 and the inductor pattern 61A. In the present embodiment, the radius of the inductor pattern 60 can be defined by a length (K7/2) that is half the length K7 of the short side of the rectangular virtual line including the region of the inductor pattern 60. Similarly, the radius of the inductor pattern 61A can be defined by a length (K8/2) that is half the length K8 of the short side of the rectangular virtual line including the region of the inductor pattern 61A. For example, the inductor pattern 60 and the inductor pattern 61A may be formed such that radii thereof are equal (or substantially equal) to each other.

The radius of the inductor pattern 15 may be equal to or larger than the radii of the inductor pattern 60 and the inductor pattern 61A. The radius of the inductor pattern 16 may be equal to or larger than the radii of the inductor pattern 60 and the inductor pattern 61A.

The inductor pattern 15 and the inductor pattern 16 are disposed to be magnetically coupled. The inductor pattern 60 and the inductor pattern 61A are disposed to be magnetically coupled. The inductor pattern 60 is disposed to be magnetically coupled to the inductor pattern 16. The inductor pattern 61A is disposed to be magnetically coupled to the inductor pattern 15.

Figure 21:
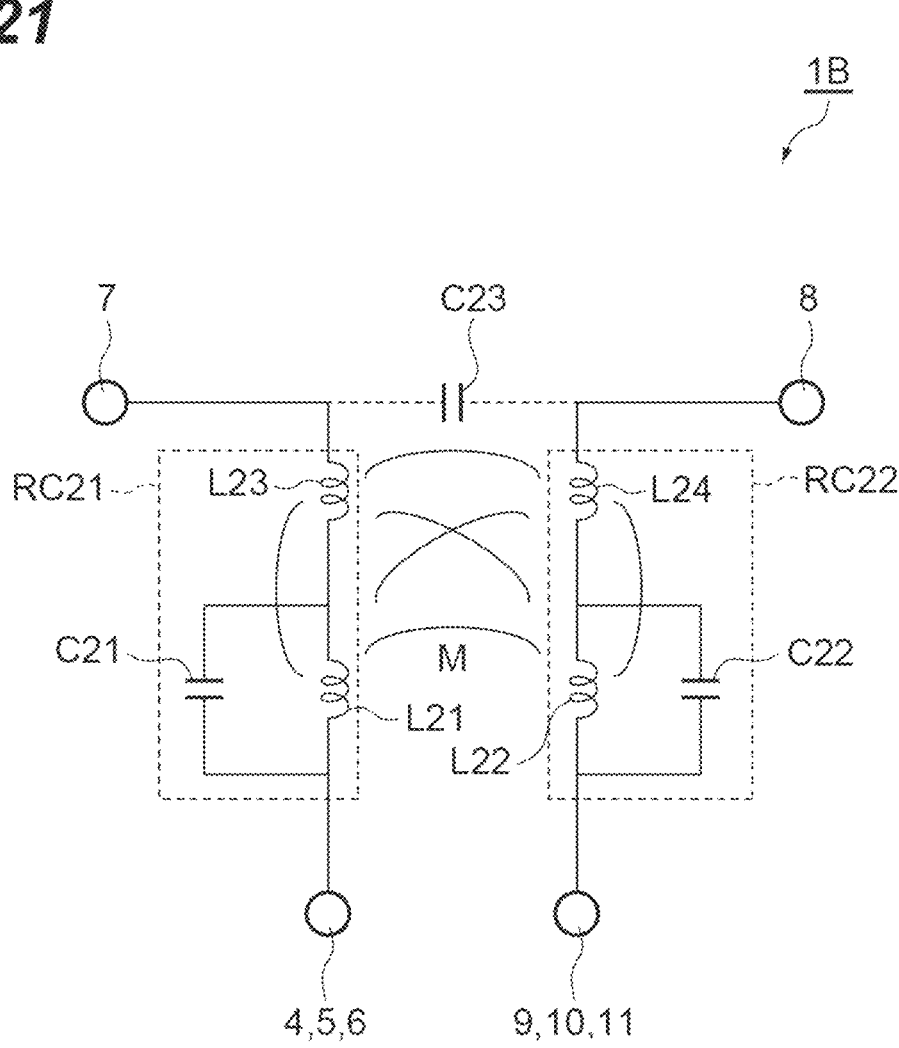
FIG. 21 is an equivalent circuit diagram of the electronic component illustrated in FIG. 15.

FIG. 21 is an equivalent circuit diagram of the electronic component 1A illustrated in FIG. 15. As illustrated in FIG. 21, the electronic component 1B includes a first inductor L21, a second inductor L22, a third inductor L23, a fourth inductor L24, a first capacitor C21, a second capacitor C22, and a third capacitor C23. The electronic component 1B constitutes a two-stage resonant band-pass filter circuit.

The first inductor L21 includes an inductor pattern 15 and an inductor pattern 62A. The second inductor L22 includes an inductor pattern 16 and an inductor pattern 63A. The third inductor L23 includes an inductor pattern 60. The fourth inductor L24 includes an inductor pattern 61A.

The first capacitor C21 includes a capacitor pattern 19, a capacitor pattern 22, and a capacitor pattern 62B. The second capacitor C22 includes a capacitor pattern 20, a capacitor pattern 23, and a capacitor pattern 63B. The third capacitor C23 includes a capacitor pattern 61B, a capacitor pattern 24, and a capacitor pattern 58A.

The first inductor L21, the third inductor L23, and the first capacitor C21 constitute a first LC resonator (first resonance circuit) RC21. The first inductor L21 and the third inductor L23 are electrically connected in series. The second inductor L22, the fourth inductor L24, and the second capacitor C22 constitute a second LC resonator (second resonance circuit) RC22. The second inductor L22 and the fourth inductor L24 are electrically connected in series. The first inductor L21, the second inductor L22, and the fourth inductor L24 are magnetically coupled. The second inductor L22, the first inductor L21, and the third inductor L23 are magnetically coupled.

As described above, in the electronic component 1B according to the present embodiment, the first LC resonator RC21 includes the third inductor L23 electrically connected in series with the first inductor L21. The second LC resonator RC22 includes the fourth inductor L24 electrically connected in series with the second inductor L22. The third inductor L23 is disposed to be magnetically coupled to the second inductor L22. The fourth inductor L24 is disposed to be magnetically coupled to the first inductor L21. As a result, in the electronic component 1B, the attenuation amount in the high frequency band can be increased. Therefore, in the electronic component 1B, frequency characteristics can be improved. For example, superior characteristics in a high frequency band can be obtained.

In the electronic component 1B according to the present embodiment, the distance K3 between the inductor pattern 15 and the inductor pattern 60 in the third direction D3 and the distance K4 between the inductor pattern 16 and the inductor pattern 61A in the third direction D3 are shorter than the radii of the inductor pattern 60 and the inductor pattern 61A. As described above, in the electronic component 1B, by making the distance K3 and the distance K4 shorter than the radii of the inductor pattern 60 and the inductor pattern 61A (half the coil size, as a specific example of the present embodiment), the magnetic coupling between the third inductor L23 and the second inductor L22 configured to include the inductor pattern 60 and the fourth inductor L24 and the first inductor L21 configured to include the inductor pattern 61A can be strengthened. Therefore, in the electronic component 1B, it is possible to adjust frequency characteristics such as obtaining attenuation in a high frequency band.

In the electronic component 1B according to the present embodiment, the distance K1 between the inductor pattern 15 and the inductor pattern 16 in the first direction D1 is equal to the distance K3 between the inductor pattern 15 and the inductor pattern 60 in the third direction D3 and the distance K4 between the inductor pattern 16 and the inductor pattern 61A in the third direction D3. As a result, in the electronic component 1B, magnetic coupling between the third inductor L23, the second inductor L22, and the fourth inductor L24 can be strengthened, and magnetic coupling between the fourth inductor L24, the first inductor L21, and the third inductor L23 can be strengthened. Therefore, in the electronic component 1B, it is possible to adjust frequency characteristics such as obtaining attenuation in a high frequency band.

Fourth Embodiment

Figure 22:
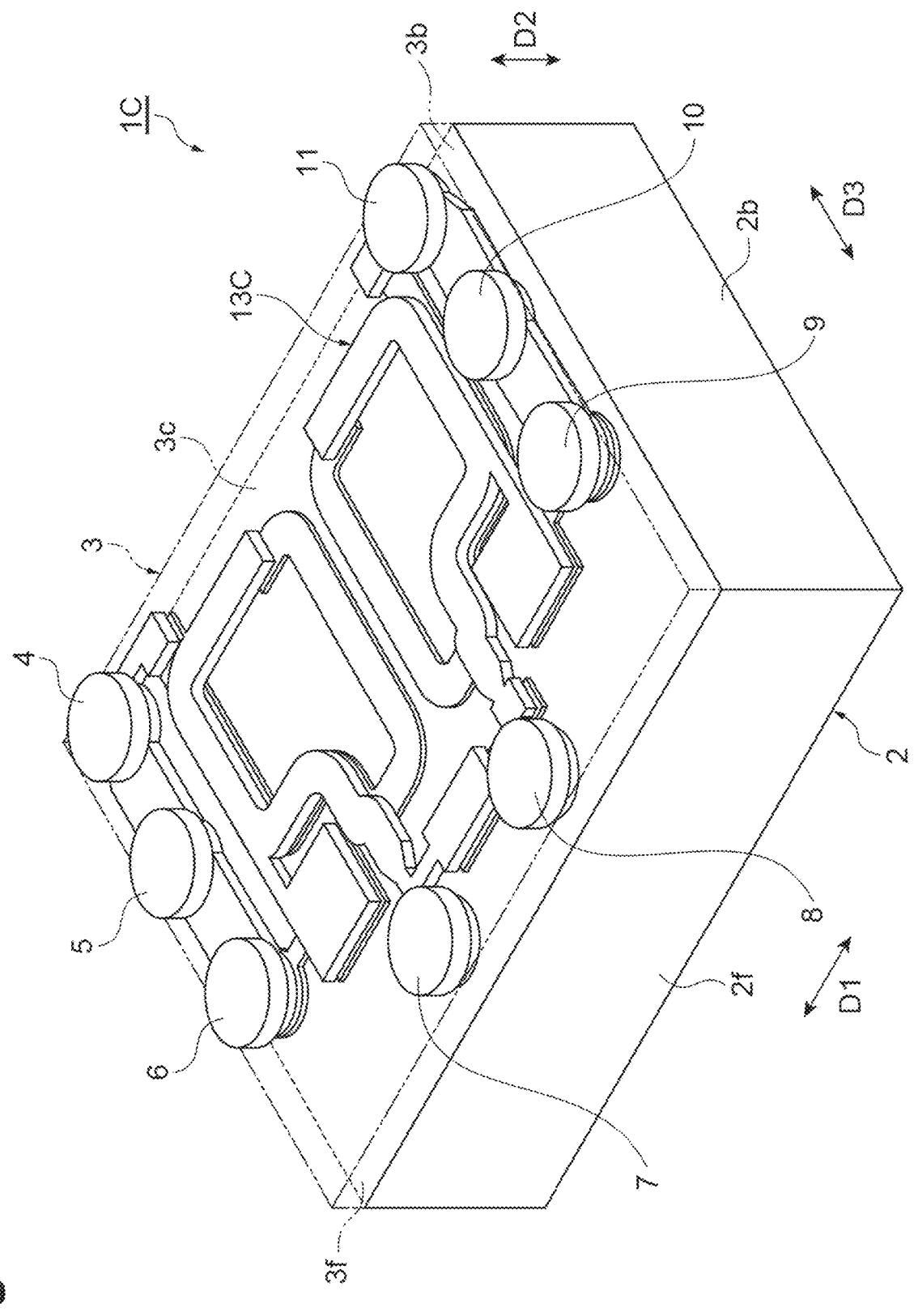
FIG. 22 is a perspective view of an electronic component according to a fourth embodiment.
Figure 23:
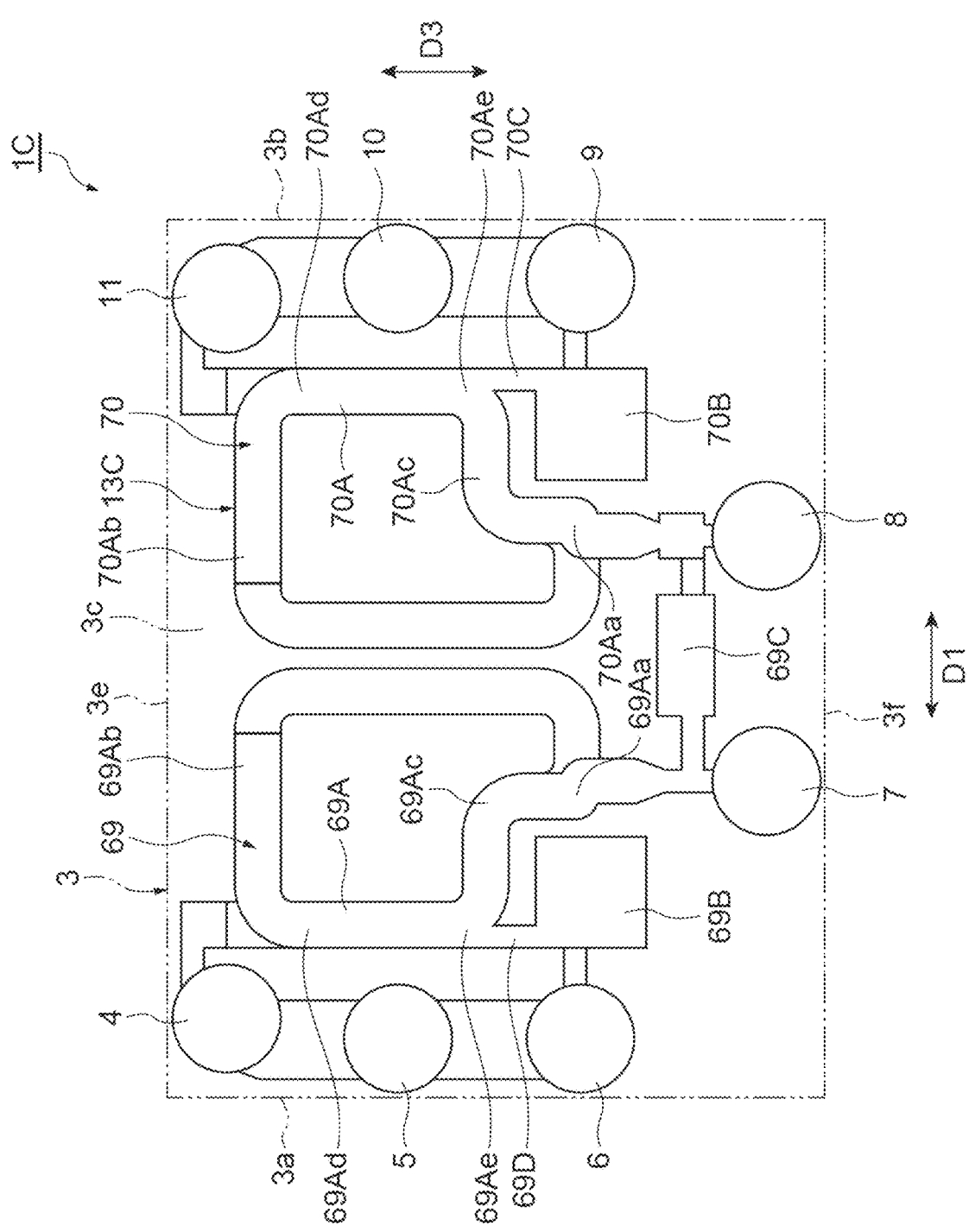
FIG. 23 is a view of the electronic component illustrated in FIG. 22 as viewed from an insulator side.
Figure 24:
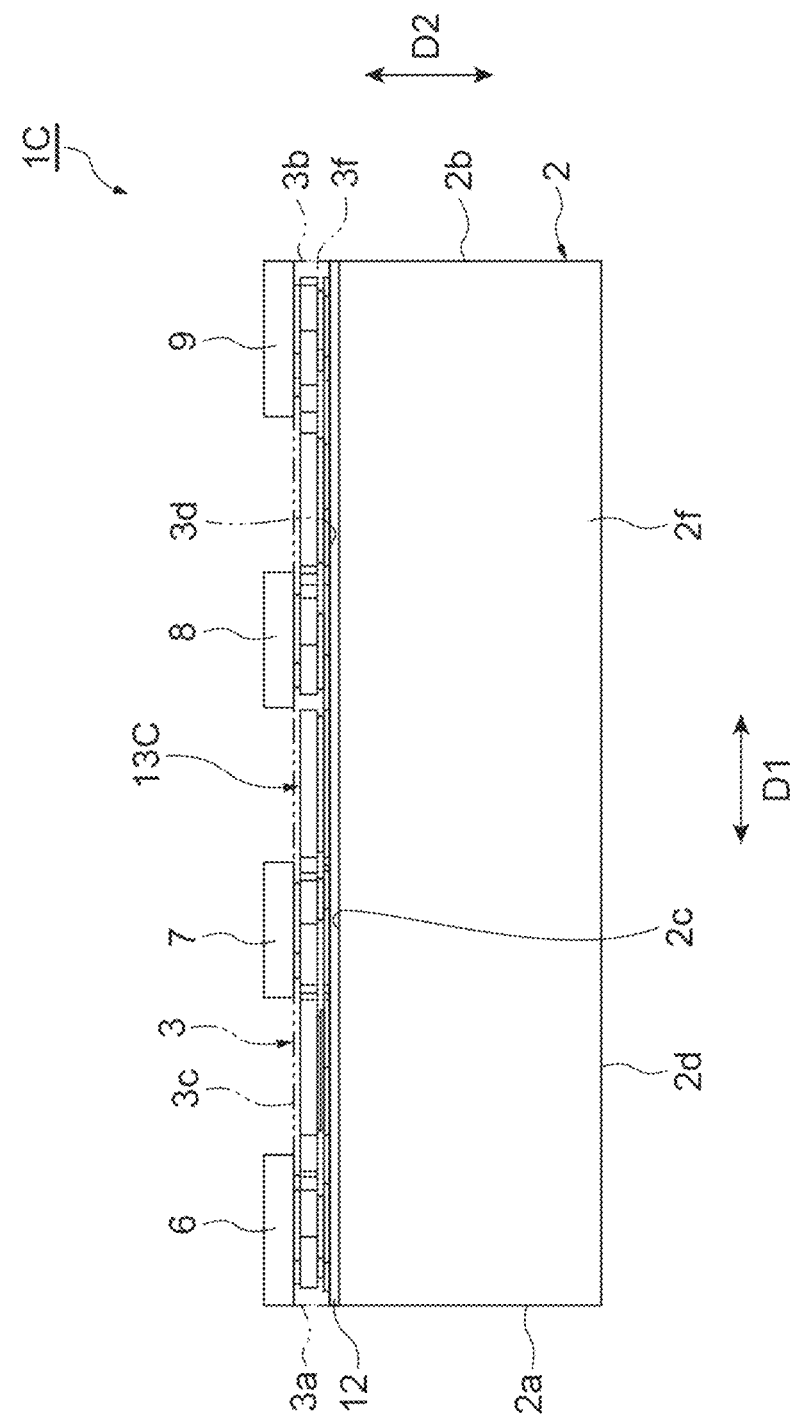
FIG. 24 is a side view of the electronic component illustrated in FIG. 22.
Figure 25:
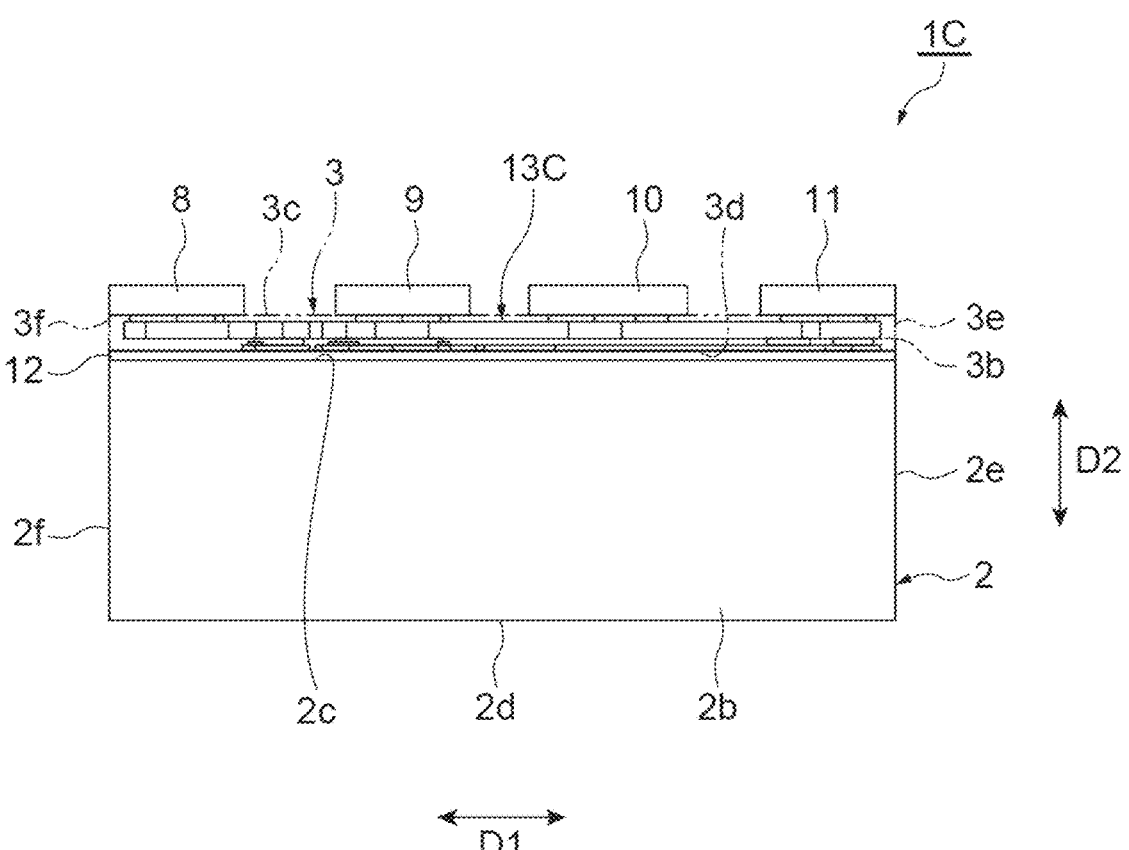
FIG. 25 is an end view of the electronic component illustrated in FIG. 22.

Next, a fourth embodiment will be described. FIG. 22 is a perspective view of an electronic component according to the fourth embodiment. FIG. 23 is a view of the electronic component illustrated in FIG. 22 as viewed from an insulator side. FIG. 24 is a side view of the electronic component illustrated in FIG. 22. FIG. 25 is an end view of the electronic component illustrated in FIG. 22.

As illustrated in FIGS. 22 to 25, an electronic component 1C includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

Figure 26:
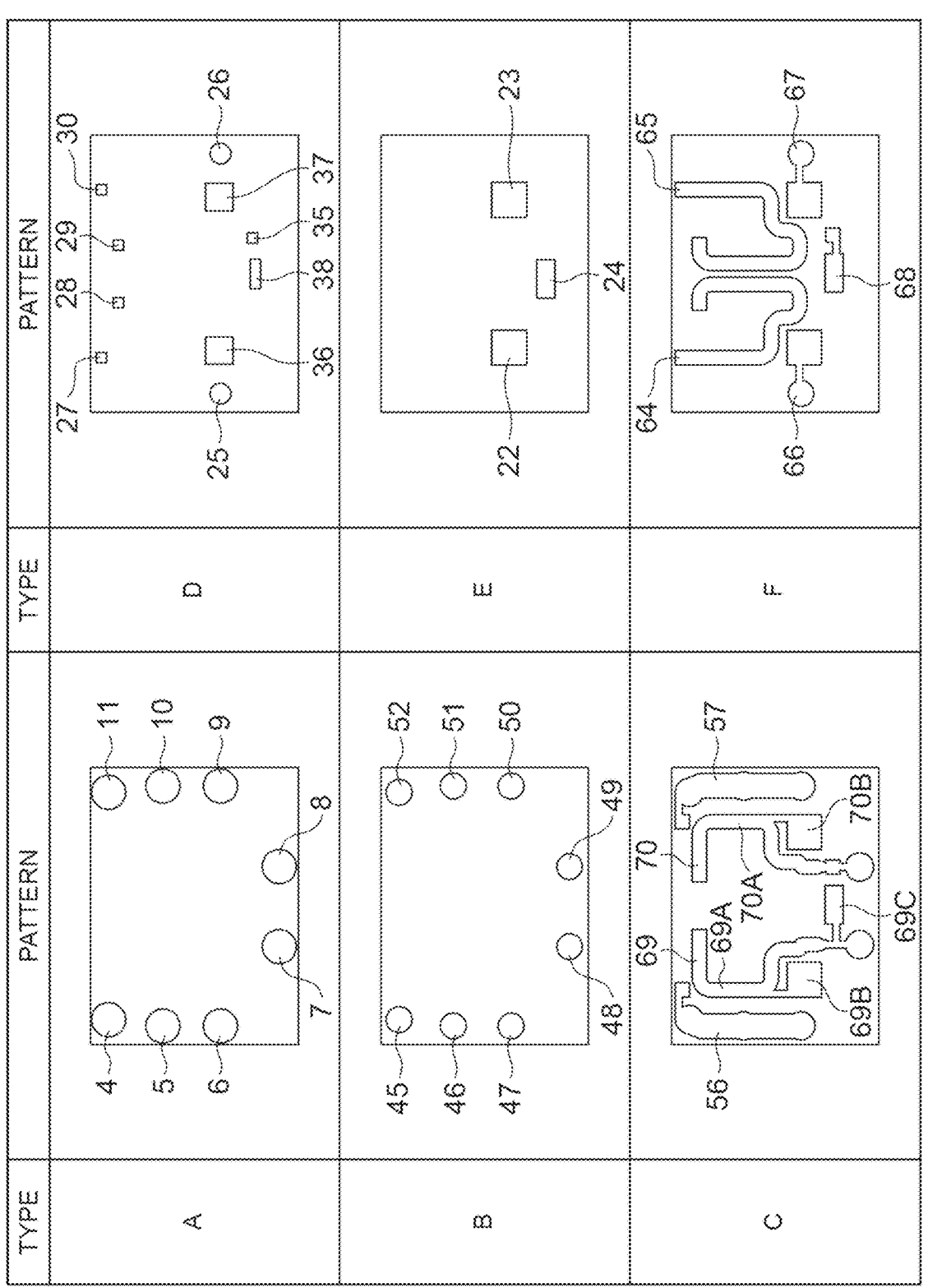
FIG. 26 is a view illustrating a conductor pattern constituting an LC filter unit included in the electronic component illustrated in FIG. 22.

In the electronic component 1C, an LC filter unit 13C is disposed in the insulator 3. FIG. 26 is a view illustrating a conductor pattern constituting the LC filter unit 13C included in the electronic component 1C illustrated in FIG. 22. In the electronic component 1C, the conductor patterns are disposed in the order shown in a layer F, a layer E, a layer D, a layer C, a layer B, and a layer A in FIG. 26 from the substrate 2 side (the side of the main surface 3d of the insulator 3). The conductor pattern may include an inductor pattern, a capacitor pattern, and a via pattern. The conductor pattern can be formed of, for example, copper.

As illustrated in the layer F of FIG. 26, the LC filter unit 13C includes an inductor pattern (first inductor pattern) 64, an inductor pattern (second inductor pattern) 65, a capacitor pattern 66, a capacitor pattern 67, and a capacitor pattern 68. The inductor pattern 64, the inductor pattern 65, the capacitor pattern 66, the capacitor pattern 67, and the capacitor pattern 68 are disposed on a planarization layer 12 (FIGS. 24 and 25).

As illustrated in the layer E in FIG. 26, the LC filter unit 13C includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 26, the LC filter unit 13C includes a via pattern 25, a via pattern 26, a via pattern 27, a via pattern 28, a via pattern 29, a via pattern 30, a via pattern 35, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 35, the via pattern 36, the via pattern 37, and the via pattern 38 has, for example, a rectangular shape.

As illustrated in the layer C of FIG. 26, the LC filter unit 13C includes a conductor pattern 56, a conductor pattern 57, a conductor pattern 69, and a conductor pattern 70.

As illustrated in the layer B of FIG. 26, the LC filter unit 13C includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 26, the electronic component 1C includes the first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11.

As illustrated in the layer D of FIG. 26, the via pattern 25 connects the capacitor pattern 66 and the conductor pattern 56. The via pattern 26 connects the capacitor pattern 67 and the conductor pattern 57. The via pattern 27 connects the inductor pattern 64 and the conductor pattern 56. The via pattern 28 connects the inductor pattern 64 and the inductor pattern 69A. The via pattern 29 connects the inductor pattern 65 and the inductor pattern 70A. The via pattern 30 connects the inductor pattern 65 and the conductor pattern 57. The via pattern 35 connects the capacitor pattern 68 and the conductor pattern 70.

The via pattern 36 connects the capacitor pattern 22 and a capacitor pattern 69B. The via pattern 37 connects the capacitor pattern 23 and the capacitor pattern 70B. The via pattern 38 connects the capacitor pattern 24 and the capacitor pattern 69C.

As illustrated in the layer B of FIG. 26, the via pattern 45 connects the conductor pattern 56 and the first terminal electrode 4. The via pattern 46 connects the conductor pattern 56 and the second terminal electrode 5. The via pattern 47 connects the conductor pattern 56 and the third terminal electrode 6. The via pattern 48 connects the conductor pattern 69 and the fourth terminal electrode 7. The via pattern 49 connects the conductor pattern 70 and the fifth terminal electrode 8. The via pattern 50 connects the conductor pattern 57 and the sixth terminal electrode 9. The via pattern 51 connects the conductor pattern 57 and the seventh terminal electrode 10. The via pattern 52 connects the conductor pattern 57 and the eighth terminal electrode 11.

A dielectric layer (not illustrated) is disposed between the capacitor pattern 66 and the capacitor pattern 22. A dielectric layer (not illustrated) is disposed between the capacitor pattern 67 and the capacitor pattern 23. A dielectric layer (not illustrated) is disposed between the capacitor pattern 68 and the capacitor pattern 24. The dielectric layer may be formed of, for example, an inorganic insulating material made of a paraelectric material such as silicon nitride or silicon oxide, a ferroelectric material, or the like.

As illustrated in FIG. 23, the conductor pattern 69 includes the inductor pattern 69A, a capacitor pattern (first capacitor pattern) 67B, a capacitor pattern 69C, and a connection pattern 69D.

The inductor pattern 69A includes a first end unit 67Aa and a second end unit 67Ab. The inductor pattern 69A includes a first inductor unit (third inductor pattern) 67Ac, a second inductor unit (first inductor pattern) 67Ad, and a connection unit 67Ae.

The first inductor unit 67Ac and the second inductor unit 67Ad are integrally formed so as to be articulated between the first end unit 67Aa and the second end unit 67Ab in the inductor pattern 69A. The first inductor unit 67Ac is formed between the first end unit 67Aa and the connection unit 67Ae in the inductor pattern 69A. The second inductor unit 67Ad is formed between the connection unit 67Ae and the second end unit 67Ab in the inductor pattern 69A.

The connection unit 67Ae is provided between the first end unit 67Aa and the second end unit 67Ab. The connection unit 67Ae is provided between an end unit of the first inductor unit 67Ac (an end unit opposite to the first end unit 67Aa) and an end unit of the second inductor unit 67Ad (an end unit opposite to the second end unit 67Ab). The connection unit 67Ae connects the first inductor unit 67Ac and the second inductor unit 67Ad. The first inductor unit 67Ac and the second inductor unit 67Ad are articulated via a connection unit 67Ae. That is, the first inductor unit 67Ac and the second inductor unit 67Ad are divided into two portions with the connection unit 67Ae as a boundary in the inductor pattern 69A.

The capacitor pattern 69B has a rectangular shape. The capacitor pattern 69B is connected to the connection unit 67Ae of the inductor pattern 69A via the connection pattern 69D. One end of the connection pattern 69D is connected to the inductor pattern 69A, and the other end of the connection pattern 69D is connected to the capacitor pattern 69B.

The conductor pattern 70 includes an inductor pattern 70A, a capacitor pattern (second capacitor pattern) 68B, and a connection pattern 70C.

The inductor pattern 70A includes a first end unit 68Aa and a second end unit 68Ab. The inductor pattern 70A includes a first inductor unit (fourth inductor pattern) 68Ac, a second inductor unit (second inductor pattern) 68Ad, and a connection unit 68Ae.

The first inductor unit 68Ac and the second inductor unit 68Ad are integrally formed so as to be articulated between the first end unit 68Aa and the second end unit 68Ab in the inductor pattern 70A. The first inductor unit 68Ac is formed between the first end unit 68Aa and the connection unit 68Ae in the inductor pattern 70A. The second inductor unit 68Ad is formed between the connection unit 68Ae and the second end unit 68Ab in the inductor pattern 70A.

The connection unit 68Ae is provided between the first end unit 68Aa and the second end unit 68Ab. The connection unit 68Ae is provided between an end unit of the first inductor unit 68Ac (an end unit opposite to the first end unit 68Aa) and an end unit of the second inductor unit 68Ad (an end unit opposite to the second end unit 68Ab). The connection unit 68Ae connects the first inductor unit 68Ac and the second inductor unit 68Ad. The first inductor unit 68Ac and the second inductor unit 68Ad are articulated via a connection unit 68Ae. That is, the first inductor unit 68Ac and the second inductor unit 68Ad are divided into two portions with the connection unit 68Ae as a boundary in the inductor pattern 70A.

The capacitor pattern 70B has a rectangular shape. The capacitor pattern 70B is connected to the connection unit 68Ae of the inductor pattern 70A via the connection pattern 70C. One end of the connection pattern 70C is connected to the inductor pattern 70A, and the other end of the connection pattern 70C is connected to the capacitor pattern 70B.

The inductor pattern 64 and the inductor pattern 65 are disposed to be magnetically coupled. The second inductor unit 67_ad_ of the inductor pattern 69A and the second inductor unit 68Ad of the inductor pattern 70A are disposed to be magnetically coupled. The second inductor unit 67_ad_ of the inductor pattern 69A is arranged to be magnetically coupled to the inductor pattern 65. The second inductor unit 68Ad of the inductor pattern 70A is disposed to be magnetically coupled to the inductor pattern 64.

Figure 27:
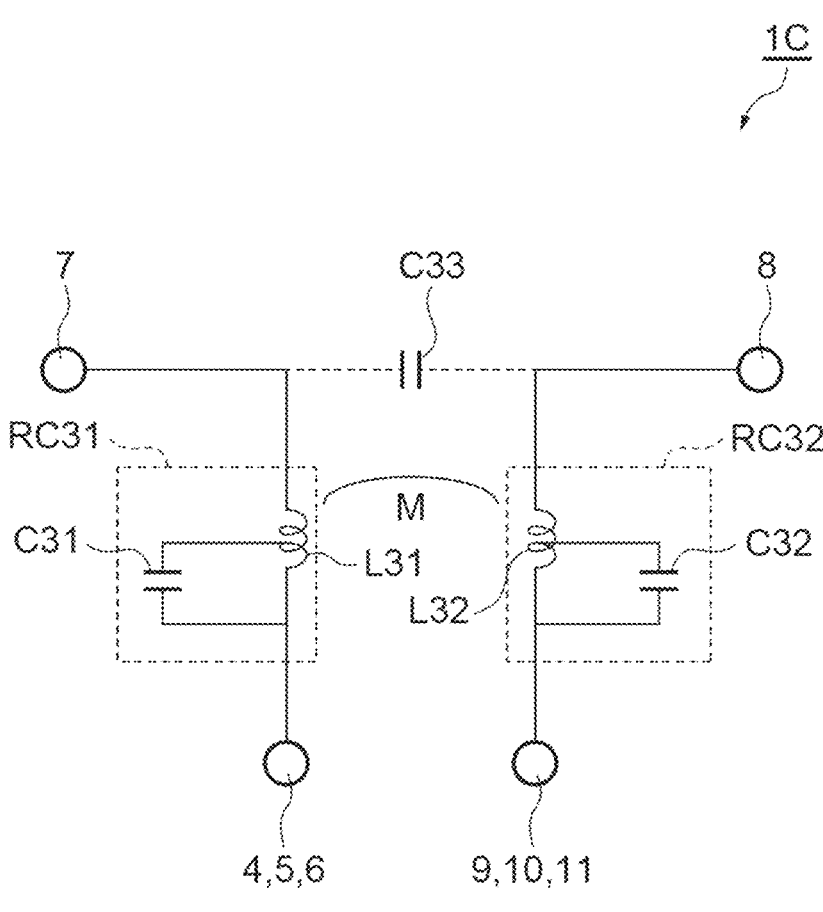
FIG. 27 is an equivalent circuit diagram of the electronic component illustrated in FIG. 22.

FIG. 27 is an equivalent circuit diagram of the electronic component 1C illustrated in FIG. 22. As illustrated in FIG. 27, the electronic component 1C includes a first inductor L31, a second inductor L32, a first capacitor C31, a second capacitor C32, and a third capacitor C33. The electronic component 1C constitutes a two-stage resonant band-pass filter circuit.

The first inductor L31 includes an inductor pattern 64 and an inductor pattern 69A. In the first inductor L31, an inductor configured by the inductor pattern 64 and the second inductor unit 67Ad of the inductor pattern 69A and an inductor configured by the first inductor unit 67Ac of the inductor pattern 69A are electrically connected in series. The second inductor L32 includes an inductor pattern 65 and an inductor pattern 70A. In the second inductor L32, an inductor configured by the inductor pattern 65 and the second inductor unit 68Ad of the inductor pattern 70A and an inductor configured by the first inductor unit 68Ac of the inductor pattern 70A are electrically connected in series.

The first capacitor C31 includes a capacitor pattern 66, a capacitor pattern 22, and a capacitor pattern 69B. The second capacitor C32 includes a capacitor pattern 67, a capacitor pattern 23, and a capacitor pattern 70B. The third capacitor C3 includes a capacitor pattern 68, a capacitor pattern 24, and a capacitor pattern 69C.

The first inductor L31 and the first capacitor C31 constitute a first LC resonator (first resonance circuit) RC31. The second inductor L32 and the second capacitor C32 constitute a second LC resonator (second resonance circuit) RC32. The first inductor L31 and the second inductor L32 are magnetically coupled.

Figure 28:
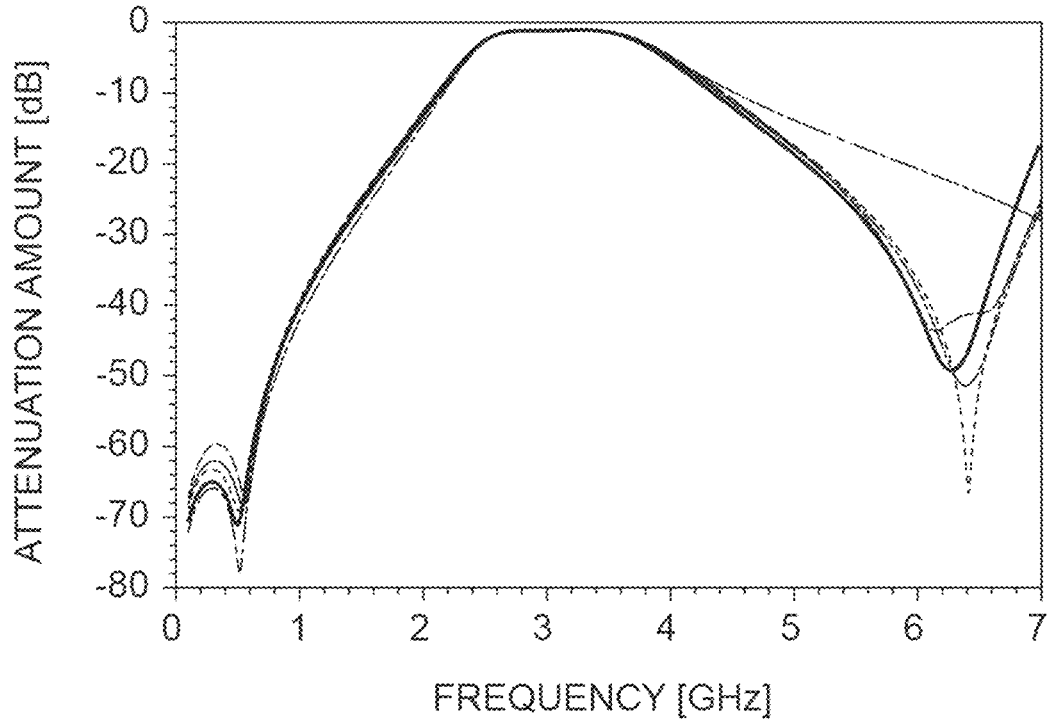
FIG. 28 is a diagram illustrating filter characteristics of the electronic component.
Figure 29:
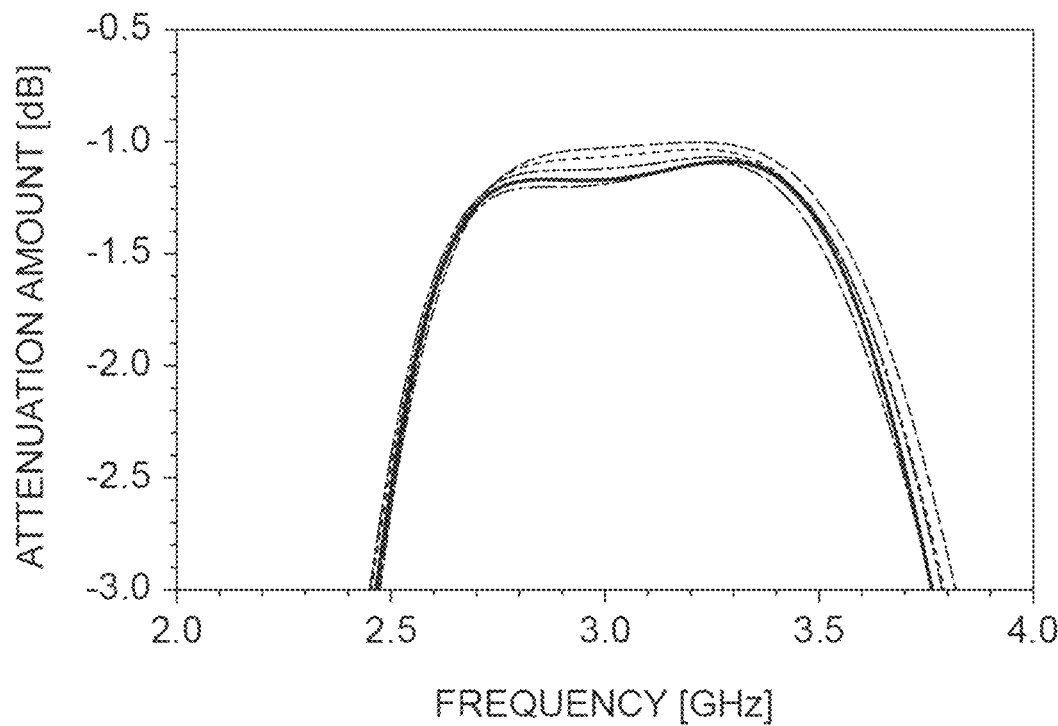
FIG. 29 is an enlarged view illustrating a part of the filter characteristics illustrated in FIG. 28.

FIG. 28 is a diagram illustrating filter characteristics of the electronic component. FIG. 29 is an enlarged view illustrating a part of the filter characteristics illustrated in FIG. 28. FIGS. 28 and 29 illustrate filter characteristics (frequency characteristics of an attenuation amount) when a signal is input from the fourth terminal electrode 7 and a signal is output from the fifth terminal electrode 8. In other words, FIGS. 28 and 29 illustrate the frequency characteristics of the transmission coefficient from the fourth terminal electrode 7 to the fifth terminal electrode 8. In FIGS. 28 and 29, the horizontal axis represents the frequency [GHz], and the vertical axis represents the attenuation amount [dB]. In FIGS. 28 and 29, the characteristic of the electronic component 1 is indicated by a solid line (thick line), the characteristic of the electronic component 1A is indicated by a solid line (thin line), the characteristic of the electronic component 1B is indicated by a broken line (broken line with a small interval), the characteristic of the electronic component 1C is indicated by a broken line (broken line with a large interval), and the characteristic of the electronic component according to the comparative example is indicated by a one-dotted chain line. The electronic component according to the comparative example does not include the third inductor and the fourth inductor. That is, the electronic component according to the comparative example includes only the first inductor and the second inductor. Note that the characteristic diagrams illustrated in FIGS. 28 and 29 indicate results obtained by simulation.

As illustrated in FIGS. 28 and 29, in the electronic components 1, 1A, 1B, and 1C, attenuation in a high frequency band (for example, 5 GHz or more, in the case of the characteristic illustrated in FIG. 28) is improved as compared with the electronic component according to the comparative example. As illustrated in FIG. 28, in the electronic components 1, 1A, 1B, and 1C, the attenuation amount in the high frequency band is increased (the absolute value of the attenuation amount increases in the case of the characteristics illustrated in FIG. 28) as compared with the electronic component according to the comparative example. In the example illustrated in FIG. 28, the electronic component 1B obtains the most attenuation in the high frequency band, and then the electronic component 1A, the electronic component 1, and the electronic component 1C obtain attenuation in this order. In the electronic component 1B, the degree of magnetic coupling of the inductor is the highest, and then the degree of magnetic coupling of the inductor is higher in the order of the electronic component 1A, the electronic component 1, and the electronic component 1C. That is, in the configuration in which the degree of magnetic coupling is higher (the configuration in which the distance between the inductor patterns is shorter), more attenuation in the high frequency band is obtained.

In addition, as illustrated in FIG. 29, loss characteristics of the electronic components 1, 1A, 1B, and 1C in a specific frequency band can be improved as compared with the electronic component of the comparative example. In the case of the characteristics illustrated in FIG. 29, in a specific frequency band (for example, about 2.5 GHz to 4 GHz), the absolute value of the attenuation amount of the electronic components 1, 1A, 1B, and 1C is reduced as compared with the absolute value of the attenuation amount of the electronic component of the comparative example. That is, the electronic components 1, 1A, 1B, and 1C can improve insertion loss in the pass band of the filter.

As described above, in the electronic component 1C according to the present embodiment, in the first LC resonator RC31, two inductors are electrically connected in series in the first inductor L31. In the second LC resonator RC32, two inductors are electrically connected in series in the second inductor L32. Arrangement is made to be magnetically coupled to the first inductor L31 and the second inductor L2. As a result, in the electronic component 1C, the attenuation amount in the high frequency band can be increased. Therefore, in the electronic component 1C, frequency characteristics can be improved. For example, superior characteristics in a high frequency band can be obtained.

In the electronic component 1C according to the present embodiment, the first inductor unit 67Ac and the second inductor unit 67Ad are articulated in the inductor pattern 69A. That is, the first inductor unit 67Ac and the second inductor unit 67Ad are integrated. In addition, the first inductor unit 68Ac and the second inductor unit 68Ad are articulated in the inductor pattern 70A. That is, the first inductor unit 68Ac and the second inductor unit 68Ad are integrated. Therefore, in the electronic component 1C, the diameters of the inductor patterns 69A and 68A can be increased as compared with the case where the first inductor units 67Ac and 68Ac and the second inductor units 67Ad and 68Ad are provided separately. Therefore, in the electronic component 1C, the characteristics of the inductor can be adjusted, such as improvement of the Q factor in the inductor.

In the electronic component 1C according to the present embodiment, the capacitor pattern 69B is connected to a portion where the first inductor unit 67Ac and the second inductor unit 67Ad are articulated. The capacitor pattern 70B is connected to a portion where the first inductor unit 68Ac and the second inductor unit 68Ad are articulated. As a result, in the electronic component 1, the attenuation amount in the high frequency band can be adjusted by adjusting the connection positions of the capacitor patterns 70B and 68B with respect to the inductor patterns 69A and 68A. Therefore, in the electronic component 1C, it is possible to adjust frequency characteristics such as adjusting attenuation amount in a high frequency band.

Fifth Embodiment

Figure 30:
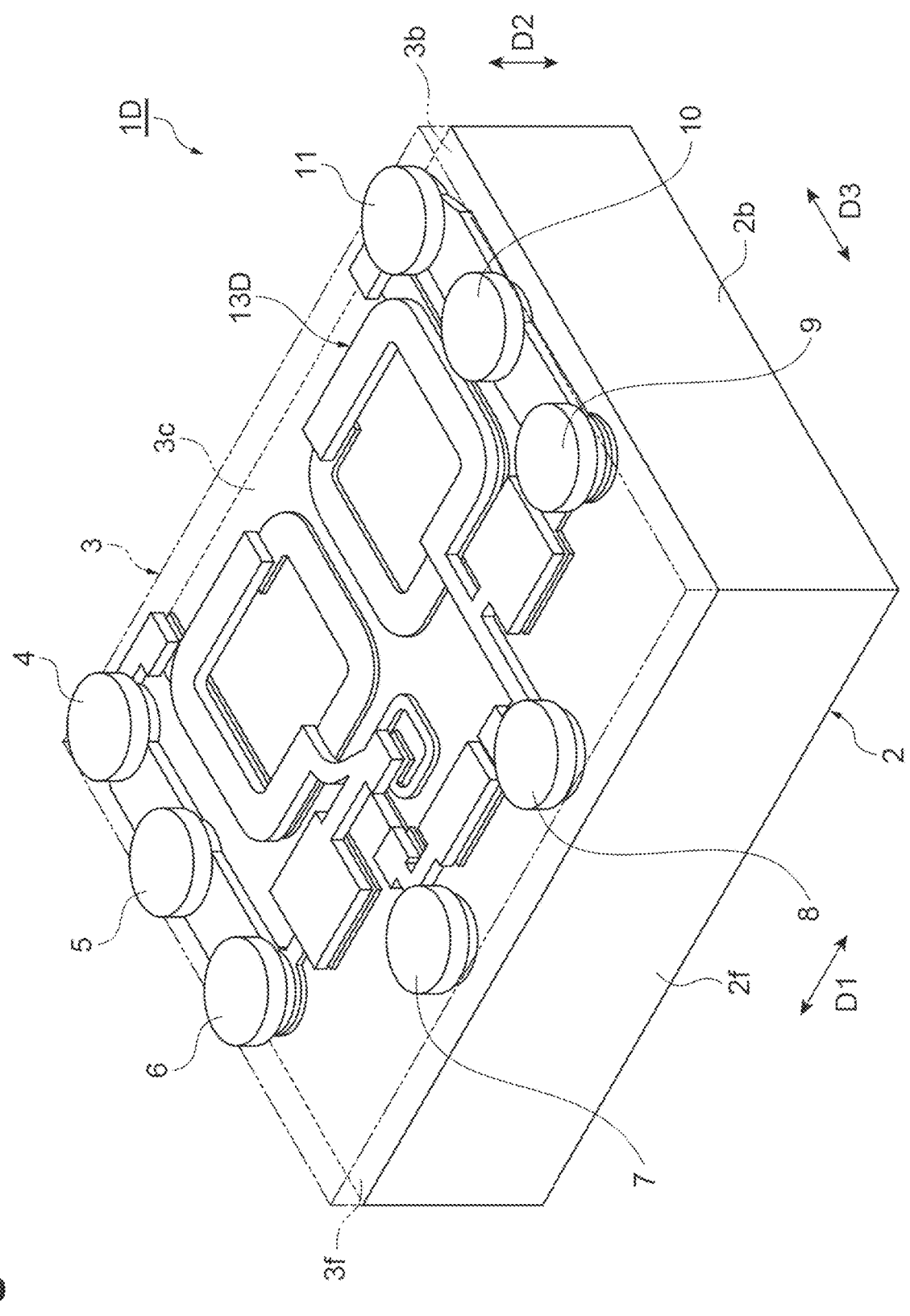
FIG. 30 is a perspective view of an electronic component according to a fifth embodiment.
Figure 31:
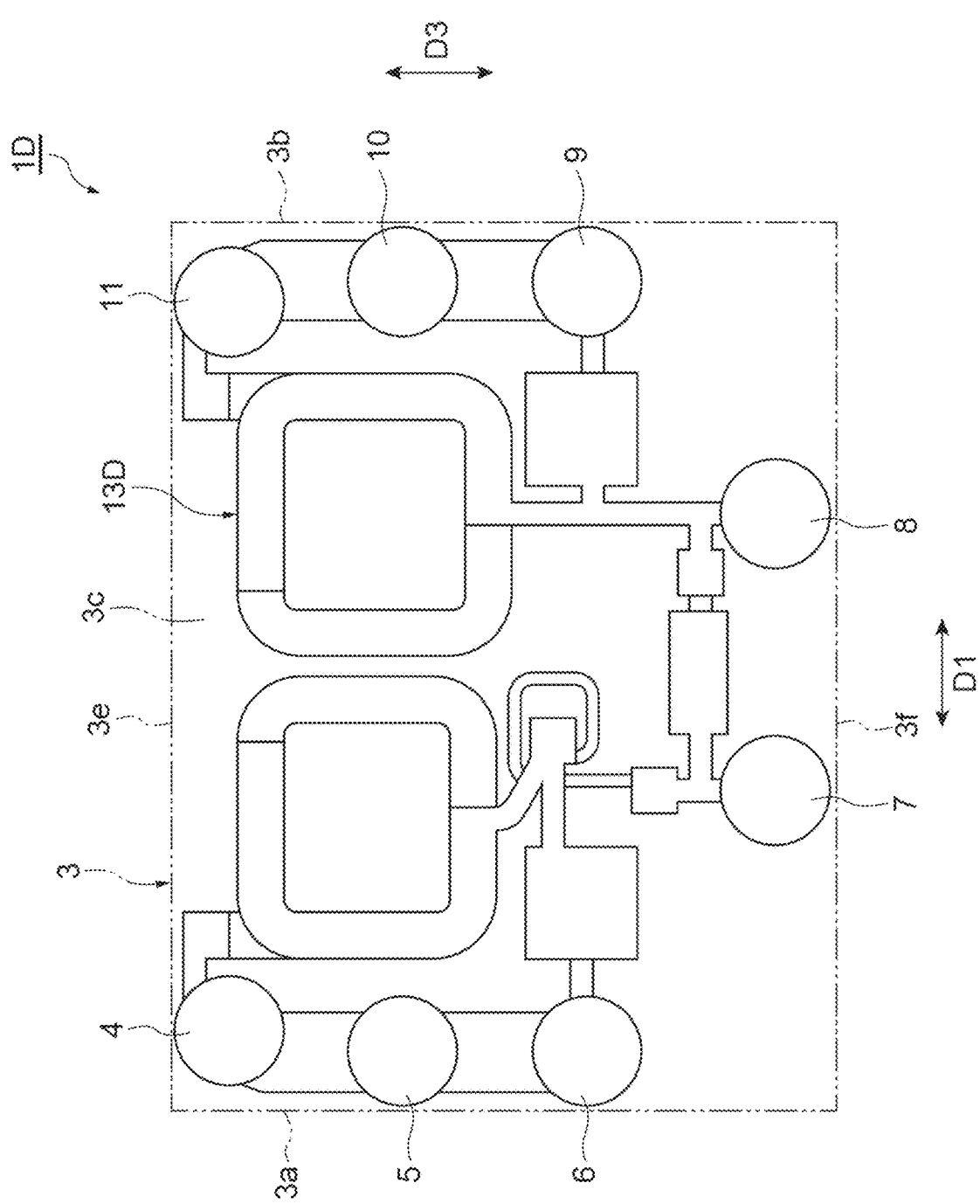
FIG. 31 is a view of the electronic component illustrated in FIG. 30 as viewed from an insulator side.
Figure 32:
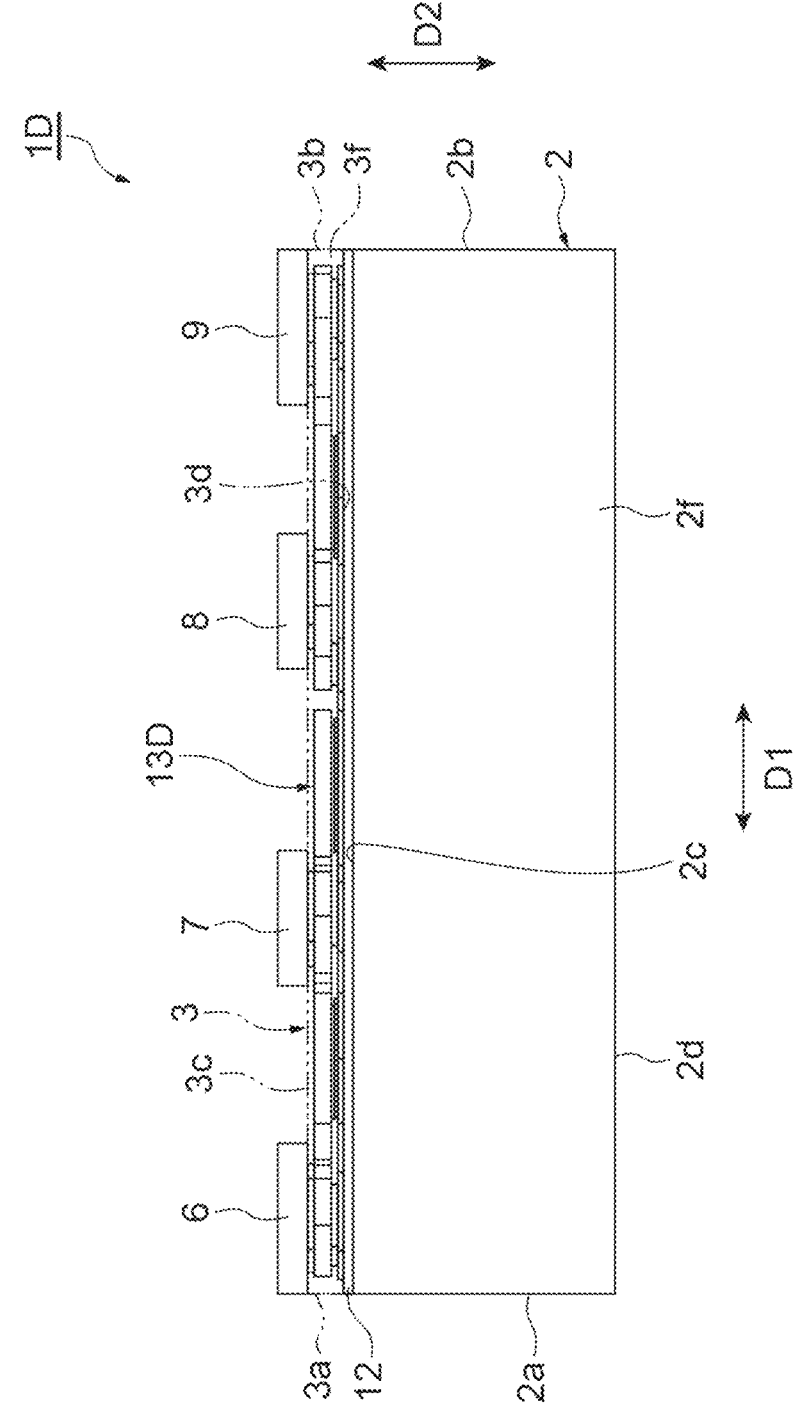
FIG. 32 is a side view of the electronic component illustrated in FIG. 30.
Figure 33:
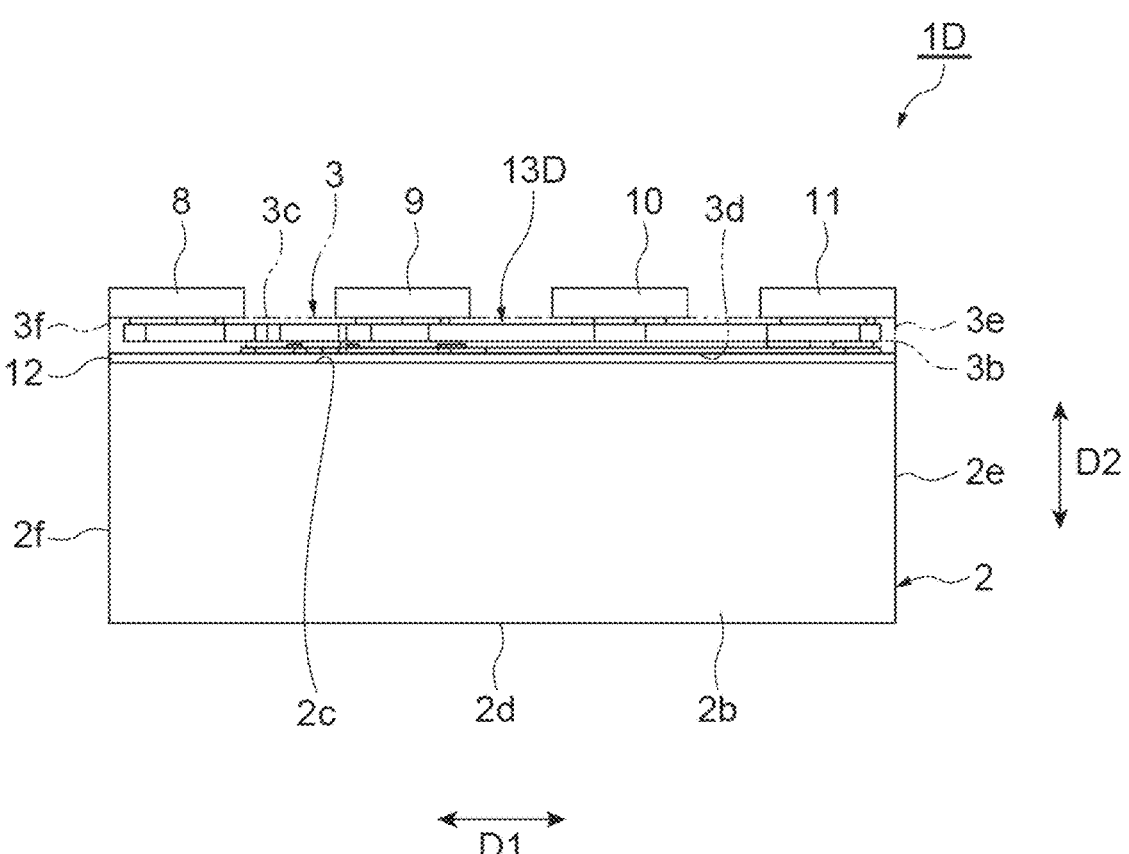
FIG. 33 is an end view of the electronic component illustrated in FIG. 30.

Next, a fifth embodiment will be described. FIG. 30 is a perspective view of an electronic component according to the fifth embodiment. FIG. 31 is a view of the electronic component illustrated in FIG. 30 as viewed from an insulator side. FIG. 32 is a side view of the electronic component illustrated in FIG. 30. FIG. 33 is an end view of the electronic component illustrated in FIG. 30.

As illustrated in FIGS. 30 to 33, an electronic component 1D includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

Figure 34:
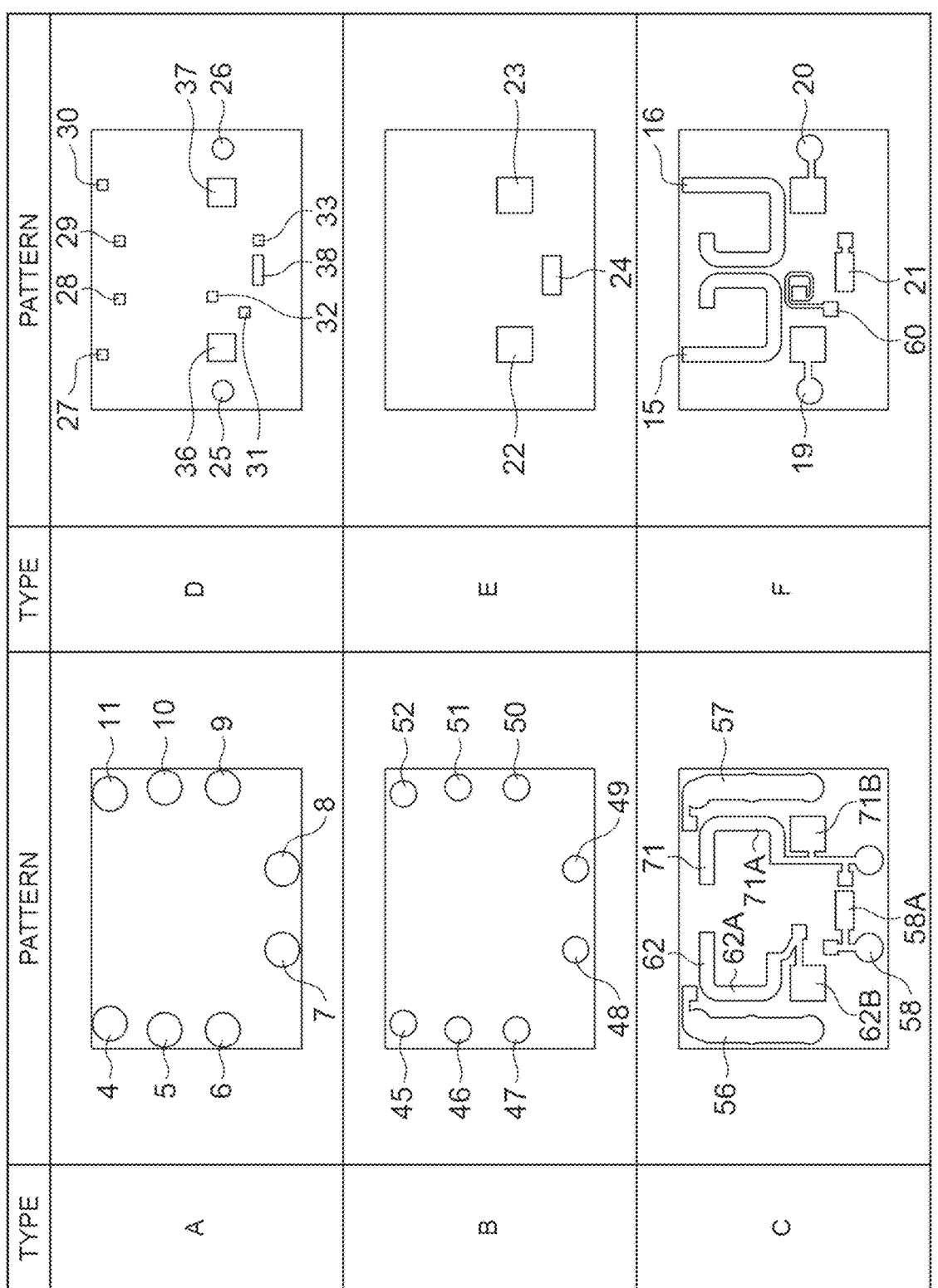
FIG. 34 is a view illustrating a conductor pattern constituting an LC filter unit included in the electronic component illustrated in FIG. 30.

In the electronic component 1D, an LC filter unit 13D is disposed in the insulator 3. FIG. 34 is a view illustrating a conductor pattern constituting the LC filter unit 13D included in the electronic component 1D illustrated in FIG. 30. In the electronic component 1D, the conductor patterns are arranged in the order shown in a layer F, a layer E, a layer D, a layer C, a layer B, and a layer A in FIG. 34 from the substrate 2 side (the side of the main surface 3d of the insulator 3). The conductor pattern may include an inductor pattern, a capacitor pattern, and a via pattern. The conductor pattern can be formed of, for example, copper.

As illustrated in the layer F of FIG. 34, the LC filter unit 13D includes an inductor pattern 15, an inductor pattern 16, a capacitor pattern 19, a capacitor pattern 20, a capacitor pattern 21, and an inductor pattern 60. The inductor pattern 15, the inductor pattern 16, the capacitor pattern 19, the capacitor pattern 20, the capacitor pattern 21, and the inductor pattern 60 are disposed on a planarization layer 12 (FIGS. 32 and 33).

As illustrated in the layer E in FIG. 34, the LC filter unit 13D includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 34, the LC filter unit 13D includes a via pattern 25, a via pattern 26, a via pattern 27, a via pattern 28, a via pattern 29, a via pattern 30, a via pattern 31, a via pattern 32, a via pattern 33, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 31, the via pattern 32, the via pattern 33, the via pattern 36, the via pattern 37, and the via pattern 38 has, for example, a rectangular shape.

As illustrated in the layer C of FIG. 34, the LC filter unit 13D includes a conductor pattern 56, a conductor pattern 57, a conductor pattern 58, a conductor pattern 62, and a conductor pattern 71. The conductor pattern 71 includes an inductor pattern 71A and a capacitor pattern 71B.

As illustrated in the layer B of FIG. 34, the LC filter unit 13D includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 34, the electronic component 1D includes the first terminal electrode 4, the second terminal electrode 5, the third terminal electrode 6, and the fourth terminal electrode 7, the fifth terminal electrode 8, the sixth terminal electrode 9, the seventh terminal electrode 10, and the eighth terminal electrode 11.

As illustrated in the layer D of FIG. 34, the via pattern 25 connects the capacitor pattern 19 and the conductor pattern 56. The via pattern 26 connects the capacitor pattern 20 and the conductor pattern 57. The via pattern 27 connects the inductor pattern 15 and the conductor pattern 56. The via pattern 28 connects the inductor pattern 15 and the inductor pattern 62A. The via pattern 29 connects the inductor pattern 16 and the inductor pattern 71A. The via pattern 30 connects the inductor pattern 16 and the conductor pattern 57.

The via pattern 31 connects the inductor pattern 60 and the conductor pattern 58. The via pattern 32 connects the inductor pattern 60 and the conductor pattern 62. The via pattern 33 connects the capacitor pattern 21 and the conductor pattern 71. The via pattern 36 connects the capacitor pattern 22 and the capacitor pattern 62B. The via pattern 37 connects the capacitor pattern 23 and a capacitor pattern 71B. The via pattern 38 connects the capacitor pattern 24 and the capacitor pattern 58A.

As illustrated in the layer B of FIG. 34, the via pattern 45 connects the conductor pattern 56 and the first terminal electrode 4. The via pattern 46 connects the conductor pattern 56 and the second terminal electrode 5. The via pattern 47 connects the conductor pattern 56 and the third terminal electrode 6. The via pattern 48 connects the conductor pattern 58 and the fourth terminal electrode 7. The via pattern 49 connects the conductor pattern 71 and the fifth terminal electrode 8. The via pattern 50 connects the conductor pattern 57 and the sixth terminal electrode 9. The via pattern 51 connects the conductor pattern 57 and the seventh terminal electrode 10. The via pattern 52 connects the conductor pattern 57 and the eighth terminal electrode 11.

A dielectric layer (not illustrated) is disposed between the capacitor pattern 19 and the capacitor pattern 22. A dielectric layer (not illustrated) is disposed between the capacitor pattern 20 and the capacitor pattern 23. A dielectric layer (not illustrated) is disposed between the capacitor pattern 21 and the capacitor pattern 24. The dielectric layer may be formed of, for example, an inorganic insulating material made of a paraelectric material such as silicon nitride or silicon oxide, a ferroelectric material, or the like.

Figure 35:
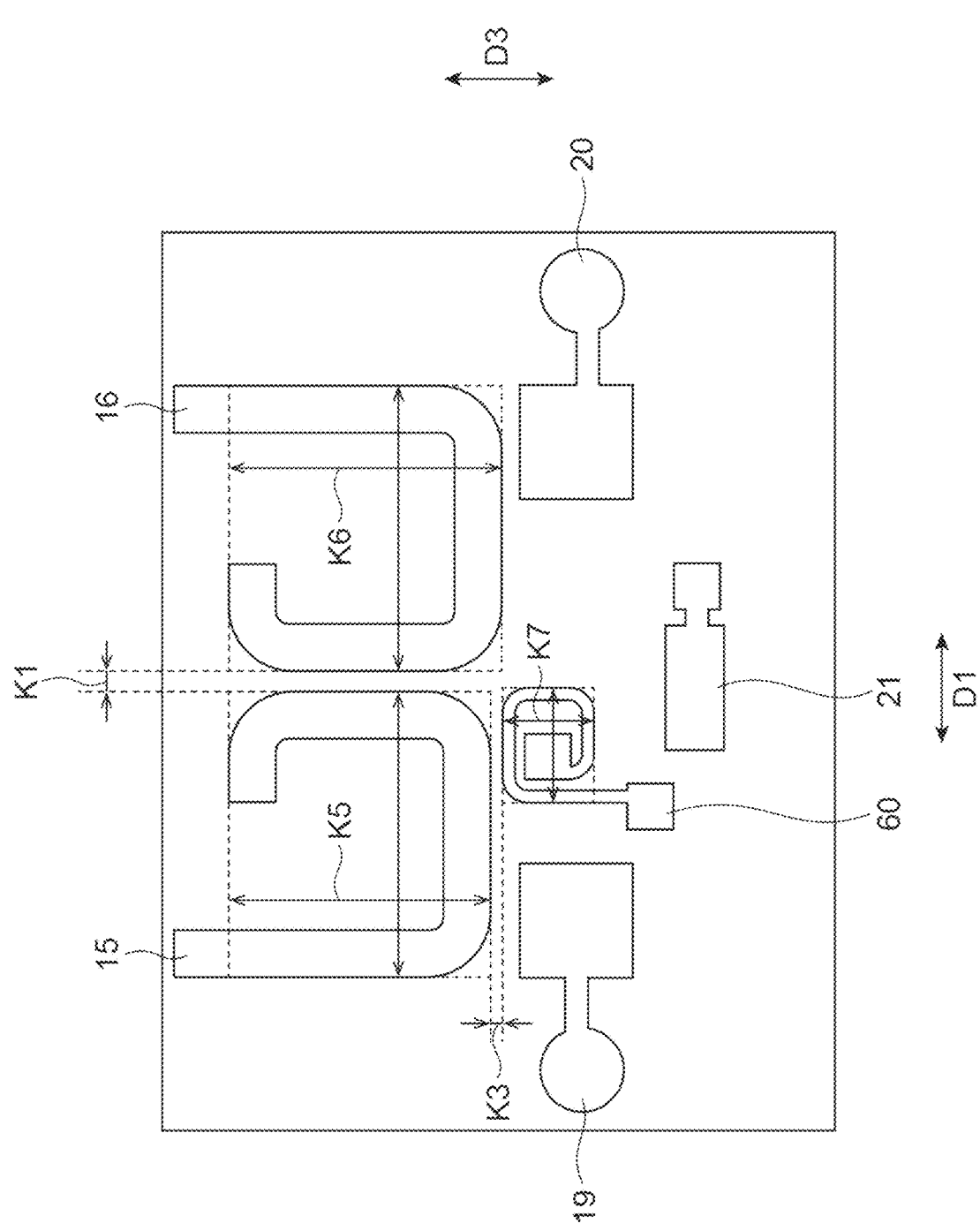
FIG. 35 is a views illustrating a conductor pattern.

As illustrated in FIG. 35, the inductor pattern 15 and the inductor pattern 16 are arranged side by side in the first direction D1 in plan view. In the present embodiment, the shapes of the inductor pattern 15 and the inductor pattern 16 have line symmetry with a line along the third direction D3 as an axis. The inductor pattern 15 and the inductor pattern 60 are arranged side by side in the third direction D3 in plan view.

In the present embodiment, a distance K1 between the inductor pattern 15 and the inductor pattern 16 in the first direction D1 is equal to a distance K3 between the inductor pattern 15 and the inductor pattern 60 in the third direction D3 (distance K1=distance K3).

The distance K1 and the distance K3 are shorter than the radii of the inductor pattern 15 and the inductor pattern 16. In the present embodiment, the radius of the inductor pattern 15 can be defined by a length (K5/2) that is half the length K5 of the short side of a rectangular virtual line (indicated by a broken line in FIG. 35) that includes (envelops) the region of the inductor pattern 15 (a portion forming a coil in the inductor pattern 15, as a specific example of the present embodiment). Similarly, the radius of the inductor pattern 16 can be defined by a length (K6/2) that is half the length K6 of the short side of the rectangular virtual line including the region of the inductor pattern 16. For example, the inductor pattern 15 and the inductor pattern 16 may be formed such that radii thereof are equal (or substantially equal) to each other.

The distance K1 and the distance K3 are shorter than the radius of the inductor pattern 60. In the present embodiment, the radius of the inductor pattern 60 can be defined by a length (K7/2) that is half the length K7 of the short side of the rectangular virtual line including the inductor pattern 60.

The radius of the inductor pattern 15 may be equal to or larger than the radius of the inductor pattern 60. The radius of the inductor pattern 16 may be equal to or larger than the radius of the inductor pattern 60.

The inductor pattern 15 and the inductor pattern 16 are disposed to be magnetically coupled. The inductor pattern 60 is disposed to be magnetically coupled to the inductor pattern 16.

Figure 36:
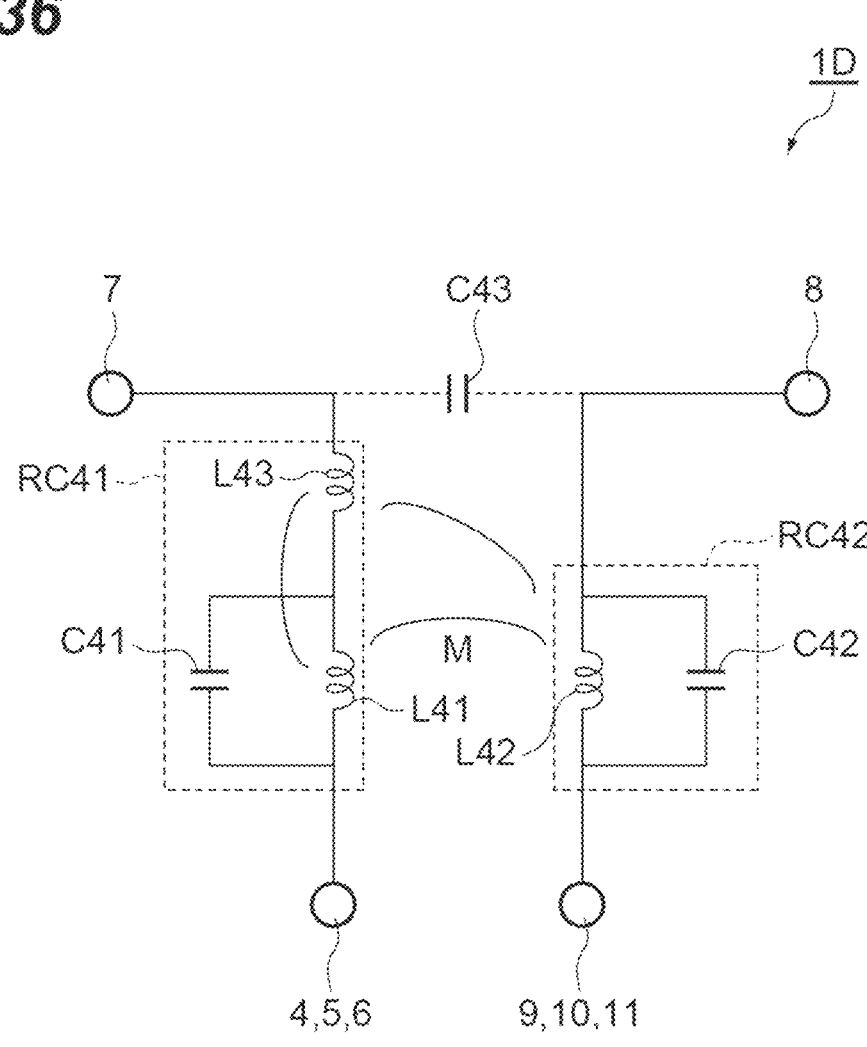
FIG. 36 is an equivalent circuit diagram of the electronic component illustrated in FIG. 30.

FIG. 36 is an equivalent circuit diagram of the electronic component 1D illustrated in FIG. 30. As illustrated in FIG. 36, the electronic component 1D includes a first inductor L41, a second inductor L42, a third inductor L43, a first capacitor C41, a second capacitor C42, and a third capacitor C43. The electronic component 1D constitutes a two-stage resonant band-pass filter circuit.

The first inductor L41 includes an inductor pattern 15 and an inductor pattern 62A. The second inductor L42 includes an inductor pattern 16 and an inductor pattern 71A. The third inductor L23 includes an inductor pattern 60.

The first capacitor C21 includes a capacitor pattern 19, a capacitor pattern 22, and a capacitor pattern 62B. The second capacitor C22 includes a capacitor pattern 20, a capacitor pattern 23, and a capacitor pattern 71B. The third capacitor C23 includes a capacitor pattern 21, a capacitor pattern 24, and a capacitor pattern 58A.

The first inductor L41, the third inductor L43, and the first capacitor C41 constitute a first LC resonator (first resonance circuit) RC41. The first inductor L41 and the third inductor L43 are electrically connected in series. The second inductor L42 and the second capacitor C42 constitute a second LC resonator (second resonance circuit) RC42. The first inductor L41 and the second inductor L42 are magnetically coupled. The third inductor L43 and the second inductor L42 are magnetically coupled.

Figure 37:
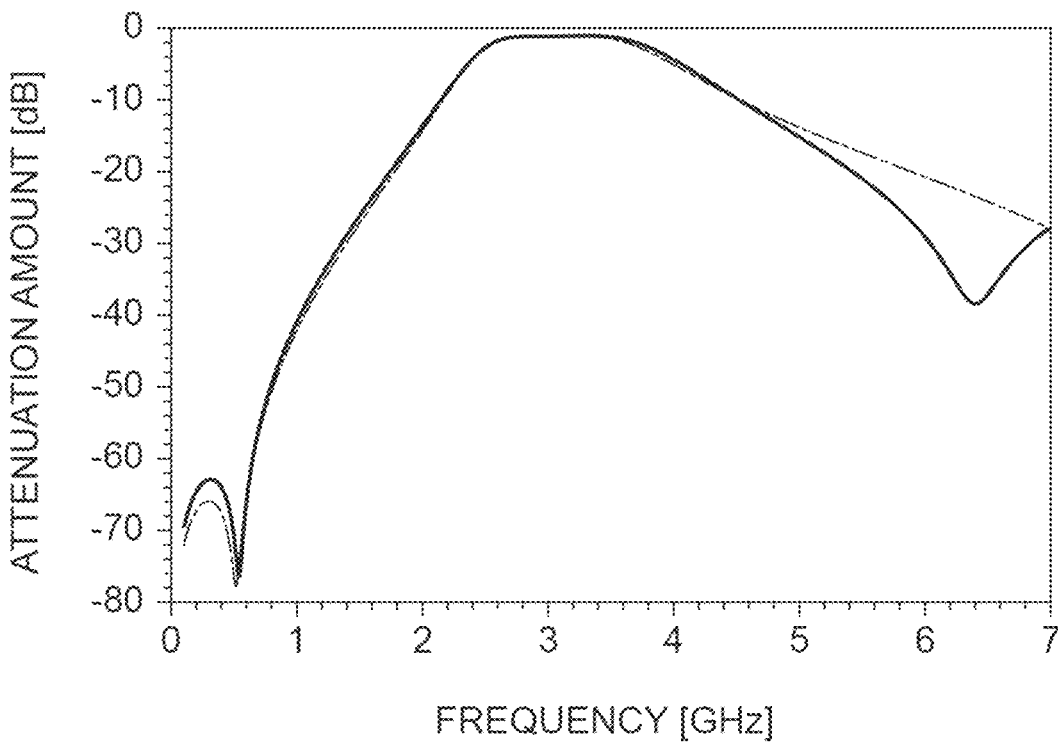
FIG. 37 is a diagram illustrating the filter characteristics of the electronic component.
Figure 38:
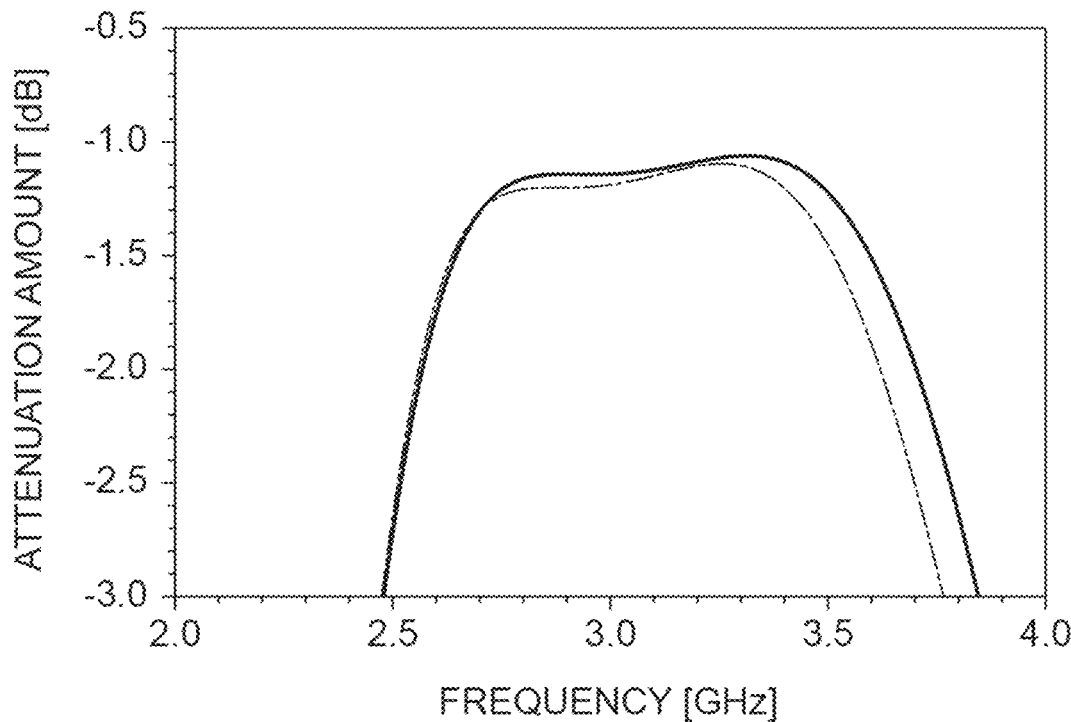
FIG. 38 is an enlarged view illustrating a part of the filter characteristics illustrated in FIG. 37.

FIG. 37 is a diagram illustrating filter characteristics of the electronic component. FIG. 38 is an enlarged view illustrating a part of the filter characteristics illustrated in FIG. 37. FIGS. 37 and 38 illustrate filter characteristics (frequency characteristics of an attenuation amount) when a signal is input from the fourth terminal electrode 7 and a signal is output from the fifth terminal electrode 8. In other words, FIGS. 37 and 38 illustrate the frequency characteristics of the transmission coefficient from the fourth terminal electrode 7 to the fifth terminal electrode 8. In FIGS. 37 and 38, the horizontal axis represents the frequency [GHz], and the vertical axis represents the attenuation amount [dB]. In FIGS. 37 and 38, the characteristic of the electronic component 1D is indicated by a solid line, and the characteristic of the electronic component according to the comparative example is indicated by a one-dotted chain line. The electronic component according to the comparative example does not include the third inductor. That is, the electronic component according to the comparative example includes only the first inductor and the second inductor. Note that the characteristic diagrams illustrated in FIGS. 37 and 38 indicate results obtained by simulation.

As illustrated in FIGS. 37 and 38, in the electronic component 1D, attenuation in a high frequency band (for example, 5 GHz or more, in the case of the characteristic illustrated in FIG. 37) is improved as compared with the electronic component according to the comparative example. As illustrated in FIG. 37, in the electronic component 1D, the attenuation amount in the high frequency band is increased (the absolute value of the attenuation amount increases in the case of the characteristics illustrated in FIG. 37) as compared with the electronic component according to the comparative example.

In addition, as illustrated in FIG. 38, loss characteristics of the electronic component 1D in a specific frequency band can be improved as compared with the electronic component of the comparative example. In the case of the characteristics illustrated in FIG. 38, in a specific frequency band (for example, about 2.5 GHz to 4 GHz), the absolute value of the attenuation amount of the electronic component 1D is reduced as compared with the absolute value of the attenu-ation amount of the electronic component of the comparative example. That is, the electronic component 1D can improve the insertion loss in the pass band of the filter.

As described above, in the electronic component 1D according to the present embodiment, the first LC resonator RC41 includes the third inductor L43 electrically connected in series with the first inductor L41. The third inductor L43 is disposed to be magnetically coupled to the second inductor L42. As described above, in the electronic component 1D, the third inductor L43 is disposed so that the third inductor L43 and the second inductor L42 of the first LC resonator RC41 are magnetically coupled to each other, thereby the attenuation amount in the high frequency band can be increased (improved). Therefore, in the electronic component 1D, frequency characteristics can be improved. For example, superior characteristics in a high frequency band can be obtained.

Sixth Embodiment

Figure 39:
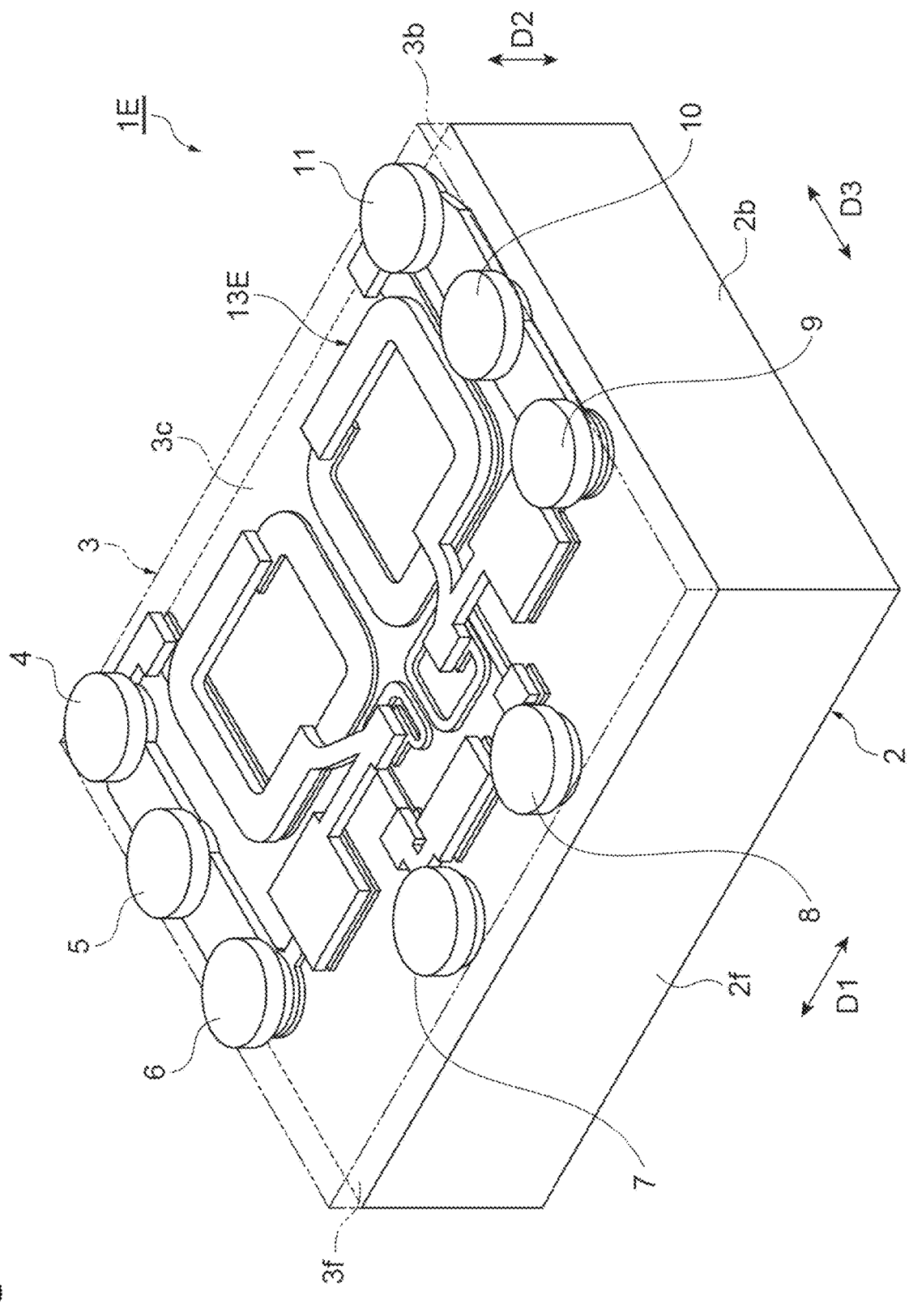
FIG. 39 is a perspective view of an electronic component according to a sixth embodiment.
Figure 40:
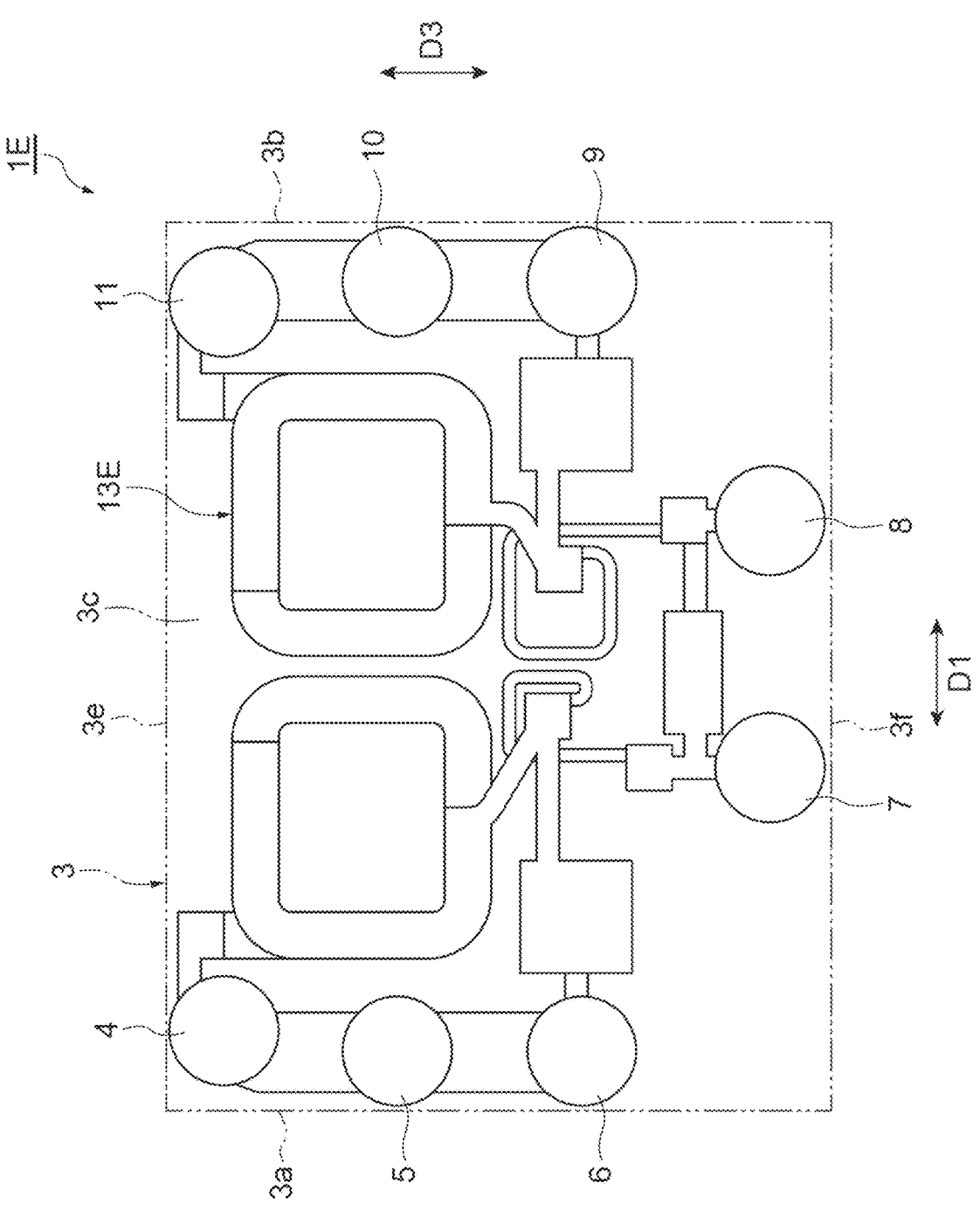
FIG. 40 is a view of the electronic component illustrated in FIG. 39 as viewed from an insulator side.
Figure 41:
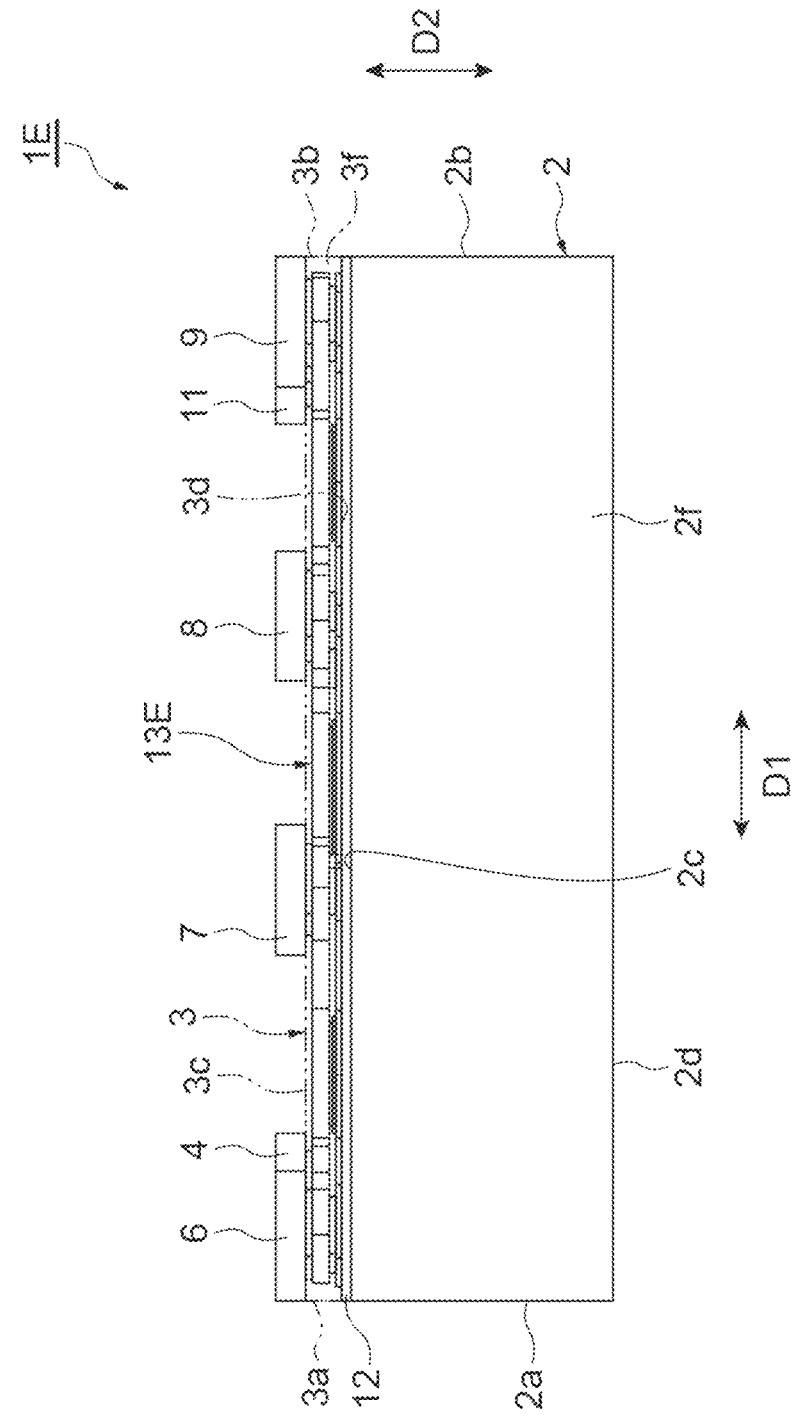
FIG. 41 is a side view of the electronic component illustrated in FIG. 39.
Figure 42:
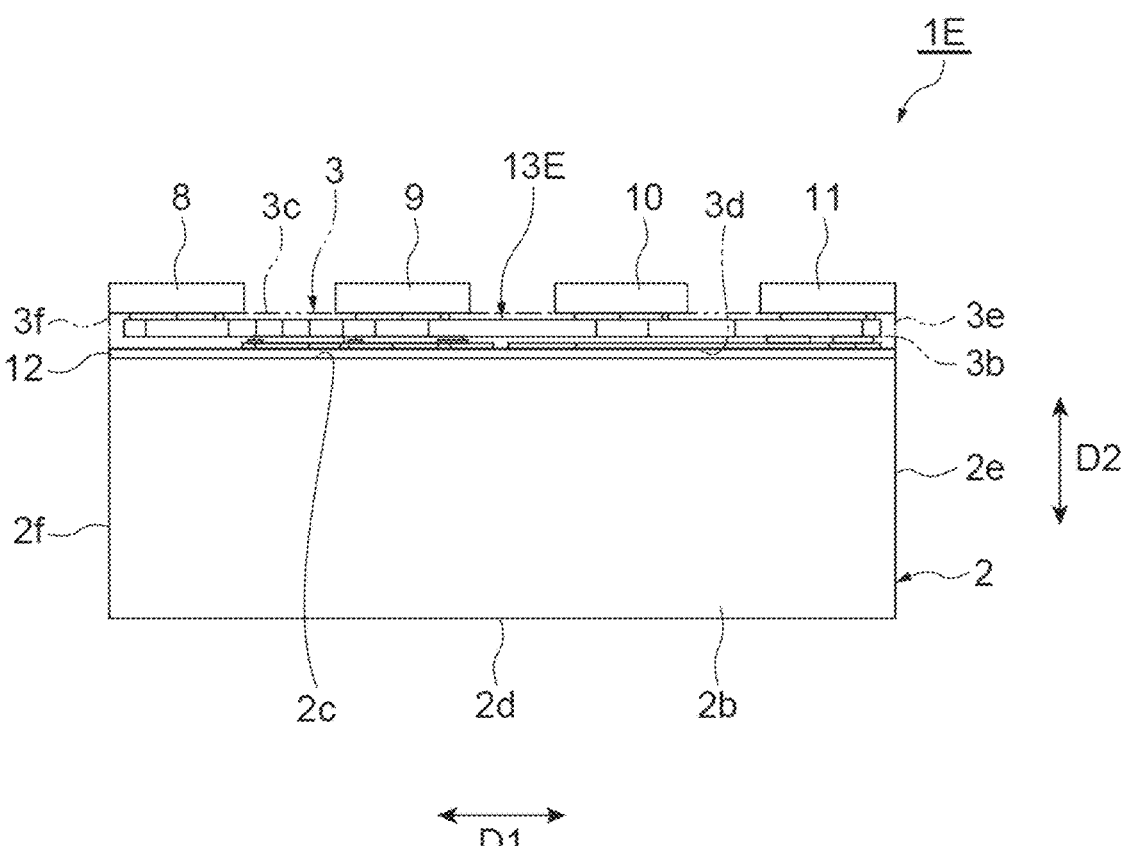
FIG. 42 is an end view of the electronic component illustrated in FIG. 39.

Next, a sixth embodiment will be described. FIG. 39 is a perspective view of an electronic component according to the sixth embodiment. FIG. 40 is a view of the electronic component illustrated in FIG. 39 as viewed from an insulator side. FIG. 41 is a side view of the electronic component illustrated in FIG. 39. FIG. 42 is an end view of the electronic component illustrated in FIG. 39.

As illustrated in FIGS. 39 to 42, an electronic component 1E includes a substrate 2, an insulator 3, and a first terminal electrode 4, a second terminal electrode 5, a third terminal electrode 6, a fourth terminal electrode 7, a fifth terminal electrode 8, a sixth terminal electrode 9, a seventh terminal electrode 10, and an eighth terminal electrode 11 disposed on the insulator 3.

Figure 43:
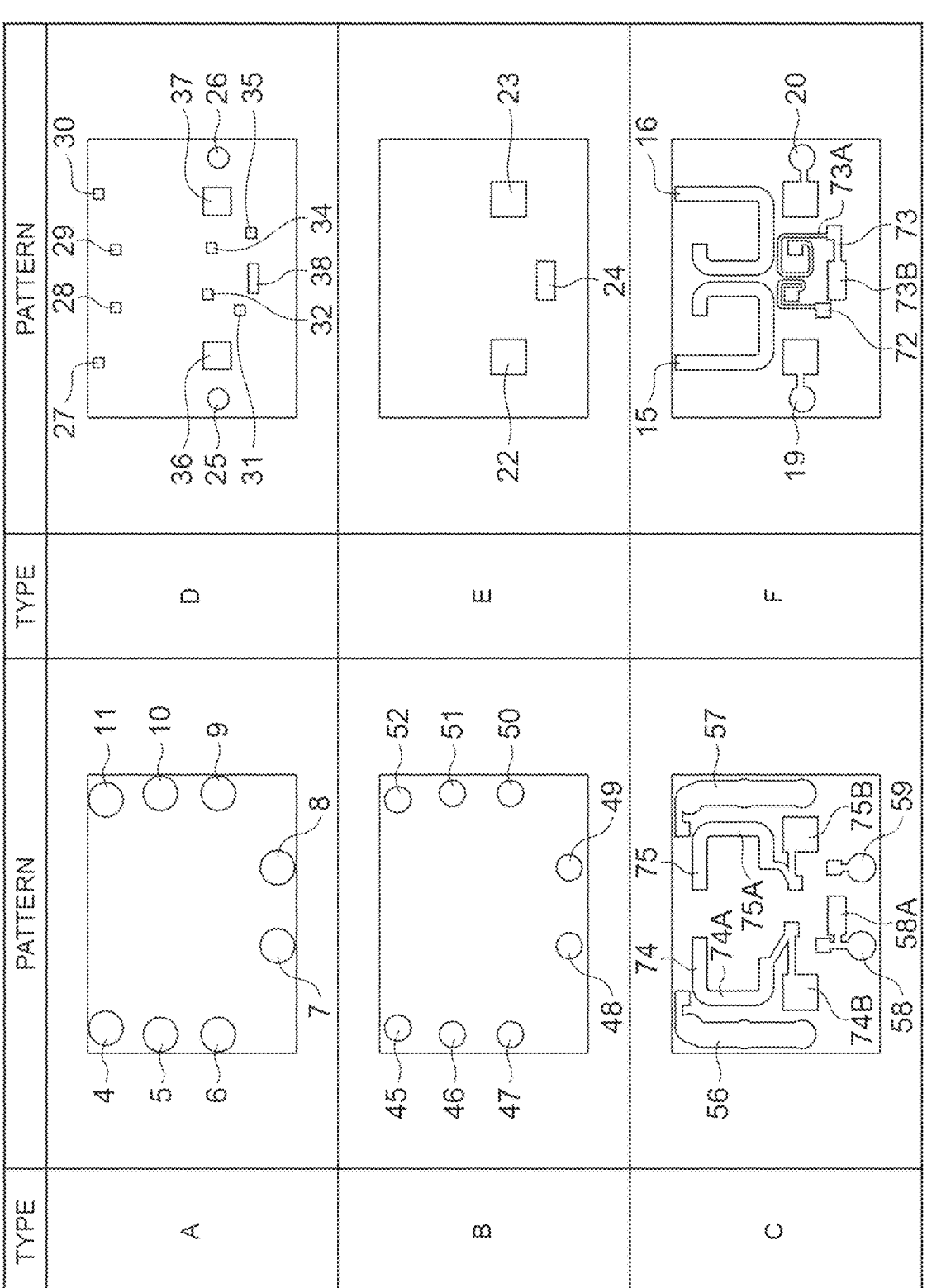
FIG. 43 is a view illustrating a conductor pattern constituting an LC filter unit included in the electronic component illustrated in FIG. 39.

In the electronic component 1E, an LC filter unit 13E is disposed in the insulator 3. FIG. 43 is a view illustrating a conductor pattern constituting the LC filter unit 13E included in the electronic component 1E illustrated in FIG. 39. In the electronic component 1E, the conductor patterns are disposed in the order shown in a layer F, a layer E, a layer D, a layer C, a layer B, and a layer A in FIG. 43 from the substrate 2 side (the side of the main surface 3d of the insulator 3). The conductor pattern may include an inductor pattern, a capacitor pattern, and a via pattern. The conductor pattern can be formed of, for example, copper. As illustrated in the layer F in FIG. 43, the LC filter unit 13E includes an inductor pattern 15, an inductor pattern 16, a capacitor pattern 19, a capacitor pattern 20, an inductor pattern (third inductor pattern) 72, and a conductor pattern 73. The induc-tor pattern 15, the inductor pattern 16, the capacitor pattern 19, the capacitor pattern 20, the inductor pattern 72, and the conductor pattern 73 are disposed on a planarization layer 12 (FIGS. 41 and 42). The conductor pattern 73 includes an inductor pattern (fourth inductor pattern) 73A and a capaci-tor pattern 73B.

As illustrated in the layer E in FIG. 43, the LC filter unit 13E includes a capacitor pattern 22, a capacitor pattern 23, and a capacitor pattern 24. Each of the capacitor pattern 22, the capacitor pattern 23, and the capacitor pattern 24 has, for example, a rectangular shape.

As illustrated in the layer D of FIG. 43, the LC filter unit 13E includes a via pattern 25, a via pattern 26, a via pattern 27, a via pattern 28, a via pattern 29, a via pattern 30, a via pattern 31, a via pattern 32, a via pattern 34, a via pattern 35, a via pattern 36, a via pattern 37, and a via pattern 38. In the present embodiment, each of the via pattern 25 and the via pattern 26 has, for example, a circular shape. In the present embodiment, each of the via pattern 27, the via pattern 28, the via pattern 29, the via pattern 30, the via pattern 31, the via pattern 32, the via pattern 34, the via pattern 35, the via pattern 36, the via pattern 37, and the via pattern 38 has, for example, a rectangular shape.

As illustrated in the layer C of FIG. 43, the LC filter unit 13E includes a conductor pattern 56, a conductor pattern 57, a conductor pattern 58, a conductor pattern 59, a conductor pattern 74, and a conductor pattern 75.

The conductor pattern 74 includes an inductor pattern 74A and a capacitor pattern 74B. The conductor pattern 75 includes an inductor pattern 75A and a capacitor pattern 75B.

As illustrated in the layer B of FIG. 43, the LC filter unit 13E includes a via pattern 45, a via pattern 46, a via pattern 47, a via pattern 48, a via pattern 49, a via pattern 50, a via pattern 51, and a via pattern 52. In the present embodiment, the via pattern 45, the via pattern 46, the via pattern 47, the via pattern 48, the via pattern 49, the via pattern 50, the via pattern 51, and the via pattern 52 have, for example, a circular shape.

As illustrated in the layer A of FIG. 43, the electronic component 1E includes the first terminal electrode 4, the second terminal electrode 5, the third terminal electrode 6, the fourth terminal electrode 7, the fifth terminal electrode 8, the sixth terminal electrode 9, the seventh terminal electrode 10, and the eighth terminal electrode 11.

As illustrated in the layer D of FIG. 43, the via pattern 25 connects the capacitor pattern 19 and the conductor pattern 56. The via pattern 26 connects the capacitor pattern 20 and the conductor pattern 57. The via pattern 27 connects the inductor pattern 15 and the conductor pattern 56. The via pattern 28 connects the inductor pattern 15 and the inductor pattern 74A. The via pattern 29 connects the inductor pattern 16 and the inductor pattern 75A. The via pattern 30 connects the inductor pattern 16 and the conductor pattern 57.

The via pattern 31 connects the inductor pattern 72 and the conductor pattern 58. The via pattern 32 connects the inductor pattern 72 and the conductor pattern 74. The via pattern 34 connects the inductor pattern 73A and the conductor pattern 75. The via pattern 35 connects the conductor pattern 73 and the conductor pattern 59.

The via pattern 36 connects the capacitor pattern 22 and a capacitor pattern 74B. The via pattern 37 connects the capacitor pattern 23 and a capacitor pattern 75B. The via pattern 38 connects the capacitor pattern 24 and the capacitor pattern 58A.

As illustrated in the layer B of FIG. 43, the via pattern 45 connects the conductor pattern 56 and the first terminal electrode 4. The via pattern 46 connects the conductor pattern 56 and the second terminal electrode 5. The via pattern 47 connects the conductor pattern 56 and the third terminal electrode 6. The via pattern 48 connects the conductor pattern 58 and the fourth terminal electrode 7. The via pattern 49 connects the conductor pattern 59 and the fifth terminal electrode 8. The via pattern 50 connects the conductor pattern 57 and the sixth terminal electrode 9. The via pattern 51 connects the conductor pattern 57 and the seventh terminal electrode 10. The via pattern 52 connects the conductor pattern 57 and the eighth terminal electrode 11.

A dielectric layer (not illustrated) is disposed between the capacitor pattern 19 and the capacitor pattern 22. A dielectric layer (not illustrated) is disposed between the capacitor pattern 20 and the capacitor pattern 23. A dielectric layer (not illustrated) is disposed between the capacitor pattern 73B and the capacitor pattern 24. The dielectric layer may be formed of, for example, an inorganic insulating material made of a paraelectric material such as silicon nitride or silicon oxide, a ferroelectric material, or the like.

Figure 44:
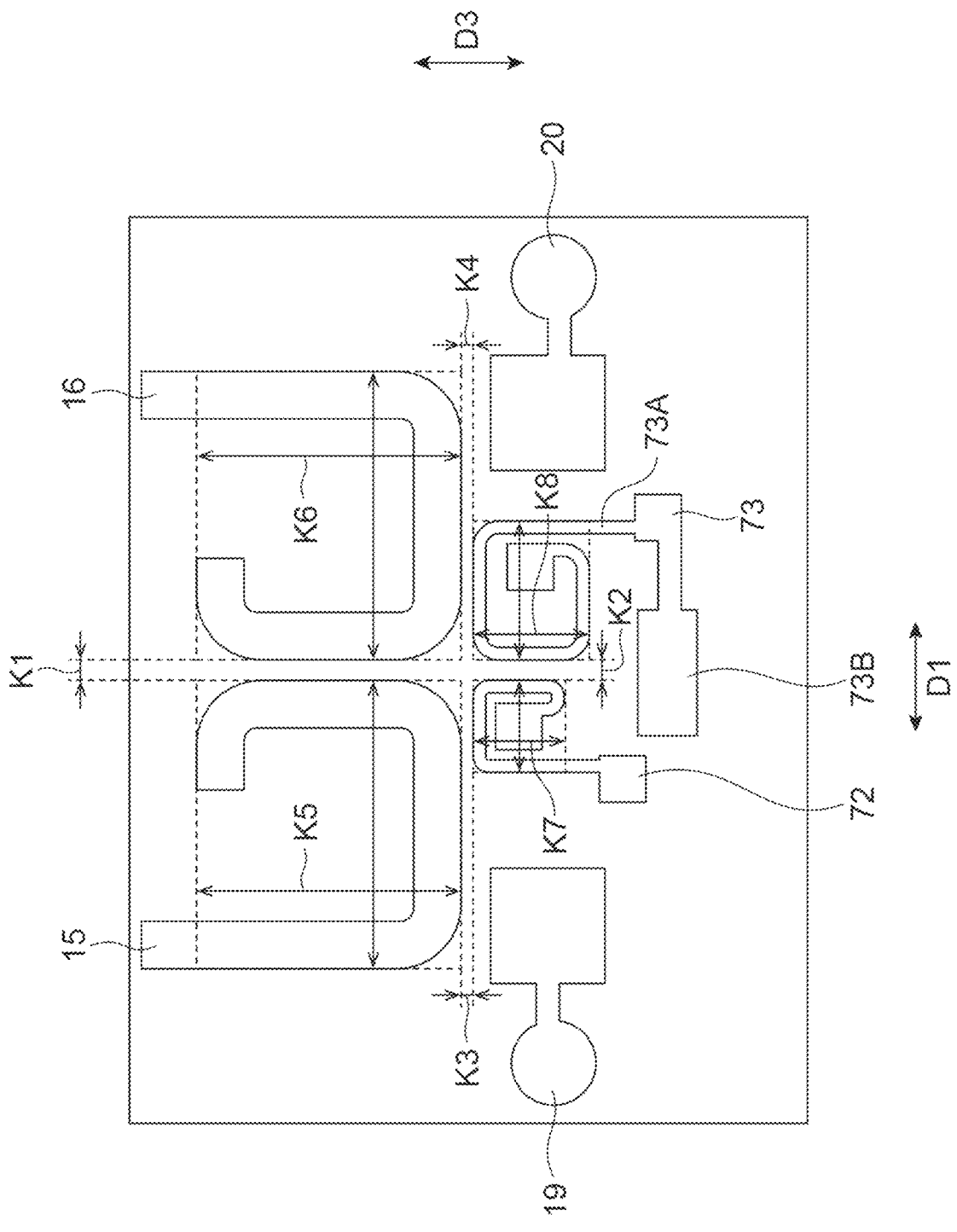
FIG. 44 is a views illustrating a conductor pattern.

As illustrated in FIG. 44, the inductor pattern 15 and the inductor pattern 16 are arranged side by side in the first direction D1 in plan view. In the present embodiment, the shapes of the inductor pattern 15 and the inductor pattern 16 have line symmetry with a line along the third direction D3 as an axis. The inductor pattern 72 and the inductor pattern 73A are arranged side by side in the first direction D1 in plan view. The inductor pattern 15 and the inductor pattern 72 are arranged side by side in the third direction D3 in plan view. The inductor pattern 16 and the inductor pattern 73A are arranged side by side in the third direction D3 in plan view.

In the present embodiment, a distance K1 between the inductor pattern 15 and the inductor pattern 16 in the first direction D1 is longer than a distance K2 between the inductor pattern 17 and the inductor pattern 53A in the first direction D1 (distance K1>distance K2). In other words, the distance K2 is shorter than the distance K1.

A distance K3 between the inductor pattern 15 and the inductor pattern 60 in the third direction D3 is equal to the distance K1 (K3=K1). A distance K4 between the inductor pattern 16 and the inductor pattern 61A in the third direction D3 is equal to the distance K1 (K4=K1). The distance K2 is shorter than the distance K3 and the distance K4 (K2<K3, K4).

The distance K1, the distance K2, the distance K3, and the distance K4 are shorter than the radii of the inductor pattern 15 and the inductor pattern 16. In the present embodiment, the radius of the inductor pattern 15 can be defined by a length (K5/2) that is half the length K5 of the short side of a rectangular virtual line (indicated by a broken line in FIG. 20) that includes (envelops) the region of the inductor pattern 15 (a portion forming a coil in the inductor pattern 15, as a specific example of the present embodiment). Similarly, the radius of the inductor pattern 16 can be defined by a length (K6/2) that is half the length K6 of the short side of the rectangular virtual line including the region of the inductor pattern 16. For example, the inductor pattern 15 and the inductor pattern 16 may be formed such that radii thereof are equal (or substantially equal) to each other.

The distance K1, the distance K2, the distance K3, and the distance K4 are shorter than the radii of the inductor pattern 72 and the inductor pattern 73A. In the present embodiment, the radius of the inductor pattern 72 can be defined by a length (K7/2) that is half the length K7 of the short side of the rectangular virtual line including the inductor pattern 72. Similarly, the radius of the inductor pattern 73A can be defined by a length (K8/2) that is half the length K8 of the short side of the rectangular virtual line including the inductor pattern 73A.

The radius of the inductor pattern 72 is shorter than the radius of the inductor pattern 73A. In other words, the radius of the inductor pattern 73A is larger than the radius of the inductor pattern 72. The radius of the inductor pattern 15 may be equal to or larger than the radii of the inductor pattern 72 and the inductor pattern 73A. The radius of the inductor pattern 16 may be equal to or larger than the radii of the inductor pattern 72 and the inductor pattern 73A.

The inductor pattern 15 and the inductor pattern 16 are disposed to be magnetically coupled. The inductor pattern 72 and the inductor pattern 73A are disposed to be magnetically coupled. The inductor pattern 72 is disposed to be magnetically coupled to the inductor pattern 16. The inductor pattern 73A is disposed to be magnetically coupled to the inductor pattern 15.

Figure 45:
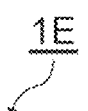
FIG. 45 is an equivalent circuit diagram of the electronic component illustrated in FIG. 39.
Figure 45:
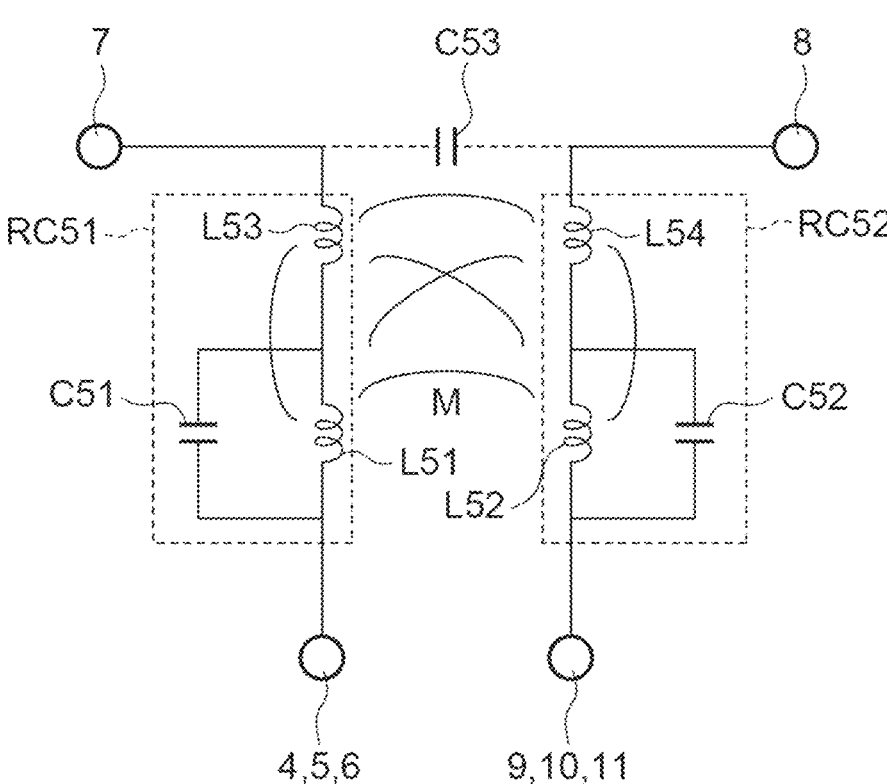

FIG. 45 is an equivalent circuit diagram of the electronic component 1A illustrated in FIG. 39. As illustrated in FIG. 45, the electronic component 1E includes a first inductor L51, a second inductor L52, a third inductor L53, a fourth inductor L54, a first capacitor C51, a second capacitor C52, and a third capacitor C53. The electronic component 1E constitutes a two-stage resonant band-pass filter circuit.

The first inductor L51 includes an inductor pattern 15 and an inductor pattern 74A. The second inductor L52 includes an inductor pattern 16 and an inductor pattern 75A. The third inductor L33 includes an inductor pattern 72. The fourth inductor L54 includes an inductor pattern 73A.

The first capacitor C51 includes a capacitor pattern 19, a capacitor pattern 22, and a capacitor pattern 74B. The second capacitor C52 includes a capacitor pattern 20, a capacitor pattern 23, and a capacitor pattern 75B. The third capacitor C53 includes a capacitor pattern 73B, a capacitor pattern 24, and a capacitor pattern 58A.

The first inductor L51, the third inductor L53, and the first capacitor C51 constitute a first LC resonator (first resonance circuit) RC51. The first inductor L51 and the third inductor L53 are electrically connected in series. The second inductor L52, the fourth inductor L54, and the second capacitor C52 constitute a second LC resonator (second resonance circuit) RC52. The second inductor L52 and the fourth inductor L54 are electrically connected in series. The first inductor L51, the second inductor L52, and the fourth inductor L54 are magnetically coupled. The second inductor L52, the first inductor L51, and the third inductor L53 are magnetically coupled.

Figure 46:
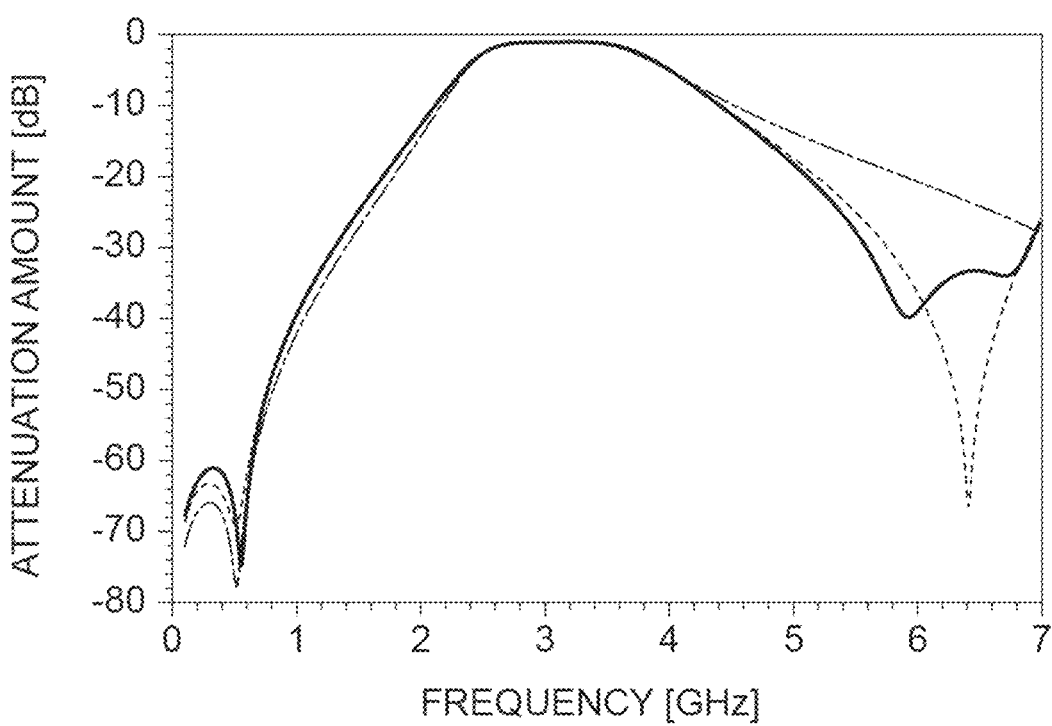
FIG. 46 is a diagram illustrating the filter characteristics of the electronic component.
Figure 47:
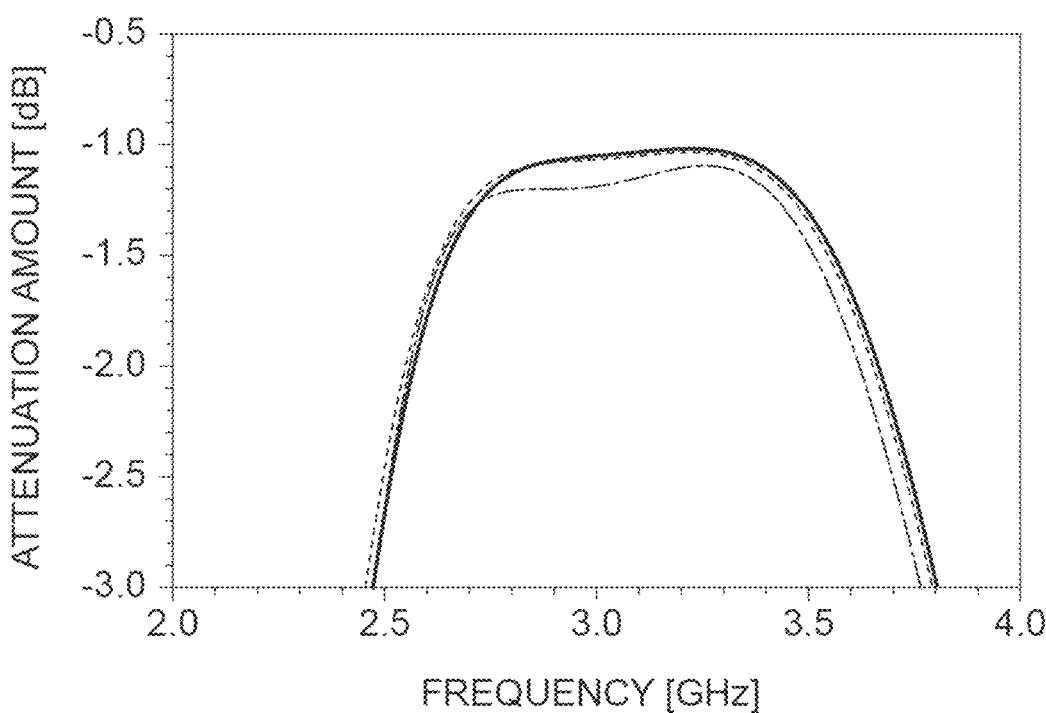
FIG. 47 is an enlarged view illustrating a part of the filter characteristics illustrated in FIG. 46.

FIG. 46 is a diagram illustrating the filter characteristics of the electronic component. FIG. 47 is an enlarged view illustrating a part of the filter characteristics illustrated in FIG. 46. FIGS. 46 and 47 illustrate filter characteristics (frequency characteristics of an attenuation amount) when a signal is input from the fourth terminal electrode 7 and a signal is output from the fifth terminal electrode 8. In other words, FIGS. 46 and 47 illustrate the frequency characteristics of the transmission coefficient from the fourth terminal electrode 7 to the fifth terminal electrode 8. In FIGS. 46 and 47, the horizontal axis represents the frequency [GHz], and the vertical axis represents the attenuation amount [dB]. In FIGS. 46 and 47, the characteristic of the electronic component 1B is indicated by a broken line, the characteristic of the electronic component 1E is indicated by a solid line, and the characteristic of the electronic component according to the comparative example is indicated by a one-dot chain line. The electronic component according to the comparative example does not include the third inductor and the fourth inductor. That is, the electronic component according to the comparative example includes only the first inductor and the second inductor. Note that the characteristic diagrams illustrated in FIGS. 46 and 47 indicate results obtained by simulation.

As illustrated in FIGS. 46 and 47, in the electronic components 1B and 1E, attenuation in a high frequency band (for example, 5 GHz or more, in the case of the characteristic illustrated in FIG. 46) is improved as compared with the electronic component according to the comparative example. As illustrated in FIG. 46, in the electronic components 1B and 1E, the attenuation amount in the high frequency band is increased as compared with the electronic component according to the comparative example. The inductor pattern 61A (see FIG. 20) of the electronic component 1B and the inductor pattern 73A (see FIG. 44) of the electronic component 1E are different from each other in the size of the region of the inductor pattern (a coil size, as a specific example of the present embodiment). The inductor pattern 73A of the electronic component 1E is larger in size (diameter) than the inductor pattern 61A of the electronic component 1B. As a result, in the electronic component 1E, characteristics different from those of the electronic component 1B are obtained. Specifically, the electronic component 1E has a characteristic of attenuating in two stages in a high frequency band.

In addition, as illustrated in FIG. 47, loss characteristics of the electronic components 1B and 1E in a specific frequency band can be improved as compared with the electronic component of the comparative example. In the case of the characteristics illustrated in FIG. 47, in a specific frequency band (for example, about 2.5 GHz to 4 Ghz), the absolute value of the attenuation amount of the electronic components 1B and 1E is reduced as compared with the absolute value of the attenuation amount of the electronic component of the comparative example. That is, the electronic components 1B and 1E can improve the insertion loss in the pass band of the filter.

As described above, in the electronic component 1E according to the present embodiment, the first LC resonator RC51 includes the third inductor L53 electrically connected in series with the first inductor L51. The second LC resonator RC52 includes the fourth inductor L54 electrically connected in series with the second inductor L52. The third inductor L53 is disposed to be magnetically coupled to the second inductor L52. The fourth inductor L54 is disposed to be magnetically coupled to the first inductor L51. As a result, in the electronic component 1E, the attenuation amount in the high frequency band can be increased. Therefore, in the electronic component 1E, frequency characteristics can be improved. For example, superior characteristics in a high frequency band can be obtained.

In the electronic component 1E according to the present embodiment, the inductor pattern 72 constituting the third inductor L53 and the inductor pattern 73A constituting the fourth inductor L54 are different from each other in the size of the region of the inductor pattern (a coil size, as a specific example of the present embodiment) (radius). As described above, in the electronic component 1E, the frequency characteristics can be adjusted by, for example, adjusting the attenuation amount in the high frequency band to a desired amount by changing the size of the region of the inductor pattern for the third inductor L53 and the fourth inductor L54.

Although the embodiments of the present disclosure have been described above, the present disclosure is not necessarily limited to the above-described embodiments, and various modifications can be made without departing from the gist thereof.

Figure 48:
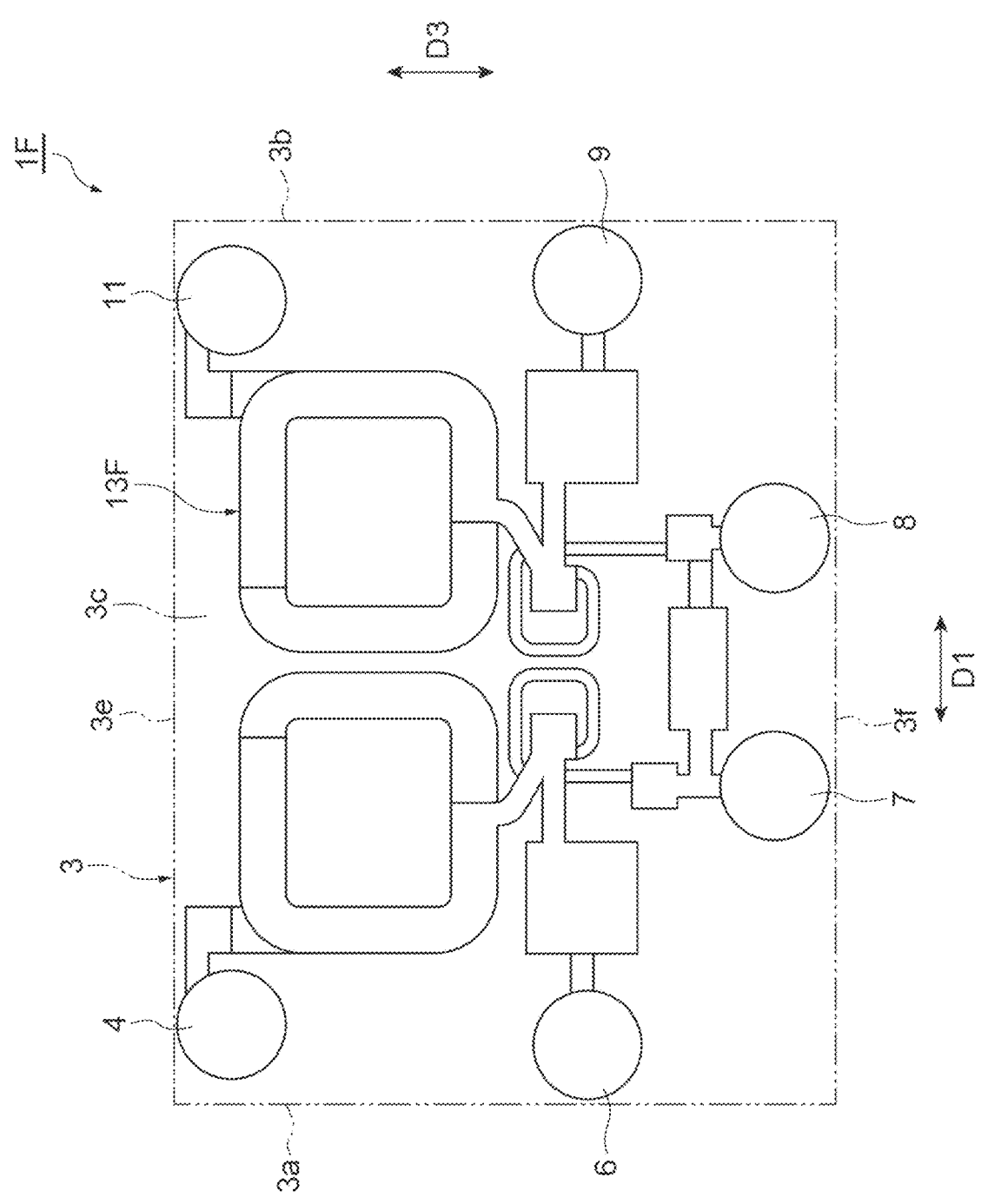
FIG. 48 is a view of an electronic component according to another embodiment as viewed from an insulator side.

In the above embodiment, a mode has been described as an example in which the first terminal electrode 4, the second terminal electrode 5, the third terminal electrode 6, the sixth terminal electrode 9, the seventh terminal electrode 10, and the eighth terminal electrode 11 are provided as ground electrodes in the electronic components 1, 1A, 1B, 1C, 1D, and 1E, and the ground electrodes are used in common. However, as in an electronic component 1F illustrated in FIG. 48, the first terminal electrode 4, the third terminal electrode 6, the sixth terminal electrode 9, and the eighth terminal electrode 11 may be provided as a ground electrode.

In the above embodiment, a mode has been described as an example in which the electronic components 1, 1A, 1B, 1C, 1D, 1E, and 1F are chip components. However, the form of the electronic component is not limited thereto. For example, the electronic component may be one element included in an assembly including a plurality of electronic components. Specifically, for example, when a plurality of electronic components are taken using a collective board (wafer) in a manufacturing process of the electronic components, the electronic component may be included in an assembly of the plurality of electronic components before being divided into individual electronic components.

Any reference to elements using designations such as "first" and "second" as used in the present disclosure does not limit the amount or order of those elements. These designations may be used in the present disclosure as a convenient way to distinguish between two or more elements. Thus, reference to first and second elements does not mean that either only two elements may be employed or that the first element must precede the second element in any way. In the present disclosure, the use of the first element is not meant to presuppose the presence of two or more elements.

REFERENCE SIGNS LIST 1, 1A, 1B, 1C, 1D, 1E, 1F ELECTRONIC COMPONENT
15, 64 INDUCTOR PATTERN (FIRST INDUCTOR PATTERN)
16, 65 INDUCTOR PATTERN (SECOND INDUCTOR PATTERN)
17, 60, 72 INDUCTOR PATTERN (THIRD INDUCTOR PATTERN)
18, 50A, 59A, 73A INDUCTOR PATTERN (FOURTH INDUCTOR PATTERN)
67Ac FIRST INDUCTOR UNIT (THIRD INDUCTOR PATTERN)
67Ad SECOND INDUCTOR UNIT (FIRST INDUCTOR PATTERN)
67B CAPACITOR PATTERN (FIRST CAPACITOR PATTERN)
68Ac FIRST INDUCTOR UNIT (FOURTH INDUCTOR PATTERN)
68Ad SECOND INDUCTOR UNIT (SECOND INDUCTOR PATTERN)
68B CAPACITOR PATTERN (SECOND CAPACITOR PATTERN)
C1, C11, C21, C31, C41, C51 FIRST CAPACITOR
C2, C12, C22, C32, C42, C52 SECOND CAPACITOR
K1, K2, K3, K4 DISTANCE
L1, L11, L21, L31, L41, L51 FIRST INDUCTOR
L2, L12, L22, L32, L42, L52 SECOND INDUCTOR
L3, L13, L23, L33, L43, L53 THIRD INDUCTOR
L4, L14, L24, L54 FOURTH INDUCTOR
RC1, RC11, RC21, RC31, RC41, RC51 FIRST LC RESONATOR (FIRST RESONANCE CIRCUIT)
RC2, RC12, RC22, RC32, RC42, RC52 SECOND LC RESONATOR (SECOND RESONANCE CIRCUIT)

The invention claimed is:

1. An electronic component comprising:
a first resonance circuit including a first inductor and a first capacitor; and
a second resonance circuit including a second inductor and a second capacitor, the second inductor being magnetically coupled to the first inductor, wherein
the first resonance circuit further includes a third inductor electrically connected in series with the first inductor, the third inductor and the second inductor are arranged to be magnetically coupled to each other, the second resonance circuit further includes a fourth inductor electrically connected in series with the second inductor, and
the fourth inductor and the first inductor are arranged to be magnetically coupled to each other.

2. The electronic component according to claim 1, wherein
the first inductor includes a first inductor pattern and the second inductor includes a second inductor pattern, the first inductor pattern and the second inductor pattern being arranged side by side, and
a distance between the first inductor pattern and the second inductor pattern is shorter than a radius of each of the first inductor pattern and the second inductor pattern.

3. The electronic component according to claim 1, wherein
the first inductor includes a first inductor pattern and the second inductor includes a second inductor pattern, the first inductor pattern and the second inductor pattern being arranged side by side,
the third inductor includes a third inductor pattern and the fourth inductor includes a fourth inductor pattern, the third inductor pattern and the fourth inductor pattern being arranged side by side, and
a distance between the first inductor pattern and the second inductor pattern is shorter than a distance between the first inductor pattern and the third inductor pattern and a distance between the second inductor pattern and the fourth inductor pattern.

4. The electronic component according to claim 3, wherein a distance between the third inductor pattern and the fourth inductor pattern is shorter than a radius of each of the third inductor pattern and the fourth inductor pattern.

5. The electronic component according to claim 4, wherein a distance between the first inductor pattern and the second inductor pattern is equal to a distance between the first inductor pattern and the third inductor pattern.

6. The electronic component according to claim 1, wherein
the first inductor includes a first inductor pattern and the second inductor includes a second inductor pattern, the first inductor pattern and the second inductor pattern being arranged side by side, and
a distance between the first inductor pattern and the second inductor pattern is shorter than a radius of a third inductor pattern constituting the third inductor.

7. The electronic component according to claim 6, wherein
the second resonance circuit further includes a fourth inductor electrically connected in series with the second inductor, the fourth inductor including a fourth inductor pattern,
the fourth inductor is arranged to be magnetically coupled to the first inductor and the third inductor,
the third inductor pattern and the fourth inductor pattern constituting the four inductors are arranged side by side, and
a distance between the first inductor pattern and the second inductor pattern is substantially equal to a distance between the third inductor pattern and the fourth inductor pattern.

8. The electronic component according to claim 6, wherein a distance between the first inductor pattern and the second inductor pattern is equal to a distance between the first inductor pattern and the third inductor pattern.

9. The electronic component according to claim 1, wherein the third inductor includes a third inductor pattern, the fourth inductor includes a fourth inductor pattern, and a radius of the a third inductor pattern is different from a radius of the fourth inductor pattern.

10. The electronic component according to claim 1, wherein the first inductor includes a first inductor pattern, the third inductor includes a third inductor pattern, and the first inductor pattern and the third inductor pattern are connected to each other by being integrally formed.

11. The electronic component according to claim 10, wherein the first capacitor includes a first capacitor pattern, the capacitor pattern being electrically connected to a portion where the first inductor pattern and the third inductor pattern are connected.

12. The electronic component according to claim 11, wherein the second resonance circuit includes a fourth inductor electrically connected in series with the second inductor, and the fourth inductor is arranged to be magnetically coupled to the first inductor and the third inductor.

13. The electronic component according to claim 12, wherein the second inductor includes a second inductor pattern, the fourth inductor includes a fourth inductor pattern, and the second inductor pattern and the fourth inductor pattern are connected to each other by being integrally formed.

14. The electronic component according to claim 13, wherein the second capacitor includes a second capacitor pattern, the second capacitor pattern being electrically connected to a portion where the second inductor pattern and the fourth inductor pattern are connected.

\* \* \* \* \*